(12) United States Patent
Drynan et al.

(10) Patent No.: US 6,197,682 B1
(45) Date of Patent: Mar. 6, 2001

(54) STRUCTURE OF A CONTACT HOLE IN A SEMICONDUCTOR DEVICE AND METHOD OF MANUFACTURING THE SAME

(75) Inventors: John Mark Drynan; Kuniaki Koyama, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/281,072

(22) Filed: Mar. 10, 1999

Related U.S. Application Data

(62) Division of application No. 08/760,215, filed on Dec. 4, 1996, now Pat. No. 5,929,524.

(30) Foreign Application Priority Data

Dec. 14, 1995 (JP) ..................................... 7-325468

(51) Int. Cl.[7] .............................................. H01L 21/4763
(52) U.S. Cl. ..................... 438/639; 438/702; 438/666; 438/692; 438/633
(58) Field of Search .................... 438/638, 639, 438/640, 702, 666, 633, 703, 690, 691, 692

(56) References Cited

U.S. PATENT DOCUMENTS

| 4,866,009 | 9/1989 | Matsuda . |
|---|---|---|
| 5,173,442 | 12/1992 | Carey . |
| 5,318,925 | 6/1994 | Kim . |
| 5,358,903 | 10/1994 | Kim . |
| 5,439,848 | 8/1995 | Hsu et al. . |
| 5,565,372 | * 10/1996 | Kim . |
| 5,571,751 | 11/1996 | Chung . |
| 5,614,765 | 3/1997 | Avanzino et al. . |
| 5,658,830 | 8/1997 | Jeng . |
| 5,930,668 | * 7/1999 | Gardner ............................... 438/624 |
| 6,080,658 | * 6/2000 | Huang et al. ........................ 438/629 |

* cited by examiner

*Primary Examiner*—Caridad Everhart
(74) *Attorney, Agent, or Firm*—Sughrue, Mion, Zinn, Macpeak & Seas, PLLC

(57) ABSTRACT

The present invention relates to a multilayer wiring structure for a semiconductor device which can be designed without sacrificing either a micronization or electric properties, and a manufacturing method of the same.

A first wiring layer and a third wiring layer are connected by a lower layer contact plug which fills a lower layer contact hole interposing a silicon nitride film spacer, and an upper layer contact plug which fills an upper layer contact hole interposing a silicon oxide film spacer. A second wiring layer divided into more than two portions by the upper layer contact hole near an upper end of the lower layer contact hole is connected by a ring-shaped conductive film spacer.

7 Claims, 30 Drawing Sheets

STRUCTURE OF A CONTACT HOLE IN A SEMICONDUCTOR DEVICE AND METHOD OF MANUFACTURING THE SAME

This is a divisional of Application Ser. No. 08/760,215 filed Dec. 4, 1996, now U.S. Pat. No. 5,929,524, the disclosure of which is incorporated herein by reference.

BACKGROUND OF THE INVENTION

1. Field of the Invention

The present invention relates to a semiconductor device and a manufacturing method of the same, more particularly to a structure of a contact hole which contacts with upper and lower wiring layers in a multilayer wiring structure of the semiconductor device and to a manufacturing method of the same.

2. Description of the Prior Art

How to constitute a multilayer wiring has been a critical technology at a realization of micronization of semiconductor devices. As micronization of the semiconductor devices is advanced, widths of wiring layers of layers constituting the multilayer wiring, intervals between wirings and diameters of contact holes to connect upper and lower wiring layers have been reduced, respectively.

The importance in this multilayer wiring technology is what kinds of multilayer wiring structures should be adopted, to avoid the connection of the upper wiring layer and an intermediate wiring layer and to connect directly the upper and lower wiring layers, and moreover how to manufacture such multilayer wiring structure.

Recently, such multilayer wiring structure has a tendency to adopt the structure in which a contact hole (a self-aligned contact hole) penetrating through the intermediate wiring layers is formed in these layers in a self-aligned manner and the upper and lower wiring layers are connected directly thorough this contact hole.

As an example of such technology, there has been a manufacturing method of the self-aligned contact hole disclosed in U.S. Pat. No. 531,892, published on Jun. 7, 1994. The specification of this United States Patent discloses a forming method of a node contact hole of a DRAM having a COB (Capacitor-Over-Bit-Line) structure in which a storage node electrode of a stacked type is formed on a bit line.

Referring to FIGS. 30 and 31 showing schematically sectional views of manufacturing steps of the self-aligned contact hole, the manufacturing method of the self-aligned contact hole, recited in the specification of the foregoing United States patent is as follows.

First of all, a field oxide film 402 is formed on an element isolation region formed in the surface of a semiconductor substrate 401, and a gate oxide film (not shown) is formed on an element formation region. After word lines are formed, source diffusion layers 408a and 408b and drain diffusion layers (not shown) are formed in the element formation region in the surface of the semiconductor substrate 401. A first interlayer insulating film 412 is formed on the entire surface of the resultant structure. Bit contact holes (not shown) reaching the drain diffusion layer are formed in the interlayer insulating film 412. Bit lines 418a, 418b and 418c are formed on the interlayer insulating film 412. These bit lines 418a, 418b and 418c are connected to the drain regions corresponding bit contact holes. Since the bit lines 418a, 418b and 418c are formed for the corresponding source diffusion layers 408a and 408b in a self-aligned manner, for example, the bit line 418a comes to overlap with the source diffusion layer 408a.

Subsequently, second interlayer insulating film 422 covering the bit lines 418a, 418b and 418c is formed on the entire surface of the resultant structure. A photoresist film 471 having openings located just above the source diffusion layers 408a and 408b is formed on the surface of the interlayer insulating film 422. Using the photoresist film 471 as a mask, the interlayer insulating film 422 is subjected to a selective anisotropic etching. The anisotropic etching at this time is ceased before the upper surface of the interlayer insulating film 412 is exposed, and, moreover, a thickness of the interlayer insulating film 422 which remains after the anisotropic etching is regulated such that it becomes thinner than that of the bit lines 418a and 418b. Thus, at least each one part of the overlapping portions in the bit lines 418a and 418b with the source diffusion layer 408a is exposed (FIG. 30a).

Next, using the photoresist film 471 as a mask, the bit lines 418a and 418b are subjected to a selective anisotropic etching. As a result, the portions of the bit lines 418a and 418b exposed at the selective anisotropic etching for the interlayer insulating film 422 are removed (FIG. 30b) Subsequently, using the photoresist film 471 as a mask, the interlayer insulating films 412 and 422 are subjected to a selective anisotropic etching. Hence, node contact holes 434 reaching the source diffusion layers 408a and 408b are formed (FIG. 30c).

After the photoresist film 471 is removed, an insulating film (not shown) having a predetermined thickness is formed on the entire surface of the resultant structure. This insulating film is etched-back so that insulating film spacers 436 are formed on the side surfaces of the node contact holes 434. Provisions of these insulating film spacers 436 result in the self-alignment of the node contact holes 434 with the bit lines 418a and 418b (FIG. 31a).

Next, storage node electrodes 438a and 438b connected to the corresponding source diffusion layers 408a and 408b through the node contact holes 434 are formed (FIG. 31b).

The manufacturing method of the self-alignment contact hole, recited in the foregoing U.S. Pat. No. 5,318,925, in which in the DRAM having memory cells of the COB structure the node contact holes can be formed without broadening the widths of the bit lines, is extremely effective for the DRAM which gives the highest priority to the micronization of cell size of the memory cell. In the case of the DRAM, even if the width of the bit line is locally narrower and the effective diameter of the node contact hole is reduced, severe obstacles are not brought about.

It is not desirable that the manufacturing method of the self-aligned contact hole, disclosed in the foregoing U.S. Pat. No. 5,318,925, is applied to the semiconductor device giving the highest priority to a high speed operation, which is typified by logic circuits. In such semiconductor device, an increase in a resistance, such as an increase in a contact resistance due to a reduction in the effective diameter of the contact hole, is a severe obstacle to the high speed operation of the semiconductor device. Furthermore, in such semiconductor device, a high current density, at least in a moment, in the wiring layer is high so that the local increase in the resistance of the wiring layer leads to deterioration of a migration resisting property in the portion where the resistance is locally increased. These problems are solved by broadening the interval between the wirings serving as the intermediate layers. In this case, the self-alignment contact hole is unnecessary. Hence, such technique runs to the requirement of the micronization in the semiconductor devices.

SUMMARY OF THE INVENTION

In a semiconductor device having a multilayer wiring structure which includes contact holes connecting directly upper and lower wiring layers without a connection of the upper wiring layer to a wiring layer of an intermediate layer, the object of the present invention is to provide a semiconductor device giving a highest priority to a high speed operation, which has a structure capable of suppressing an increase in a contact resistance without injuring a migration resisting property and without a sacrifice of micronization of the device, and to provide a manufacturing method of the same.

A semiconductor device of the present invention comprises a first insulating layer covering a semiconductor substrate; a first wiring selectively formed on the first insulating layer; a second insulating layer covering surfaces of the first insulating layer and the first wiring; a first opening selectively formed in the second insulating layer, the first opening penetrating through a portion of the first wiring to divide the first wiring to first and second portions; a conductive layer contacting with the surfaces of the first and second portions of the first wiring exposed by the first opening, the conductive layer being formed along the surface of the second insulating layer exposed by the first opening; a third insulating layer covering the surface of the conductive layer; and a second wiring insulated from the conductive layer by the third insulating layer, the second wiring burying the first opening and extending on the second insulating layer.

In the above constitution, the semiconductor device of the present invention further comprises a third wiring buried in the first insulating layer and a second opening exposing partially the third wiring, the second opening being located at a position corresponding to the first opening and the third wiring being connected to the second wiring through the conductive layer.

Furthermore, in the semiconductor device of the present invention a second opening is alternatively provided at a position corresponding to the first opening formed in the first insulating layer, an impurity region partially exposed by the second opening is formed on the semiconductor substrate, and the second wiring is connected to the impurity region through a conductive layer burying the second opening.

Furthermore, a manufacturing method of a semiconductor device of the present invention comprises the steps of: selectively forming a first opening in a first insulating layer covering a semiconductor substrate; burying the first opening with a first conductive layer; forming a first wiring on the first insulating layer, the first wiring extending on the first insulating layer with a connection to the first conductive layer; covering the surfaces of the first wiring and the first insulating layer with a second insulating layer; forming a second opening by removing selectively the second insulating layer and the first wiring to expose the surface of the first conductive layer; forming a third insulating layer covering the surface of the second conductive layer; and forming a second wiring on the second insulating layer, the second wiring contacting with the first conductive layer and being insulated from the second conductive layer by the third insulating layer.

The foregoing manufacturing method of the semiconductor device of the present invention further comprises a step of burying a third wiring in the first insulating layer; wherein the first opening exposes partially the third wiring and the first conductive layer contacts to a portion of the third wiring.

Furthermore, in the foregoing manufacturing method of the semiconductor device of the present invention, an impurity region is selectively formed in the semiconductor substrate, an impurity region is selectively formed on the semiconductor substrate, the impurity region being partially exposed by the first opening, and the exposed portion of the impurity region is connected to the first conductive layer.

In the first aspect of a multilayer wiring structure of the present invention, first wiring layers are formed on a semiconductor substrate or formed through a lower layer insulating film on the substrate, the first wiring layers constituting a part of a semiconductor device or being connected to this semiconductor device, and the first wiring layers having the predetermined minimum line width; the foregoing first wiring layers are covered with a first interlayer insulating film which is constituted by stacking a first silicon nitride film on a first silicon oxide film having a flat upper surface; first and second lower layer contact holes are formed in the foregoing interlayer insulating film, the first and second lower layer contact holes having first diameters not less than the foregoing predetermined minimum width and reaching the foregoing first wiring layers; the foregoing first and second lower contact holes are filled with lower contact plugs; second wiring layers formed on the foregoing first interlayer insulating film are covered with an second interlayer insulating film including at least a second silicon oxide film having a flat surface, the second wiring layers having the foregoing predetermined minimum width as a minimum value; at least one of the foregoing second wiring layers is connected to the foregoing first wiring layer through the foregoing second lower contact hole; first and second upper layer contact holes are formed in the foregoing second interlayer insulating film, the first upper contact holes separating the foregoing second wiring layers at positions just above the foregoing first lower contact holes, having a second diameter larger than the foregoing first diameter, and reaching the foregoing lower contact holes, and the foregoing second upper layer contact holes having a third diameter smaller than the second diameter and reaching either the foregoing second lower contact holes or the foregoing second wiring layers; the foregoing second wiring layers separated by the foregoing the upper layer contact holes are connected by ring-shaped conductive film spacers, the spacers being arranged on side surfaces of the foregoing upper layer contact holes, and having upper ends lower than an upper surface of the foregoing second interlayer insulating film and bottom surfaces connected to an upper surface of the foregoing interlayer insulating film; the ring-shaped conductive film spacers are covered with silicon oxide film spacers formed on side surfaces of the foregoing upper surface contact holes; the foregoing first and second upper contact holes are filled with the foregoing first and second contact plugs; at least one of the foregoing third wiring layers formed on the surface of the foregoing second interlayer insulating film are connected to the foregoing first wiring layers through the foregoing first upper layer contact holes and the foregoing first lower layer contact holes; and at least one of the foregoing third wiring layers is connected to either the foregoing first wiring layers or the foregoing second wiring layers.

In the multilayer wiring structure of the first aspect of the present invention, the second interlayer insulating film is constituted of a stacked film composed of the foregoing second silicon oxide film and a second silicon nitride film formed on the foregoing silicon oxide film; the foregoing third diameter is larger than the first diameter; and a second silicon oxide film spacer is formed on a side surface of the foregoing second upper layer contact hole. Alternatively, the second interlayer insulating film is consisted of a stacked film composed of the foregoing second silicon oxide film and a second silicon nitride film, and the foregoing third diameter is equal to the foregoing first diameter. Or, the foregoing second interlayer insulating film is formed of the foregoing second interlayer insulating film, the foregoing third diameter is equal to the foregoing first diameter, the foregoing upper layer contact hole is buried by a third silicon oxide film, an opening having the foregoing first diameter is formed in the third silicon oxide film, the foregoing silicon oxide film spacer is formed, the opening is filled with the foregoing upper layer contact plug, the opening is connected to the foregoing first lower contact hole, and the foregoing second interlayer insulating film and the upper surface of the foregoing silicon oxide film spacer are covered with the foregoing second silicon nitride film.

In the second aspect of a multilayer wiring structure of the present invention, first wiring layers which constitutes a part of a semiconductor element formed on a surface of a semiconductor substrate or is connected to this semiconductor device are formed on the surface of the semiconductor substrate or are formed on the surface of the semiconductor substrate through a lower layer insulating film, the first wiring layers having the predetermined minimum line width; the first wiring layers is covered with a first interlayer insulating layer formed by stacking a first silicon oxide film, a first BPSG film on a surface of the first silicon oxide film, a first silicon nitride film on a surface of the first BPSG film, the first BPSG film having a flat upper surface; first and second lower layer contact holes are formed in the interlayer, the first and second lower layer contact holes having a first diameter larger than the predetermined minimum width and reaching the foregoing first wiring wires; the side surfaces of the first and second lower layer contact holes are covered with silicon nitride film spacers, respectively; the foregoing first and second lower layer contact holes are filled with lower layer contact plugs through the silicon nitride film spacers, respectively; second wiring layers are covered with a second interlayer insulating film, the second interlayer insulating film being formed by stacking a second BPSG film having a flat upper surface on a second silicon oxide film, and a second silicon nitride film on a surface of the second BPSG film; at least one of the foregoing second wiring layers is connected to the foregoing first wiring layer through the foregoing second lower contact hole; first and second upper lower contact holes are formed in the foregoing second interlayer insulating film, the first upper layer contact holes separating the foregoing second wiring layers at the positions just above the foregoing first lower layer contact holes, having a second diameter larger than the first diameter, and reaching the first lower layer contact holes, and the second upper layer contact holes having a third diameter smaller than a second diameter and larger than the foregoing first diameter, and reaching either the second lower contact holes or the foregoing second wiring layers; the foregoing second wiring layers separated by the first upper layer contact holes are connected by ring-shaped conductive film spacers arranged on side surfaces of the foregoing first upper layer contact holes, the ring-shaped conductive film spacers having upper ends lower than the upper surface of the second interlayer insulating film and bottom surfaces connected to the upper surface of the foregoing first interlayer insulating film; the ring-shaped conductive film spacers are covered with first silicon oxide film spacers formed on the side surface of first upper layer contact holes; the side surfaces of the second upper layer contact holes are covered directly with second silicon oxide spacers; the foregoing first and second upper layer contact holes are buried by first and second upper layer contact plugs through the ring-shaped conductive film spacer, the first silicon oxide film spacer, and the second silicon oxide film spacer; at least one of third wiring layers formed on the surface of the second interlayer insulating film is connected to the foregoing first wiring layer through the first lower layer contact hole; and one of the third wiring layers is connected to either first wiring layer or the second wiring layer.

The widths of the first and second silicon oxide film spacers should be larger than that of the silicon nitride film spacer.

In the third aspect of a multilayer wiring structure of the present invention, first wiring layers which constitutes a part of a semiconductor element formed on a surface of a semiconductor substrate or is connected to this semiconductor device are formed on the surface of the semiconductor substrate or are formed on the surface of the semiconductor substrate through a lower layer insulating film, the first wiring layers having the predetermined minimum line width; the first wiring layers is covered with a first interlayer insulating layer formed by stacking a first silicon oxide film, a first BPSG film on a surface of the first silicon oxide film, a first silicon nitride film on a surface of the first BPSG film, the first BPSG film having a flat upper surface; first and second lower layer contact holes are formed in the interlayer, the first and second lower layer contact holes having a first diameter larger than the predetermined minimum width and reaching the foregoing first wiring wires; the side surfaces of the first and second lower layer contact holes are covered with silicon nitride film spacers, respectively; the foregoing first and second lower layer contact holes are filled with lower layer contact plugs through the silicon nitride film spacers, respectively; second wiring layers are covered with a second interlayer insulating film, the second interlayer insulating film being formed by stacking a second BPSG film having a flat upper surface on a second silicon oxide film, and a second silicon nitride film on a surface of the second BPSG film; at least one of the foregoing second wiring layers is connected to the foregoing first wiring layer through the foregoing second lower contact hole; first and second upper lower contact holes are formed in the foregoing second interlayer insulating film, the first upper layer contact holes separating the foregoing second wiring layers at the positions just above the foregoing first lower layer contact holes, having a second diameter larger than the first diameter, and reaching the first lower layer contact holes, and the second upper layer contact holes having the first diameter, and reaching either the second lower contact holes or the foregoing second wiring layers; the foregoing second wiring layers separated by the first upper layer contact holes are connected by ring-shaped conductive film spacers arranged on side surfaces of the foregoing first upper layer contact holes, the ring-shaped conductive film spacers having upper ends lower than the upper surface of the second interlayer insulating film and bottom surfaces connected to the upper surface of the foregoing first interlayer insulating film; an opening having the first diameter and reaching the first lower layer contact hole is formed in a third silicon oxide film having a flat plane which is the same level as the upper surface of the second interlayer insulating film, the third wiring layer burying the first upper layer contact hole including the ring-shaped conductive film spacer; the opening and the second upper layer contact holes, the side surfaces of which are covered with the second silicon nitride film spacers, are buried by first and second upper layer contact plugs; at least one of third wiring layers formed on the surface of the second interlayer insulating film is connected to the foregoing first wiring layer through the first upper layer contact hole and the first lower layer contact hole; and one of the third wiring layers is connected to either first wiring layer or the second wiring layer through the second upper layer contact hole.

The width of the second silicon nitride film spacer is equal to that of the first silicon nitride film spacer.

In the fourth aspect of a multilayer wiring structure of the present invention, first wiring layers, which constitutes a part of a semiconductor element formed on a surface of a semiconductor substrate or is connected to this semiconductor device, are formed either on the surface of the semiconductor substrate or on the surface of the semiconductor substrate through a lower layer insulating film, the first wiring layers having the predetermined minimum line width; the first wiring layers is covered with a first interlayer insulating layer formed by stacking a first silicon oxide film, a first BPSG film on the first silicon oxide film, and a first silicon nitride film on the first BPSG film, the first BPSG film having a flat upper surface; first and second lower layer contact holes are formed in the interlayer, the first and second lower layer contact holes having a first diameter larger than the predetermined minimum width and reaching the foregoing first wiring wires; the side surfaces of the first and second lower layer contact holes are covered with silicon nitride film spacers, respectively; the foregoing first and second lower layer contact holes are filled with lower layer contact plugs through the silicon nitride film spacers, respectively; second wiring layers are covered with a second interlayer insulating film, the second wiring layers being formed on the surface of the first interlayer insulating film and having the foregoing predetermined minimum width as a minimum line width, and the second interlayer insulating film being formed by stacking a second BPSG film having a flat upper surface on a second silicon oxide film; at least one of the foregoing second wiring layers is connected to the foregoing first wiring layer through the foregoing second lower contact hole; first lower contact holes are formed in the foregoing second interlayer insulating film, the first upper layer contact holes separating the foregoing second wiring layers at the positions just above the foregoing first lower layer contact holes, having a second diameter larger than the first diameter, and reaching the first lower layer contact holes; the foregoing second wiring layers separated by the first upper layer contact holes are connected by ring-shaped conductive film spacers arranged on side surfaces of the foregoing first upper layer contact holes, the ring-shaped conductive film spacers having upper ends lower than the upper surface of the second interlayer insulating film and bottom surfaces connected to the upper surface of the foregoing first interlayer insulating film; a second silicon nitride film is formed on the surfaces of the second interlayer insulating film and the third silicon oxide film; an opening having the first diameter and reaching the first lower layer contact hole through the second silicon nitride film and the second interlayer insulating film is formed; a second upper layer contact hole of the first diameter, which reaches either the second lower layer contact hole or the second wiring layers through the second silicon nitride film and the second interlayer insulating film, is formed; the foregoing opening and the second upper layer contact holes are buried with the first and second upper layer contact plugs, the side surfaces of the opening and the second upper layer contact hole being covered with the second silicon nitride film spacers; at least one of the third wiring layers formed on the surface of the second interlayer insulating film is connected to the first wiring layer through the first upper layer contact hole and the first lower layer contact hole; and at least one of the third wiring layers is connected to either the first wiring layer or the second wiring layer.

The width of the silicon nitride film spacer should be preferably equal to that of the silicon nitride film spacer.

A first aspect of a manufacturing method of the present invention comprises the steps of;

forming a first wiring layer on a surface of a semiconductor substrate or thereon interposing a foundation insulating film, the first wiring layer constituting a portion of a semiconductor element formed on the surface of the semiconductor substrate or being connected to the semiconductor element, and the first wiring layer having the predetermined minimum width;

forming a first silicon oxide film which covers the first wiring layer, flattening the upper surface of the first silicon oxide film, forming a first silicon nitride film covering the upper surface of the first silicon oxide film thereby forming a first interlayer insulating film composed of the first silicon oxide and silicon nitride films, and forming a second silicon oxide film having a predetermined film thickness which covers the upper surface of the first interlayer insulating film;

forming first and second lower layer contact holes penetrating the second silicon oxide film and the first interlayer insulating film to reach the first wiring layer, which has a first diameter at least not smaller than the predetermined minimum width;

forming a second silicon nitride film on the entire surface of the resultant structure by a low pressure vapor phase growth method (LPCVD), and forming silicon nitride film spacers on the side surfaces of the first and second lower layer contact holes by etching-back the second silicon nitride film;

forming a first conductive film to fill the first and second lower layer contact holes on the entire surface of the resultant structure, and polishing the first conductive film, the silicon nitride film spacers, and the first silicon oxide film until the upper surface of the first interlayer insulating film is exposed by a chemical machinery polishing method (CMP) thereby making the upper surfaces of the silicon nitride film spacers flat and the level of the upper surface of these spacers equal to that of the first interlayer insulating film and thereby forming lower contact plugs formed of the first conductive film which bury the first and second lower layer contact holes interposing the silicon nitride film spacers;

forming second wiring layers, which have the predetermined minimum width as the minimum value of the line width, on the surface of the first interlayer insulating film, at least one of the second wiring layers being connected to the first wiring layer interposing the second lower contact hole and at least one of the second wiring layers being connected to the first wiring layer interposing the first lower layer contact hole;

forming a third silicon oxide film covering the second wiring layers, flattening the upper surface of the third silicon oxide film, and forming a second interlayer insulating film composed of films including at least the third silicon oxide film;

forming a first upper layer contact hole in the second interlayer insulating film, the first upper layer contact hole separating the second wiring layer at the position just above the first lower layer contact hole, having a second diameter larger than the first diameter, and reaching the first lower layer contact hole;

forming a second conductive layer having a predetermined film thickness on the entire surface of the resultant structure, and forming a ring-shaped conductive film spacer by etching-back the second conductive film on the side surface of the first upper layer contact hole, the ring-shaped conductive film spacer having an upper end lower than the upper surface of the second interlayer insulating film and a bottom surface connected to the upper surface of the first interlayer insulating film, and the ring-shaped conductive film spacer connecting the second wiring layers separated by the first upper layer contact hole;

forming a second upper layer contact hole having a third diameter smaller than the second diameter by etching the second interlayer insulating film using a photoresist film as a mask covering the first upper layer contact hole, the second contact hole reaching either the second lower layer contact hole or the second wiring layer;

forming a second silicon oxide film by the LPCVD method on the entire surface of the resultant structure, and etching-back the second silicon oxide film until the upper surface of the second interlayer insulating film is exposed, thereby forming a silicon oxide film spacer at least on the side surface of the first upper layer contact hole;

forming a third conductive film on the entire surface of the resultant structure, polishing the third conductive film by the chemical machinery polishing (CMP) method until the upper surface of the second interlayer insulating film is exposed, thereby forming first and second upper layer contact plugs which bury the first and second upper layer contact holes; and forming at least one third wiring layer connected to the first wiring layer interposing the first upper layer contact hole and the first lower layer contact hole on the surface of the second interlayer insulating film, and at least one third wiring layer connected to either the second lower contact hole or the second wiring layer interposing the second upper layer contact hole on the surface of the second interlayer insulating film.

A second aspect of a manufacturing method of the present invention comprises the steps of;

forming a first wiring layer on a surface of a semiconductor substrate or thereon interposing a foundation insulating film, the first wiring layer constituting a portion of a semiconductor element formed on the surface of the semiconductor substrate or being connected to the semiconductor element, and the wiring layer having a predetermined minimum width as a minimum value of a line width;

forming a first silicon oxide film which covers the first wiring layer, forming a first BPSG film which covers the first silicon oxide film, flattening the upper surface of the first BPSG film, forming a first silicon nitride film which covers the upper surface of the first BPSG film, thereby forming a first interlayer insulating film composed of the first silicon oxide, the first BPSG film, and the first silicon nitride films, and forming a second silicon oxide film having a predetermined film thickness which covers the upper surface of the first interlayer insulating film;

forming first and second lower layer contact holes penetrating the second silicon oxide film and the first interlayer insulating film to reach the first wiring layer, which has a first diameter than the predetermined minimum width;

forming a second silicon nitride film on the entire surface of the resultant structure by a low pressure vapor phase growth method (LPCVD), and forming silicon nitride film spacers on the side surfaces of the first and second lower layer contact holes by etching-back the second silicon nitride film;

forming a first conductive film to fill the first and second lower layer contact holes on the entire surface of the resultant structure, and polishing the first conductive film, the silicon nitride film spacers, and the first silicon oxide film until the upper surface of the first interlayer insulating film is exposed by a chemical machinery polishing method (CMP) thereby making the upper surfaces of the silicon nitride film spacers flat and the level of the upper surface of these spacers equal to that of the first interlayer insulating film and thereby forming lower contact plugs formed of the first conductive film which bury the first and second lower layer contact holes interposing the silicon nitride film spacers;

forming second wiring layers, which have the predetermined minimum width as the minimum value of the line width, on the surface of the first interlayer insulating film, at least one of the second wiring layers being connected to the first wiring layer interposing the second lower contact hole and at least one of the second wiring layers being connected to the first wiring layer interposing the first lower layer contact hole;

forming a third silicon oxide film covering the second wiring layers, forming a second BPSG film, flattening the upper surface of the second BPSG film, and forming a third silicon nitride film covering the upper surface of the second BPSG film, thereby forming a second interlayer insulating film composed of the third silicon oxide film, the second BPSG film, and the third silicon nitride film;

forming a first upper layer contact hole in the second interlayer insulating film, the first upper layer contact hole separating the second wiring layer at the position just above the first lower layer contact hole, having a second diameter larger than the first diameter, and reaching the first lower layer contact hole;

forming a second conductive layer having a predetermined film thickness on the entire surface of the resultant structure, and forming a ring-shaped conductive film spacer by etching-back the second conductive film on the side surface of the first upper layer contact hole, the ring-shaped conductive film spacer having an upper end lower than the upper surface of the second interlayer insulating film and a bottom surface connected to the upper surface of the first interlayer insulating film, and the ring-shaped conductive film spacer connecting the second wiring layers separated by the first upper layer contact hole;

forming a second upper layer contact hole having a third diameter smaller than the second diameter by etching the second interlayer insulating film using a photoresist film as a mask covering the first upper layer contact hole, the second contact hole reaching either the second lower layer contact hole or the second wiring layer;

forming a fourth silicon oxide film by the LPCVD method on the entire surface of the resultant structure, and etching-back the fourth silicon oxide film until the upper surface of the second interlayer insulating film is exposed, thereby forming first and second silicon oxide film spacers on the side surface of the first and second upper layer contact holes;

forming a third conductive film on the entire surface of the resultant structure, polishing the third conductive film by the chemical machinery polishing (CMP) method until the upper surface of the second interlayer insulating film is exposed, thereby forming first and second upper layer contact plugs which bury the first and second upper layer contact holes interposing the first and second silicon oxide film spacers; and forming at least one third wiring layer connected to the first wiring layer interposing the first upper layer contact hole and the first lower layer contact hole on the surface of the second interlayer insulating film, and at least one third wiring layer connected to either the second lower contact hole or the second wiring layer interposing the second upper layer contact hole on the surface of the second interlayer insulating film.

A third aspect of a manufacturing method of the present invention comprises the steps of;

forming a first wiring layer on a surface of a semiconductor substrate or thereon interposing a foundation insulating film, the first wiring layer constituting a portion of a semiconductor element formed on the surface of the semiconductor substrate or being connected to the semiconductor element, and the first wiring layer having a predetermined minimum width as a minimum value of a line width;

forming a first silicon oxide film which covers the first wiring layer, forming a first BPSG film which covers the first silicon oxide film, flattening the upper surface of the first BPSG film, forming a first silicon nitride film which covers the upper surface of the first BPSG film, thereby forming a first interlayer insulating film composed of the first silicon oxide, the first BPSG film, and the first silicon nitride films, and forming a second silicon oxide film having a predetermined film thickness which covers the upper surface of the first interlayer insulating film;

forming first and second lower layer contact holes penetrating the second silicon oxide film and the first interlayer insulating film to reach the first wiring layer, which has a first diameter than the predetermined minimum width;

forming a second silicon nitride film on the entire surface of the resultant structure by a low pressure vapor phase growth method (LPCVD), and forming first silicon nitride film spacers on the side surfaces of the first and second lower layer contact holes by etching-back the second silicon nitride film;

forming a first conductive film to fill the first and second lower layer contact holes on the entire surface of the resultant structure, and polishing the first conductive film, the silicon nitride film spacers, and the first silicon oxide film until the upper surface of the first interlayer insulating film is exposed by a chemical machinery polishing method (CMP) thereby making the upper surfaces of the silicon nitride film spacers flat and the level of the upper surface of these spacers equal to that of the first interlayer insulating film and thereby forming lower contact plugs formed of the first conductive film which bury the first and second lower layer contact holes interposing the silicon nitride film spacers;

forming second wiring layers, which have the predetermined minimum width as the minimum value of the line width, on the surface of the first interlayer insulating film, at least one of the second wiring layers being connected to the first wiring layer interposing the second lower contact hole and at least one of the second wiring layers being connected to the first wiring layer interposing the first lower layer contact hole;

forming a third silicon oxide film covering the second wiring layers, forming a second BPSG film, flattening the upper surface of the second BPSG film, and forming a third silicon nitride film covering the upper surface of the second BPSG film, thereby forming a second interlayer insulating film composed of the third silicon oxide film, the second BPSG film, and the third silicon nitride film;

forming a first upper layer contact hole in the second interlayer insulating film, the first upper layer contact hole separating the second wiring layer at the position just above the first lower layer contact hole, having a second diameter larger than the first diameter, and reaching the first lower layer contact hole;

forming a second conductive layer having a predetermined film thickness on the entire surface of the resultant structure, and forming a ring-shaped conductive film spacer by etching-back the second conductive film on the side surface of the first upper layer contact hole, the ring-shaped conductive film spacer having an upper end lower than the upper surface of the second interlayer insulating film and a bottom surface connected to the upper surface of the first interlayer insulating film, and the ring-shaped conductive film spacer connecting the second wiring layers separated by the first upper layer contact hole;

forming a fourth silicon oxide film on the entire surface of the resultant structure, and performing the chemical machinery polishing (CMP) for the fourth silicon oxide film until a film thickness of the fourth silicon oxide film at the upper surface of the second interlayer insulating film becomes a predetermined value to bury the first upper layer contact hole by the fourth silicon oxide layer;

forming an opening in the fourth silicon oxide film by etching the fourth silicon oxide film using a photoresist film as a mask, the opening having the first diameter and reaching the first lower layer contact hole in the fourth silicon oxide film, and forming a second upper layer contact hole having a first diameter, which penetrates the fourth silicon oxide film and the second interlayer insulating film to reach either the second lower layer contact hole or the second wiring layer;

forming a fourth silicon nitride film by the LPCVD method on the entire surface of the resultant structure, and etching-back the fourth silicon nitride film, thereby forming second silicon nitride film spacers on the side surface of the opening and the second upper layer contact holes;

forming a third conductive film on the entire surface of the resultant structure, and polishing the third conductive film, the second silicon nitride film spacers, and the fourth silicon oxide film by the chemical machinery polishing (CMP) method until the upper surface of the second interlayer insulating film is exposed, thereby forming a silicon oxide film spacer formed of the fourth silicon oxide film which has an upper surface of the same level as that of the second interlayer insulating film, a second silicon nitride film spacer having an upper surface of the same level as that of the second interlayer insulating film, and a first upper layer contact plug which fills the opening interposing the second silicon nitride film spacer, in the first upper layer contact hole, and thereby forming a second silicon nitride film spacer having an upper surface of the same level as that of the second interlayer insulating film, and a second upper layer contact plug which fills the second upper layer contact hole interposing the second upper layer contact hole; and forming at least one third wiring layer connected to the first wiring layer interposing the first upper layer contact hole and the first lower layer contact hole on the surface of the second interlayer insulating film, and at least one third wiring layer connected to either the second lower contact hole or the second wiring layer interposing the second upper layer contact hole on the surface of the second interlayer insulating film.

A fourth aspect of a manufacturing method of the present invention comprises the steps of;

forming a first wiring layer on a surface of a semiconductor substrate or thereon interposing a foundation insulating film, the first wiring layer constituting a portion of a semiconductor element formed on the surface of the semiconductor substrate or being connected to the semiconductor element, and the first wiring layer having a predetermined minimum width as a minimum value of a line width;

forming a first silicon oxide film which covers the first wiring layer, forming a first BPSG film which covers the first silicon oxide film, flattening the upper surface of the first BPSG film, forming a first silicon nitride film which covers the upper surface of the first BPSG film, thereby forming a first interlayer insulating film composed of the first silicon oxide, the first BPSG film, and the first silicon nitride films, and forming a second silicon oxide film having a predetermined film thickness which covers the upper surface of the first interlayer insulating film;

forming first and second lower layer contact holes penetrating the second silicon oxide film and the first interlayer insulating film to reach the first wiring layer, which has a first diameter than the predetermined minimum width;

forming a second silicon nitride film on the entire surface of the resultant structure by a low pressure vapor phase growth method (LPCVD), and forming first silicon nitride film spacers on the side surfaces of the first and second lower layer contact holes by etching-back the second silicon nitride film;

forming a first conductive film to fill the first and second lower layer contact holes on the entire surface of the resultant structure, and polishing the first conductive film, the first silicon nitride film spacers, and the first silicon oxide film until the upper surface of the first interlayer insulating film is exposed by a chemical machinery polishing method (CMP) thereby making the upper surfaces of the first silicon nitride film spacers flat and the level of the upper surface of these spacers equal to that of the first interlayer insulating film and thereby forming lower contact plugs formed of the first conductive film which bury the first and second lower layer contact holes interposing the first silicon nitride film spacers;

forming second wiring layers, which have the predetermined minimum width as the minimum value of the line width, on the surface of the first interlayer insulating film, at least one of the second wiring layers being connected to the first wiring layer interposing the second lower contact hole and at least one of the second wiring layers being connected to the first wiring layer interposing the first lower layer contact hole;

forming a third silicon oxide film covering the second wiring layers, forming a second BPSG film, and flattening the upper surface of the second BPSG film, thereby forming a second interlayer insulating film composed of the third silicon oxide film;

forming a first upper layer contact hole in the second interlayer insulating film, the first upper layer contact hole separating the second wiring layer at the position just above the first lower layer contact hole, having a second diameter larger than the first diameter, and reaching the first lower layer contact hole;

forming a second conductive layer having a predetermined film thickness on the entire surface of the resultant structure, and forming a ring-shaped conductive film spacer by etching-back the second conductive film on the side surface of the first upper layer contact hole, the ring-shaped conductive film spacer having an upper end lower than the upper surface of the second interlayer insulating film and a bottom surface connected to the upper surface of the first interlayer insulating film, and the ring-shaped conductive film spacer connecting the second wiring layers separated by the first upper layer contact hole;

forming a fourth silicon oxide film on the entire surface of the resultant structure, and performing the chemical machinery polishing (CMP) for the fourth silicon oxide film until an upper surface of the fourth silicon oxide film is flattened to bury the first upper layer contact hole by the fourth silicon oxide layer;

forming a third silicon nitride film, and forming a fifth silicon oxide film having a second predetermined film thickness on the entire surface of the resultant structure;

forming an opening in the fourth silicon oxide film, which bury the fifth silicon oxide film, the third silicon nitride film, and the first upper layer contact hole, by etching the fourth silicon oxide film using a photoresist film as a mask, the opening having the first diameter and reaching the first lower layer contact hole, forming a silicon oxide film spacer formed of the fourth silicon oxide film, and forming a second upper layer contact hole having the first diameter, which penetrates the fifth silicon oxide film, the third silicon nitride film, and the second interlayer insulating film to reach either the second lower layer contact hole or the second wiring layer;

forming a fourth silicon nitride film by the LPCVD method on the entire surface of the resultant structure, and etching-back the fourth silicon nitride film, thereby forming second silicon nitride film spacers on the side surface of the opening and the second upper layer contact holes;

forming a third conductive film on the entire surface of the resultant structure, and polishing the third conductive film, the second silicon nitride film spacers, and the fifth silicon oxide film by the chemical machinery polishing (CMP) method until at least the upper surface of the third silicon nitride film is exposed, thereby forming a second silicon nitride film spacer having an upper surface of the same level as that of the third silicon nitride film in the first upper layer contact hole, the second silicon nitride film spacer covering the side surface of the silicon oxide film spacer and forming a first upper layer contact plug which fills the opening interposing the second silicon nitride film spacer, and thereby forming a second silicon nitride film spacer having an upper surface of the same level as that of the third silicon nitride film in the second upper layer contact hole and forming a second upper layer contact plug which fills the second upper layer contact hole interposing the second silicon nitride film spacer; and forming at least one third wiring layer connected to the first wiring layer interposing the first upper layer contact hole and the first lower layer contact hole on the surface of the second interlayer insulating film, and at least one third wiring layer connected to either the second lower contact hole or the second wiring layer interposing the second upper layer contact hole on the surface of the second interlayer insulating film.

BRIEF DESCRIPTION OF THE DRAWINGS

For a more complete understanding of the present invention and the advantages thereof, reference is now made to the following description taken in conjunction with the accompanying drawings, in which;

FIGS. 2a, 2b and 2c are the schematic section views taken along the lines A—A, B—B and C—C of FIG. 1, respectively;

FIGS. 4a, 4b, 4c and 4d are the schematic section views taken along the line A—A of FIG. 1;

FIGS. 5a, 5b and 5c are the schematic section views taken along the line A—A of FIG. 1;

FIGS. 6a and 6b are the schematic views taken along the line A—A of FIG. 1;

FIGS. 7a to 7d are the schematic section views taken along the line B—B of FIG. 1;

FIGS. 8a, 8b and 8c are the schematic section views taken along the line B—B of FIG. 1;

FIGS. 9a and 9b are the schematic section views taken along the line B—B of FIG. 1;

FIGS. 10a to 10d are the schematic section views taken along the line C—C of FIG. 1;

FIGS. 11a, 11b and 11c are the schematic section views taken along the line C—C of FIG. 1;

FIGS. 12a and 12b are the schematic section views taken along the line C—C of FIG. 1;

FIGS. 17a, 17b and 17c are the schematic section views taken along the lines A—A, B—B and C—C of FIG. 16, respectively;

FIGS. 19a, 19b and 19c are the schematic section views taken along the line A—A of FIG. 16;

FIGS. 20a, 20b and 20c are the schematic section views taken along the line A—A of FIG. 16;

FIGS. 21a, 21b and 21c are the schematic section views taken along the line B—B of FIG. 16;

FIGS. 22a, 22b and 22c are the schematic section views taken along the line B—B of FIG. 16;

FIGS. 23a, 23b and 23c are the schematic section views taken along the line C—C of FIG. 16;

FIGS. 24a, 24b and 24c are the schematic section views taken along the line C—C of FIG. 16;

Figure 25:
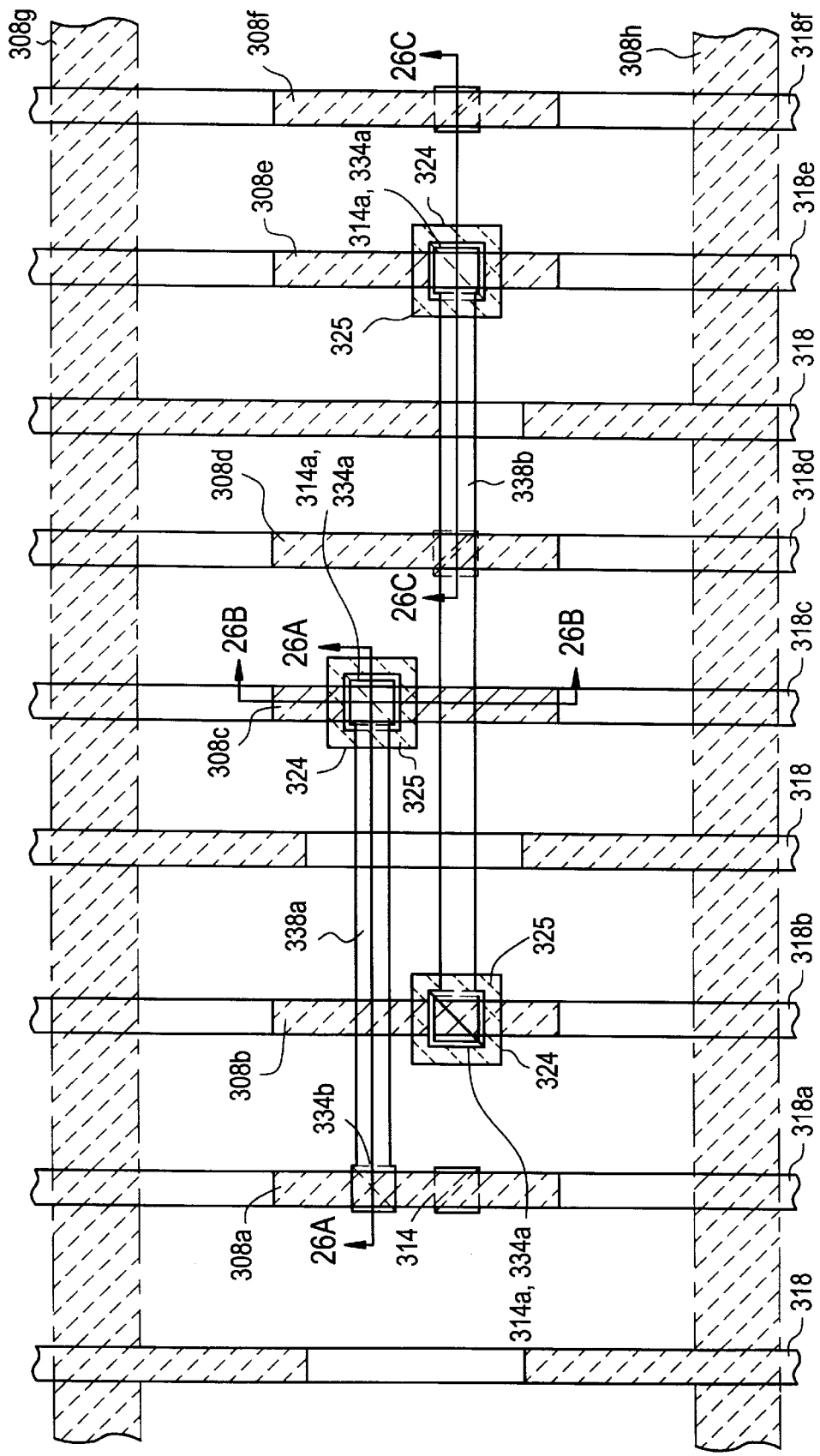
FIG. 25 is a schematic plan view of an application example of a third embodiment of the present invention.
Figure 26A:
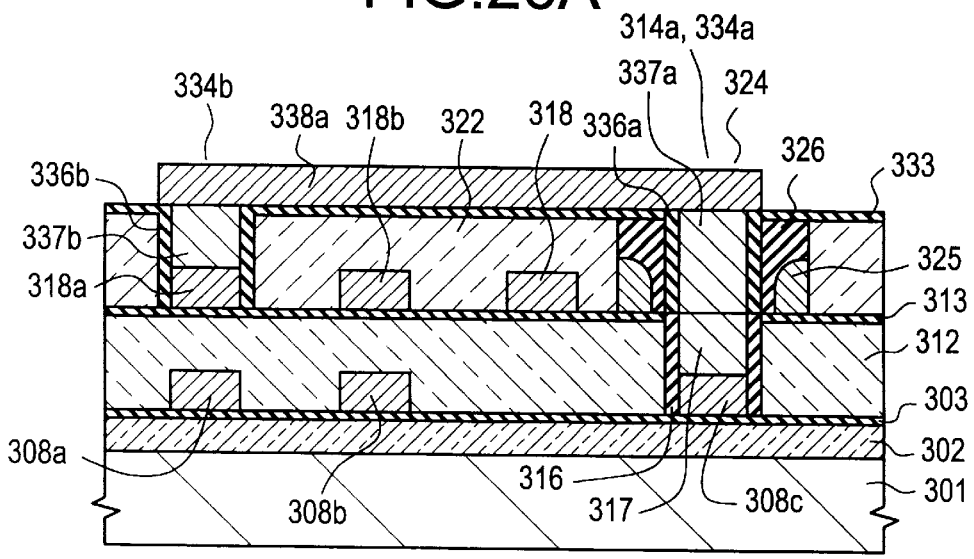
FIGS. 26a, 26b and 26c are schematic section views of an application example of the third embodiment, namely, FIGS.
Figure 26B:
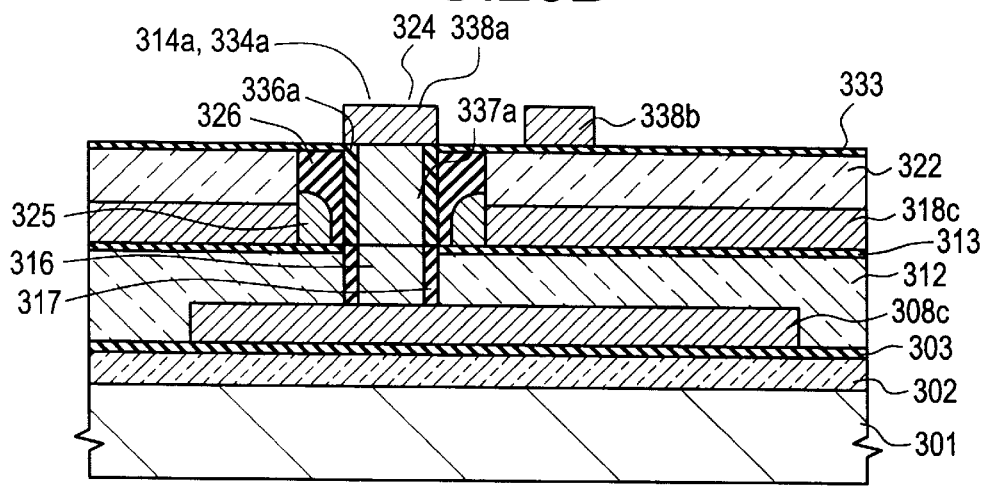
Figure 26C:
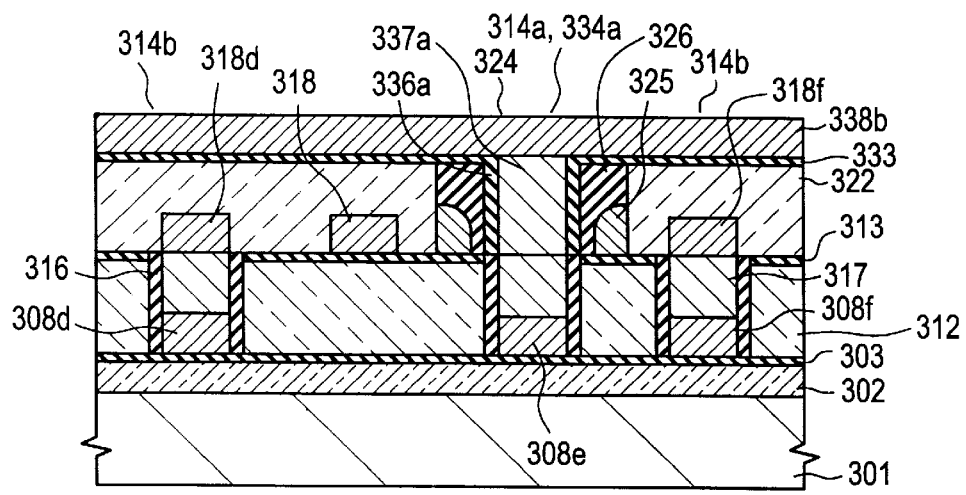
Figure 27A:
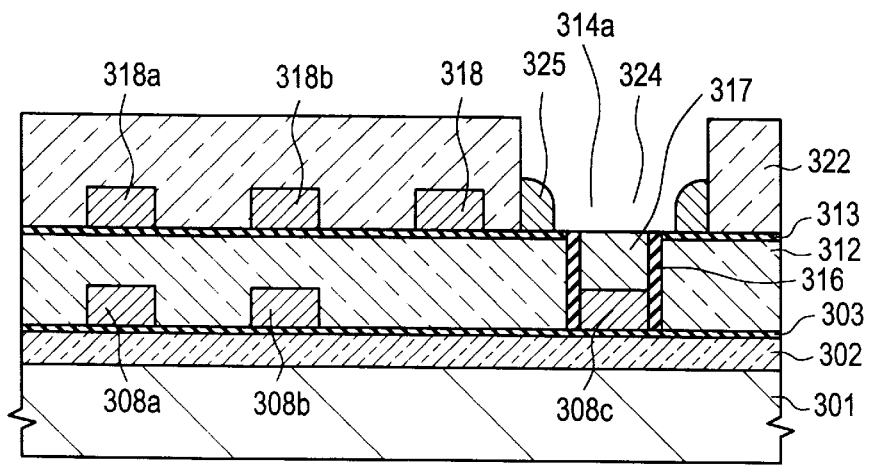
Figure 27B:
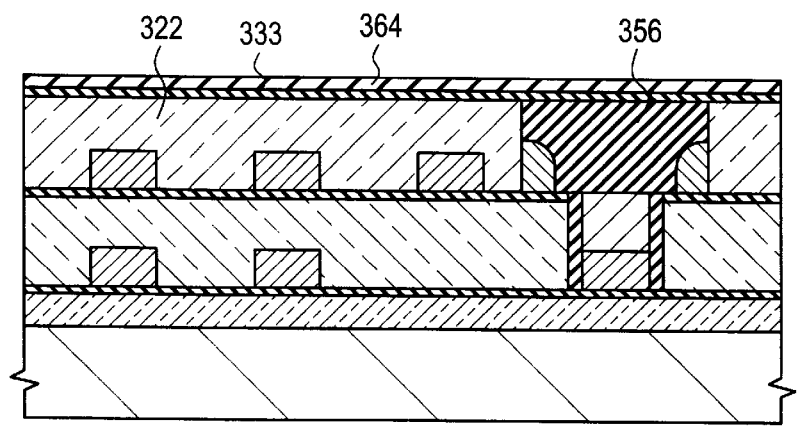
Figure 27C:
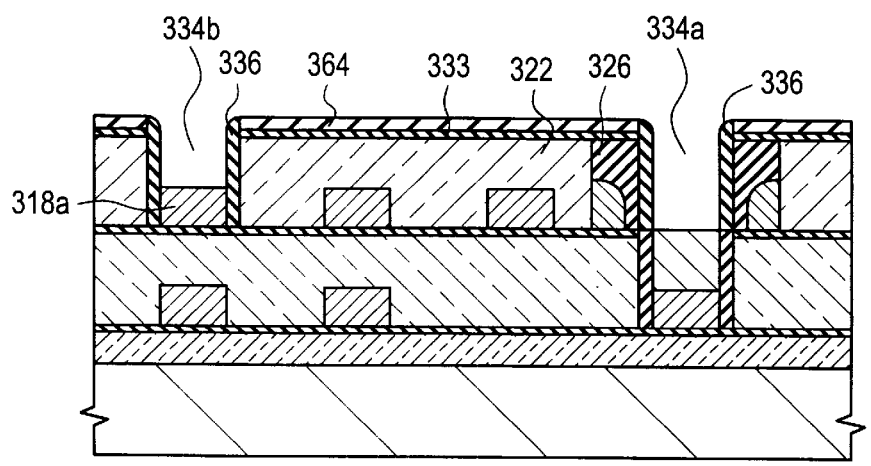
Figure 28A:
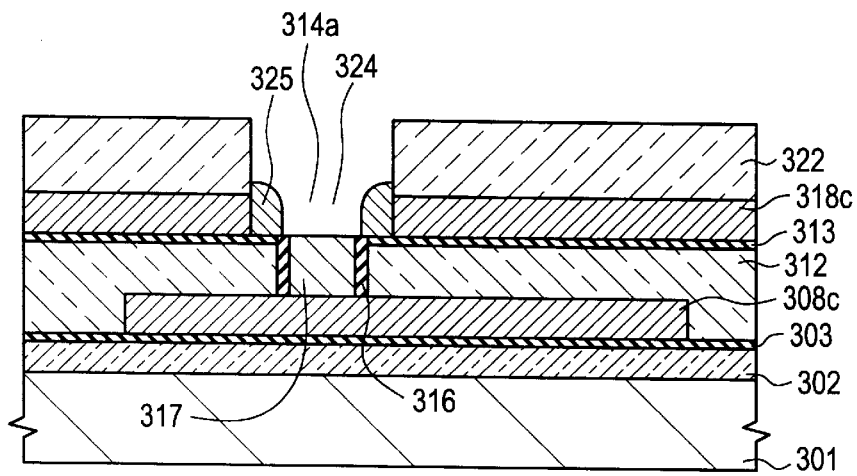
Figure 28B:
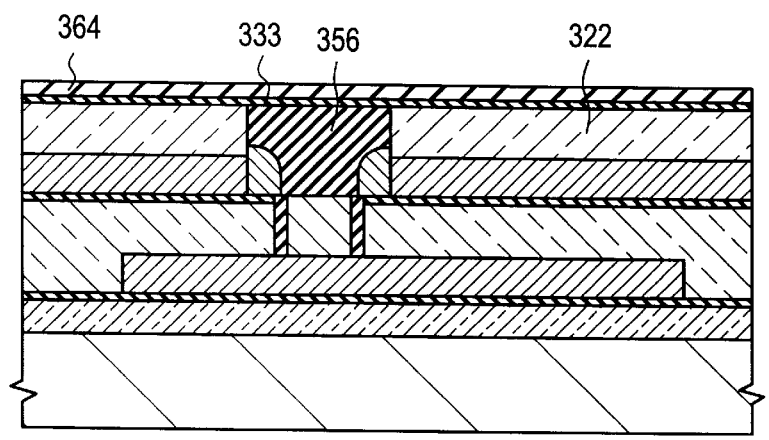
Figure 28C:
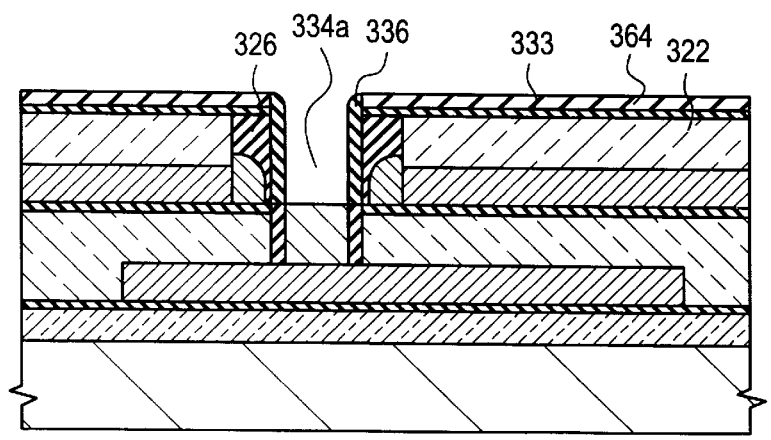
Figure 29A:
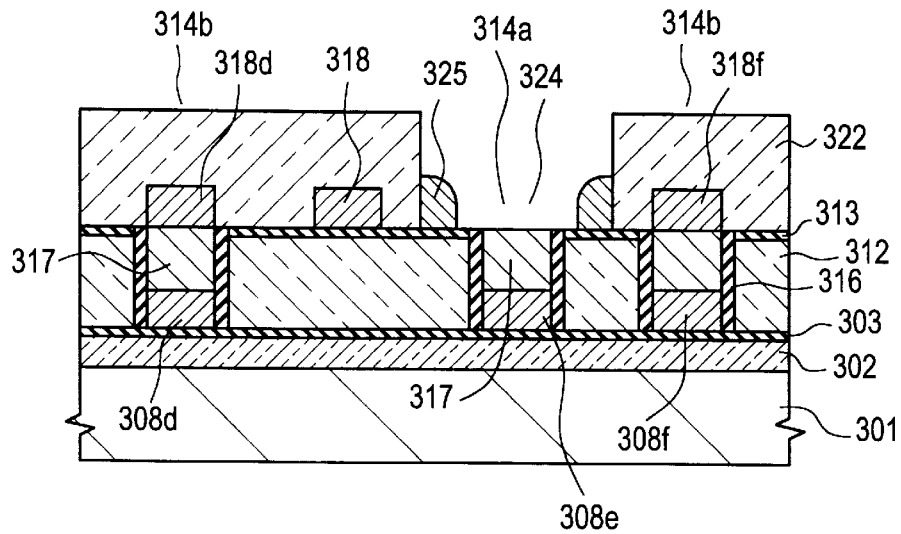
Figure 29B:
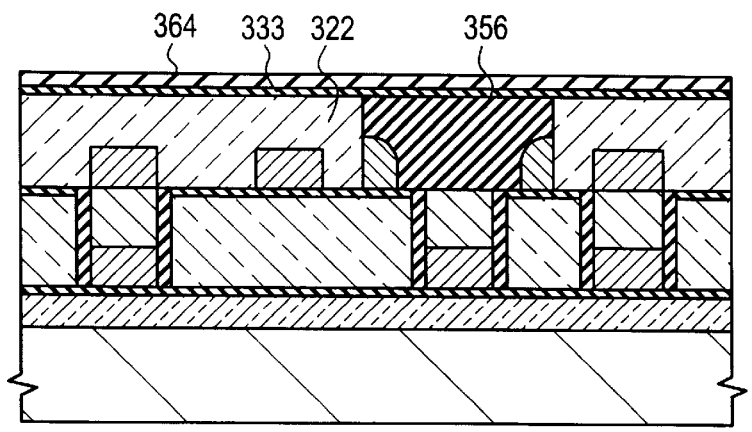
Figure 29C:
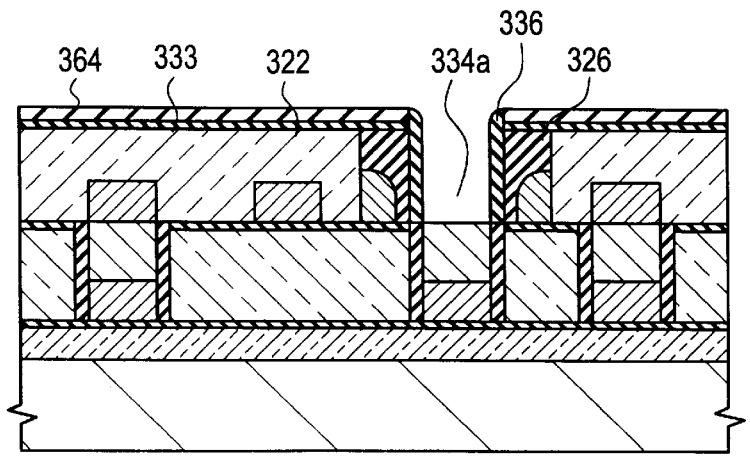
Figure 30A:
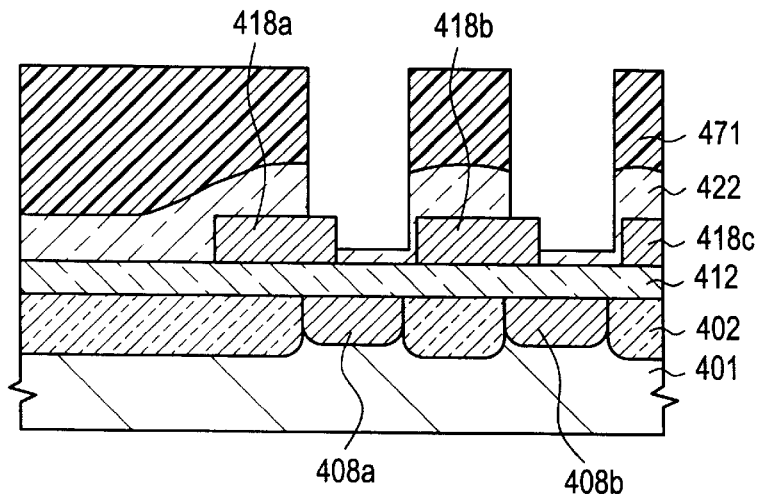
Figure 30B:
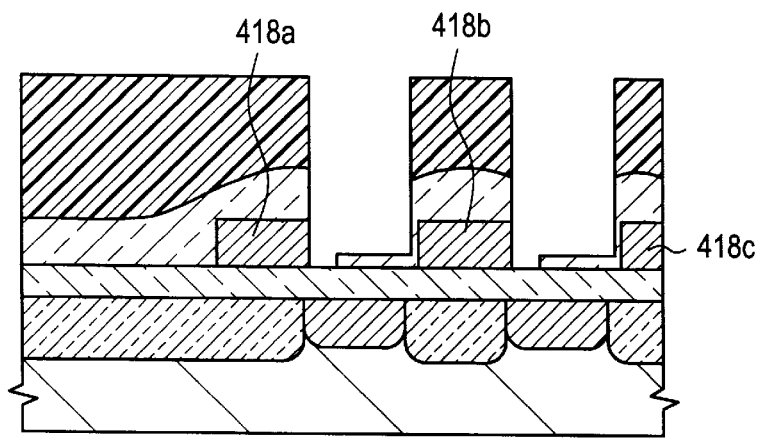
Figure 30C:
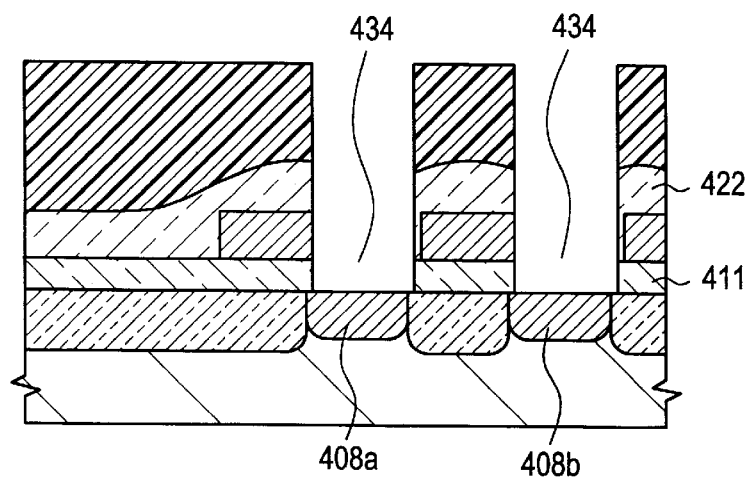
Figure 31A:
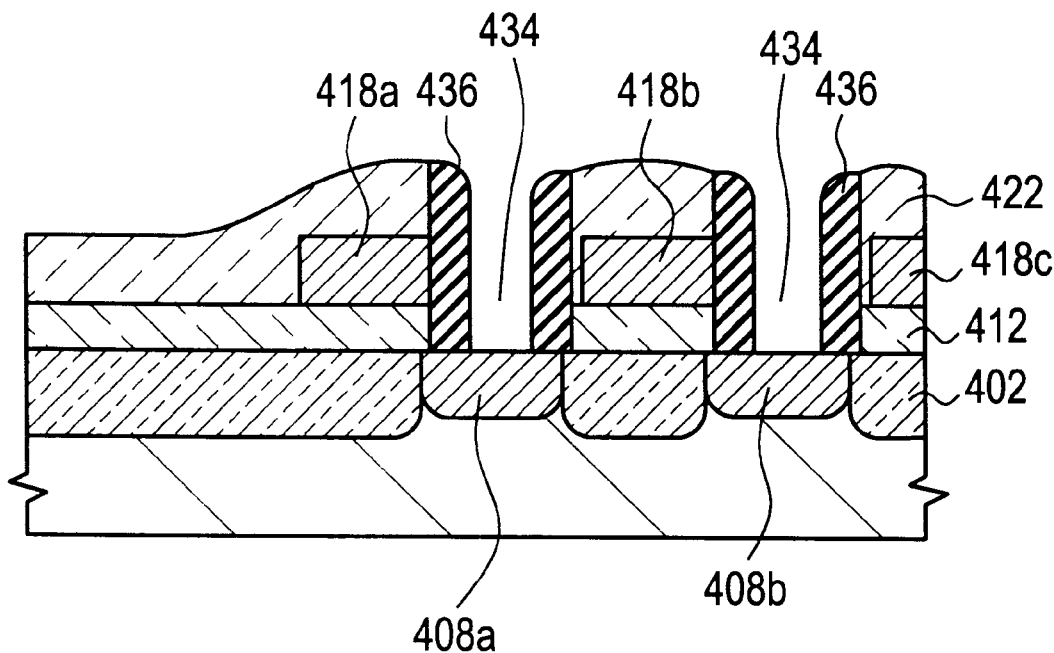
Figure 31B:
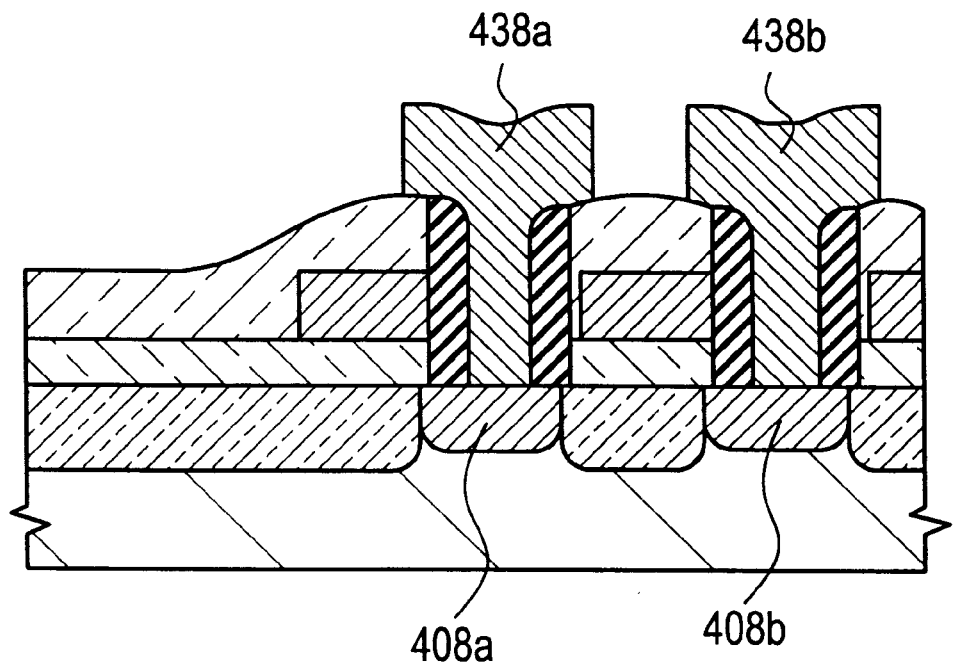

26a, 26b and 26c are the schematic section views taken along the lines A—A, B—B and C—C of FIG. 25, respectively;

FIGS. 27a, 27b and 27c are schematic section views showing manufacturing steps of an application example of the third embodiment of the present invention, namely, FIGS. 27a, 27b and 27c are the schematic section views taken along the line A—A of FIG. 25;

FIGS. 28a, 28b and 28c are schematic section views showing manufacturing steps of an application example of the third embodiment of the present invention, namely, FIGS. 28a, 28b and 28c are the schematic section views taken along the line B—B of FIG. 25;

FIGS. 29a, 29b and 29c are schematic section views showing manufacturing steps of an application example of the third embodiment of the present invention, namely, FIGS. 29a, 29b and 29c are the schematic section views taken along the line C—C of FIG. 25;

FIGS. 30a, 30b and 30c are schematic section views showing manufacturing steps of a multilayer wiring structure of a conventional semiconductor device; and FIGS. 31a and 31b are schematic section views of manufacturing steps of the conventional semiconductor device.

DETAILED DESCRIPTION OF THE PREFERRED EMBODIMENTS

The present invention will be described with reference to the accompanying drawings below.

Figure 1:
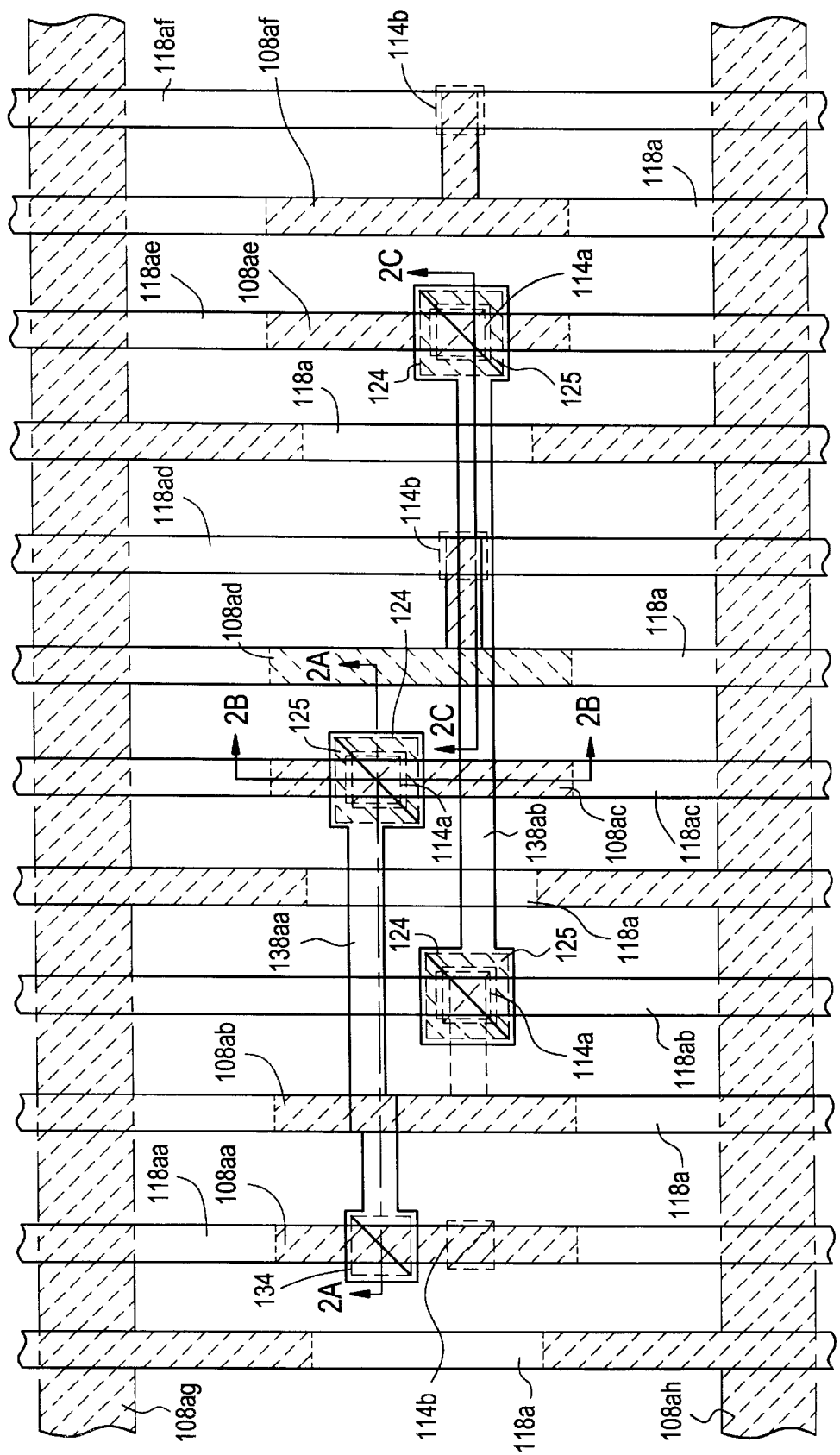
FIG. 1 is a schematic plan view showing a first application example of a first embodiment of the present invention.
Figure 2A:
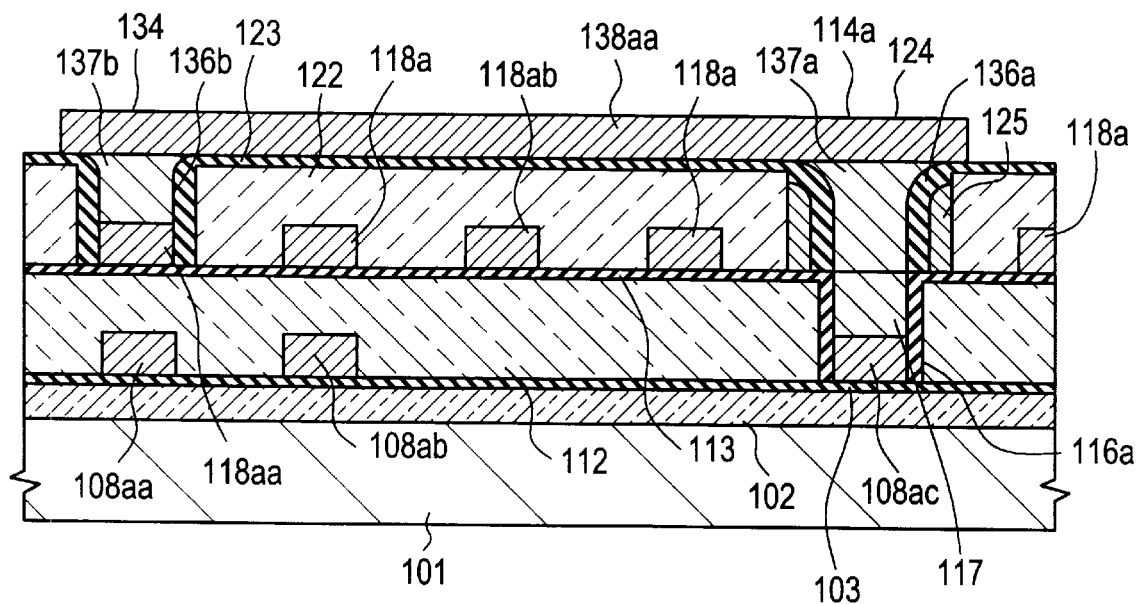
FIGS. 2a, 2b and 2c are schematic section views of the first application example of the first embodiment of the present invention, namely.
Figure 2B:
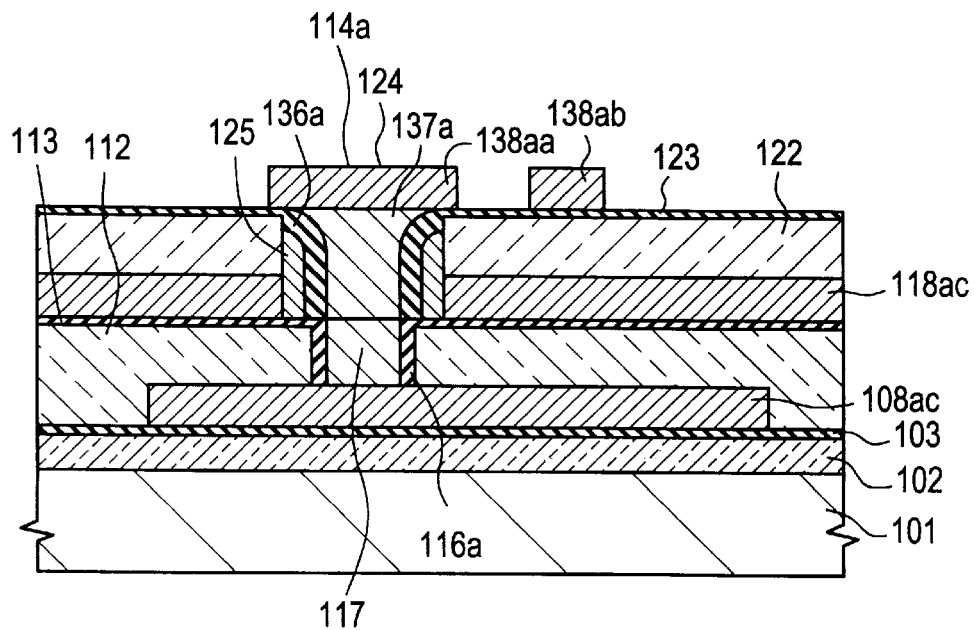
Figure 2C:
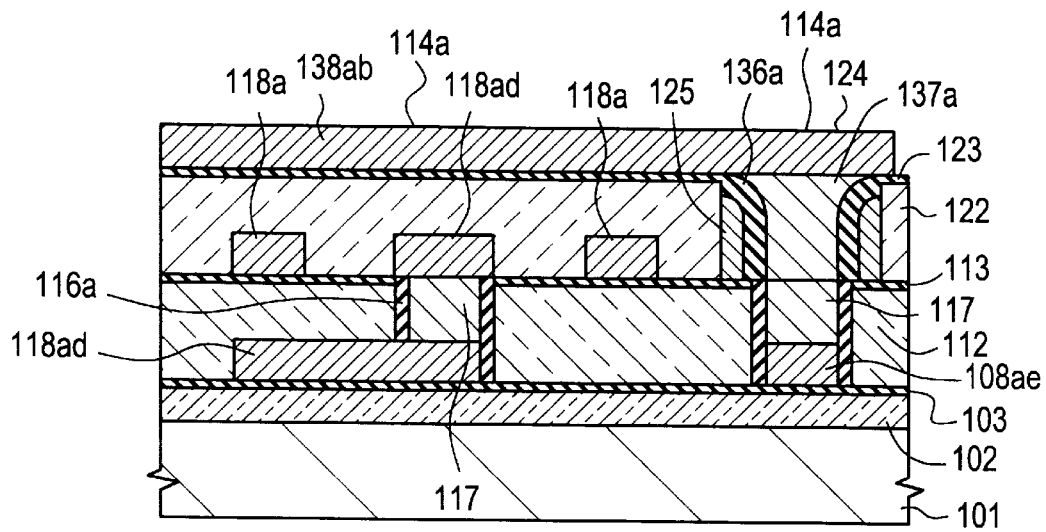
Figure 3:
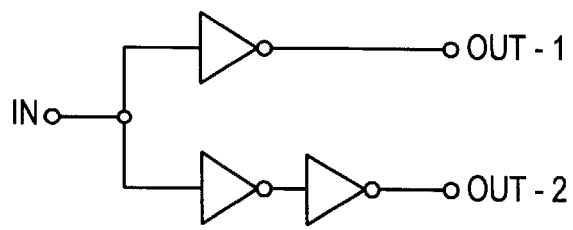
FIG. 3 is a logic circuit diagram showing the first application example of the first embodiment of the present invention.

Referring to FIG. 1 which is a schematic section view of a multilayer wiring structure used in a semiconductor device, FIGS. 2a, 2b and 2c which are schematic section views taken along the lines A—A, B—and C—C of FIG. 1, and FIG. 3 which is a logic circuit diagram, a multilayer wiring structure when a first embodiment of the present invention is applied to a logic circuit receiving one input signal at its first and second stage CMOS inverters (referred to as a first application example of the first embodiment) is as follows. For an easy understanding of it, in FIG. 1, hatchings are illustrated on a first wiring layer and a circular conductive film spacer. Furthermore, in FIGS. 1 and 2, an illustration of a transistor (source and drain diffusion layers and a gate electrode) is omitted.

This multilayer wiring structure is described as one which is composed of three wiring layers formed according to a 0.4 $\mu$m design rule, and has a minimum processing dimension F of 0.4 $\mu$m and an alignment margin A of 0.1 $\mu$m (0.25F). First wiring layers 108aa to 108ah are formed on a silicon substrate 101 of a predetermined conductivity type through a foundation insulating film which is formed by stacking a silicon nitride film 103 of about 50 nm thick on a silicon oxide film 102. The composition of the foundation insulating film is not limited to the foregoing one. When the CMOS transistor is included as in this case, the bottom surface of the foundation insulating film may be at least a silicon oxide film. When this embodiment is applied to the foregoing logic circuit including the CMOS transistor as in this case, since the first wiring layer is connected to the source and drain diffusion layers of $N^+$ and $P^+$ conductivity types, respectively, the wiring layers 108aa to 108ah and the like should be preferably composed of a stacked film formed by stacking titanium nitride film on either a titanium silicide ($TiSi_2$) film or a titanium film. The minimum line width of the first wiring layers 108a to 108ah and the like is about 0.4 $\mu$m (=F), and the thickness of these films is smaller than the value of F, for example, about 200 nm (=0.5F). Therefore, the minimum value of the section area of the first wiring layers is about $0.5F^2$. The minimum interval between the first wiring layers 108a to 108ah is, for example, about 0.6 $\mu$m (=F+2A=1.5F). The wiring pitch of the first wiring layers about 1.0 $\mu$m (=2F+2A=2.5F). The case where either a diffusion layer or a gate electrode is included in the first wiring layers will be described later together with the composition of the foundation insulating film. Furthermore, the composition materials of this embodiment are not limited to the titanium silicide film, the titanium nitride film, and the titanium film. The first wiring layers 108ag and 108ah correspond to a power wiring Vcc and a ground wiring GND, and connected to a $P^+$ type source diffusion layers and an $N^+$ type source diffusion layers of a plurality of P and N channel MOS transistors, respectively.

The first wiring layer 108a is connected to the gate electrode of a first stage CMOS inverter, composed of N and P channel MOS transistors, in a two-stage CMOS inverter, and the first wiring layer 108ab is connected to the $N^+$ and $P^+$ type drain diffusion layers of the N and P channel MOS transistors of the first stage CMOS inverter. The first wiring layer 108ac is connected to the gate electrode of a one stage CMOS inverter composed of N and P channel MOS transistors. The first wiring layer 108ad is connected to the $N^+$ and $P^+$ type drain diffusion layers of N and P channel MOS transistors of the one stage CMOS inverter. The first wiring layer 108ae is connected to the gate electrode of the final stage CMOS inverter, composed of N and P channel MOS transistors, in the two-stage CMOS inverter. The first wiring layer 108af is connected to the $N^+$ and $P^+$ type drain diffusion layers of the N and P channel MOS transistors of the final stage CMOS inverter.

The first wiring layers 108a to 108ah are directly covered with a first silicon oxide film of about 50 nm thick (not shown). On the surface of the first silicon oxide film, a first BPSG film 112 and a first silicon nitride film 113 of about 50 nm thick are stacked. The upper surface of the BPSG film 112 is flattened. The thickness of the BPSG film 112 just above the first wiring layers 108a to 108ah is, for example, about 250 nm.

A first lower contact hole 114a, reaching the first wiring layers 108ab, 108ac, and 108ae and the like, is formed in the first interlayer insulating film. In the first interlayer insulating film, a second lower layer contact hole 114b is also formed reaching the first wiring layers 108a, 108ad, and 108af and the like. The diameters of these first and second lower layer contact holes 114a and 114b are larger than the minimum line width of the first wiring layers, for example, about 0.6 $\mu$m (=F+2A). Therefore, in this case, the minimum interval between the lower layer contact holes is about F. The side surfaces of the lower layer contact holes 114a and 114b are covered with silicon nitride film spacers 116a, respectively. The widths of the silicon nitride film spacers 116a are, for example, about 100 nm (=A), and the upper ends of the silicon nitride film spacers 116a comprise flat surfaces having the same level as the upper surface of the foregoing silicon nitride film 113. These lower contact holes 114a and 114b are filled with a lower layer contact plugs 117, respectively. Each of the lower layer contact plugs 117 is a stacked film, one side of which is about F), composed of a titanium film (not shown), a titanium nitride film (not shown), and a tungsten film. The upper surfaces of the lower contact plugs 117 almost agree with the foregoing upper surface of the silicon nitride film 113, and are almost flat. Each of the contact areas of the lower layer contact plugs 117 to the first wiring layers is at least about $F^2$. However, when the first wiring layers are composed of a diffusion layer, if it is assumed that the minimum line width of the diffusion layer is also about F, the minimum contact area of the lower contact plug to the diffusion layer is about $(F-2A)^2$. The first object to provide the silicon nitride film spacer 116a is to prevent the BPSG film 112 from directly contacting with the lower contact plug 117 containing the tungsten film. The second object to provide the silicon nitride film 113 and the silicon nitride film spacer 116a, not the silicon oxide film spacer, is the matter concerning a manufacturing method of the semiconductor device of the present invention, and it will be described later.

The composition of the first interlayer insulating film is not limited to the foregoing one, but it may be one that for example, a silicon nitride film is stacked on a silicon oxide film having a flat upper surface. Moreover, the diameters of the first and second lower contact holes may be more than about F. In this case, it is not inevitable that the silicon nitride film spacer as described above is provided on the side surfaces of the first and second lower contact holes, including the section shape.

Second wiring layers 118a, 118aa to 118af having the minimum line width of about F are provided on the surface of the first interlayer insulating film. The wiring pitch of the second wiring layers is also about 1.0 μm. The thickness of the second wiring layers 118a, 118aa to 118af is about 200 nm. These second wiring layers 118a, 118aa to 118af are constituted of a stacked film composed of for example, an $N^+$ type polycrystalline silicon film, a titanium suicide film, and a titanium nitride film. The composition materials of the second wiring layers are selected according to the composition materials of the foregoing lower layer contact plug 117 which are selected considering the manufacture of this contact plug 117. Specifically, the composition materials of the second wiring layers depend on the composition materials of the lower layer contact plug, and are not limited to the foregoing materials of the second wiring layers.

The second wiring layer 118aa corresponds to an input signal line IN of the foregoing logic circuit, and is connected to the first wiring layer 108a through the lower layer contact hole 114b. The connection of the second wiring layer 118aa to the first wiring layer 108ac will be described later. The second wiring layer 108ad corresponds to an output signal line OUT-1 of the foregoing logic circuit, and is connected to the first wiring layer 108ad through the lower layer contact hole 114b. The second wiring layer 118af corresponds to an output signal line OUT-2 of the logic circuit, and is connected to the first wiring layer 108af through the lower layer contact hole 114b.

The line width of the second wiring layers 118aa, 118ad, and 118af located at the portion which is connected to the lower layer contact hole 114b may be F. In this case, the minimum value of the contact area of these second wiring layers to the lower layer contact plug 117 is about $(F-A)^2$ $(=0.56\ F^2)$. This minimum value is larger than the minimum value (about $0.5\ F^2$) of a section area of the first and second wiring layers. Therefore, the problems of an increase in the contact resistivity and deterioration of migration resisting property will not be produced. If the line width of the second wiring layers 118aa, 118ad, and 118f is set to be equal to the diameter of the second lower contact hole 114b, which is about (F+2A), the lower layer contact plug 114b is completely covered with the second wiring layers so that the minimum contact area of the lower contact plug 117 to the second wiring layer including the dummy second wiring layer is about $F^2$. Therefore, the occurrence of the foregoing problems can be more completely prevented.

The second wiring layers 118a, 118aa to 118af are covered with the second interlayer insulating film. The second interlayer insulating film consists of a stacked film composed of a second silicon oxide film of about 50 nm thick (not shown), a second BPSG film 122, and a second silicon nitride film 123 of about 50 nm. The upper surface of the BPSG film 122 is flattened, The thickness of the BPSG film 122 located just above the second wiring layers 118a, 118aa to 118af is about 250 nm. An upper layer contact hole 124 reaching the first lower contact hole 114a is formed in the second interlayer insulating film, and a second upper layer contact hole 134 reaching the second wiring layer 118aa is formed in the second interlayer insulating film. The diameters of the first and second contact holes 124 and 134 are about 1.0 μm (=2F+2A=2.5F) and about 0.7 μm (=F+3A= 1.75F), respectively. When the constitution of this embodiment is applied to the foregoing logic circuit, the second upper layer contact hole to be connected directly to the second lower layer contact hole does not actually exist. In the constitution of this embodiment, the second upper layer connected directly to the second lower layer contact hole exists. In this case, a dummy second wiring layer, one side of which is about (F+2A) may be arranged at the upper end of the second lower layer contact hole.

The second wiring layers 118a, 118ab, 118ac, and 118ae are wiring layers which have not any relation to the foregoing logic circuit. For example, the second wiring layers 118ab, 118ac, and 118ae are disposed at the locations including the portions just above the respective first wiring layers 108ab, 108ac, and 108ae. It is noted that the portion just above the first lower layer contact hole 114a is excluded from the portions just above the respective first wiring layers 108ab, 108ac, and 108ae. The second wiring layers 118ab, 118ac, and 118ae have a shape which is divided by the first upper layer contact hole 124 at the portion just above the first lower layer contact hole 114a. The connection of these divided portions is done by a ring-shaped conductive film spacer 125 arranged on the side surface of the first upper layer contact hole 124.

The ring-shaped conductive film spacer 125 is composed of, for example, a titanium nitride film or an $N^+$ type polycrystalline silicon film or the like, and the width and the height from the bottom surface to the upper end of the ring-shaped conductive film spacer 125 are about 150 nm and about 400 nm, respectively. Specifically, the upper end of the ring-shaped conductive film spacer 125 is located at the position lower than the upper surface of the second interlayer insulating film (the upper surface of the silicon nitride film 123) by 150 nm. The selections of the composition materials for the ring-shaped conductive film spacer 125 are done, considering the composition materials of the lower layer contact plug 117 in the similar manner to the case of the second wiring layers and the restriction on the film formation method. The determination of the width and the height of the ring-shaped conductive film spacer 125 is done considering the section area in the minimum line width of the second wiring layer and the relative resistivity thereof. As to the first upper layer contact hole 124 reaching the first lower layer contact hole 114a which is connected to the first wiring layer 108ac, the interval between the first upper layer contact hole 124 and the second wiring layer 118a adjacent to the hole 124 is about 0.3 μm, and it is much larger than the alignment margin A. As a result, the ring-shaped conductive film spacer 125 formed on the side surface of the first upper layer contact hole 124 is sufficiently separated insulatively from the second wiring layer 118a.

On the side surface of the first upper layer contact hole 124, a silicon oxide film spacer 136a having a shape to cover the ring-shaped conductive film spacer 125 is formed. Also on the side surface of the second upper contact hole 134, a silicon oxide film spacer 136b is formed. The widths of these spacers 136a and 136b are about 150 nm. The second layer contact hole 134 and the first upper layer contact hole 124, the side surface of which is covered with the ring-shaped conductive film spacer 125 and the silicon oxide film spacer 136a, are filled by the second upper layer contact plug 137b and the first upper layer contact plug 137a, respectively. The first and second upper contact plugs 137a and 137b may be the similar constitutions to that of the lower layer contact plug 117, and they may be composed of other conductive film, for example, an N+ type polycrystalline silicon film.

The minimum width of the silicon oxide film spacer 136a is defined by the total of the film thickness (about 30 nm) and the alignment margin A, this film thickness being necessary to insulatively separate the ring-shaped conductive film spacer 125 from the first upper layer contact plug 137a, and this film thickness being necessary to insulatively separate the spacer 125 from the lower layer contact plug 117 which fills the lower layer contact hole 114a. Therefore, if the width of the silicon oxide film spacer 136a is about 150 nm, for example, it can be avoided that the second wiring layer 118a and the first wiring layer 108ab are short-circuited.

If the widths of the silicon oxide film spacers 136a and 136b are about 150 nm, the lengths of one side of the bottom and upper surfaces of the first upper layer contact plug 137a are about 0.4 μm (=F) and 1.0 μm, and the lengths of one side of the bottom and upper surfaces of the second upper layer contact plug 137b are about 0.4 μm (=F) and 0.7 μm. In this case, the minimum contact area of the first upper layer contact plug 137a and the lower layer contact plug 117 is about $(F-A)^2$. If the film thicknesses of the first and second wiring layers about 200 nm, troubles due to the contact resistivity at this portion do not occur.

The object to determine the section area of the silicon nitride film spacer 116a as described above is to reduce the second diameter of the first upper layer contact hole 124 as possible. For example, when the film thicknesses of the first and second wiring layers are so large that the value F (=0.4 μm) can not be neglected and troubles of the contact resistor at this contact portion occur, the film thickness of the second interlayer insulating film is set larger, and at the same time, the widths of the silicon oxide film spacers 136a and 136b are set to be about 50 nm. Furthermore, the section area of the bottom surface of the first upper layer contact plug 137a which is initially about $F^2$ is broadened to about $(F+2A)^2$. Otherwise, if the width of the silicon oxide film spacer 136a and the section area of the bottom surface of the first upper layer contact plug 137a are unchanged, if on the behalf of the foregoing silicon nitride film spacer 116a, a silicon nitride film spacer is formed, the upper end of which is agree with the upper surface of the first interlayer insulating film and which has a section shape representing a smooth curve continuing from the upper end to the side surface, and if the diameter of the first upper contact hole is widened by about 2A, the area of the upper end of the lower layer contact plug is about $(F+2A)^2$.

The second interlayer insulating film is not limited to the foregoing constitution, as is similar to the first interlayer insulating film, the second interlayer insulating film may be composed from a film which is formed by stacking a silicon nitride film on a silicon oxide film having a flat upper surface. In this case, the diameter of the second upper layer contact hole must be set to be more than F. However, the formation of the silicon oxide film spacer 136b on the side surface of the second upper layer contact hole is not inevitable.

On the surface of the second interlayer insulating film, third wiring layers 138aa and 138ab having the minimum line widths of 0.4 μm (=F) and the film thicknesses of about 200 nm are arranged. The third wiring layer 138aa is connected to the second wiring layer 118aa through the second upper layer contact hole 134, and is connected to the first wiring layer 108ac through the first contact plug 137a of the first upper layer contact hole 124 and the first lower layer contact hole 114a. One terminal of the third wiring layer 138ab is connected to the first contact plug 137a of the first upper layer contact hole 124 and the first lower layer contact hole 114a. The other terminal of the third wiring layer 138ab is connected to the first wiring layer 108ae through the first contact plug 137a of the first upper layer contact hole 124 and the first lower layer contact hole 114a. The line widths of the third wiring layers 138aa and 138ab at the connection portions to the first upper layer contact hole 124 are about 1.2 μm (=the second diameter+2A), the line width of the third wiring layer 138aa at the connection portion to the second upper layer contact hole 134 is about 0.9 μm (=the third diameter+2A). The minimum interval between the third wiring layers 138aa and the third wiring layers 138ab near the first upper layer contact hole 124 is set so as to be F. When the upper ends of the upper contact holes 124 and 134 are completely covered with the third wiring layers 138aa and 138ab, the selections of the composition materials of the third wiring layers 138aa and 138ab are not restricted as in the case of the first and second wiring layers. However, when the third wiring layers do not cover completely the upper ends of the upper layer contact holes 124 and 134, the selections of the composition materials of the third wiring layers is restricted as in the first and second wiring layers.

Referring to FIGS. 1 and 2, FIGS. 3, 4, and 5, FIGS. 7, 8, and 9 which are schematic section views of manufacturing steps taken along the line B—B of FIG. 1, and FIGS. 10, 11, and 12 which are schematic section views of manufacturing steps taken along the line C—C, a multilayer wiring structure of a first application example of the foregoing first embodiment is manufactured as follows.

On a silicon substrate 101 of a predetermined conductivity type, semiconductor elements, such as an N channel MOS transistor and a P channel MOS transistor including a well of a predetermined conductivity type, an N+ type source and drain diffusion layers, and P+ type source and drain diffusion layers, are formed. A lower layer insulating film covering the surface of the silicon substrate 101 as well as these MOS transistors is formed. The upper surface of the lower layer insulating film is flat. This lower layer insulating film consists of a stacked film composed of a silicon oxide film 102 having the flat upper surface and a silicon nitride film 103 of about 50 nm thick. After connection holes (not shown) to the semiconductor elements are formed, a stacked film of about 200 nm thick is formed on the surface of the lower layer insulating film. The stacked film is constituted by stacking a titanium nitride film on either a titanium silicide film or a titanium film of 200 nm thick. This stacked film is patterned so that first wiring layers 108a to 108ah are formed. The minimum line widths of the first wiring layers 108a to 108ab are 0.4 μm (=F), and the average wiring interval between the layers 108a to 108ah is 0.6 μm (=F+2A). The wiring pitch of the first wiring layers 108a to 108ah is about 1.0 μm (=2F+2A).

Subsequently, a first interlayer insulating film covering the first wiring layers 108a to 108ah is formed in the following manner. By an LPCVD method (this method is also a high temperature vapor phase growth technique), the first silicon oxide film (not shown) of about 50 nm covering directly the first wiring layers 108a to 108ah is formed on the entire surface of the resultant structure as an HTO film. Further, a first BPSG film is formed. This BPSG film is subjected to a reflow treatment and further is finished to a BPSG film 112 having a flat upper surface by a CMP technique. At this stage, the film thickness of the BPSG film 112 just on the first wiring layer is about 250 nm. Subsequently, a first silicon nitride film 113 of about 50 nm thick is formed on the entire surface of the resultant structure, and the first interlayer insulating film composed of the first silicon oxide film, the BPSG film 112, and the silicon nitride film 113 is completed. When the first interlayer insulating film is formed by stacking a silicon nitride film on a silicon oxide film having a flat upper surface, an initial stage of the formation of this silicon oxide film should be preferably performed by the LPCVD technique.

Next, a second silicon oxide film 154 of about at least 100 nm is formed on the entire surface of the resultant structure. By an anisotropic etching using a photoresist film (not shown) as a mask, first and second lower layer contact holes 114a and 114b reaching the first wiring layer are formed. Each of the contact holes 114a and 114b has a first diameter of about 0.6 μm (=F+2A). An aspect ratio of the first and second lower layer contact holes 114a and 114b is about 1.1. The determination of the first diameters of the lower layer contact holes 114a and 114b is done as in the following manner. Specifically, when an interval between the two lower layer contact holes is at least F and the minimum value of one side of a lower layer contact plug filling the lower layer contact holes is F, the determination of the first diameters of the lower layer contact holes is done so that a width of an insulating film spacers formed on the side surfaces of the lower layer contact holes is secured for the insulating film so as to function as a barrier film against the BPSG film 112 (FIGS. 1, 4a, 7a, and 10a). It is noted that the two lower layer contact holes are in relation of a first-nearest-neighbor; i.e., 1st. n.n. The foregoing anisotropic etching steps are composed of two stages. In the anisotropic etching of the first stage, trifluoromethane ($CHF_3$) is used as an etching gas, which has an ability to etch the silicon oxide film and the silicon nitride film at approximately the same etching rate. The first stage anisotropic etching is performed until the silicon nitride film 113 is completely etched and the BPSG film 112 with a predetermined film thickness is left. In the second stage anisotropic etching, carbon monoxide is added to $CHF_3$, and the residual BPSG film 112 and the first silicon oxide film (not shown) are selectively etched. One of the objects to form the silicon nitride film on the lower layer insulating film is to prevent the lower layer insulating film from being etched at the second stage anisotropic etching.

Figure 4A:
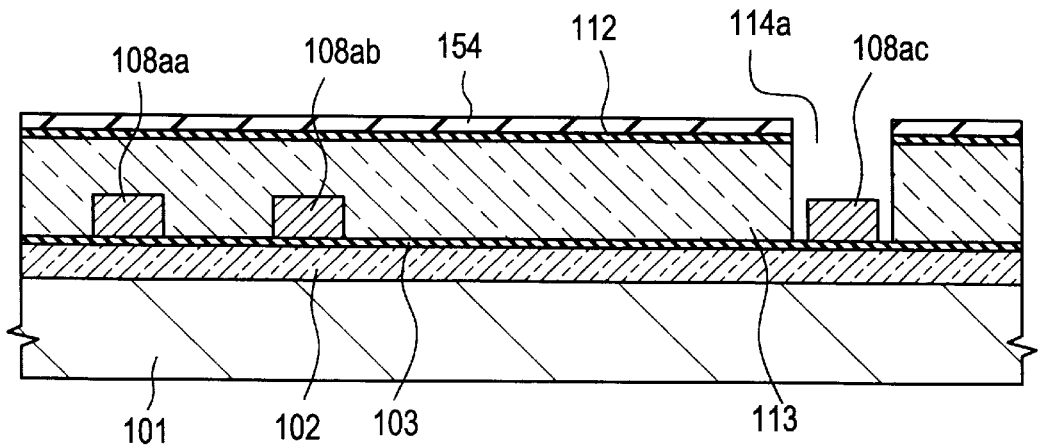
FIGS. 4a, 4b, 4c and 4d are schematic section views of manufacturing steps of the first application example of the first embodiment of the present invention, namely.
Figure 4B:
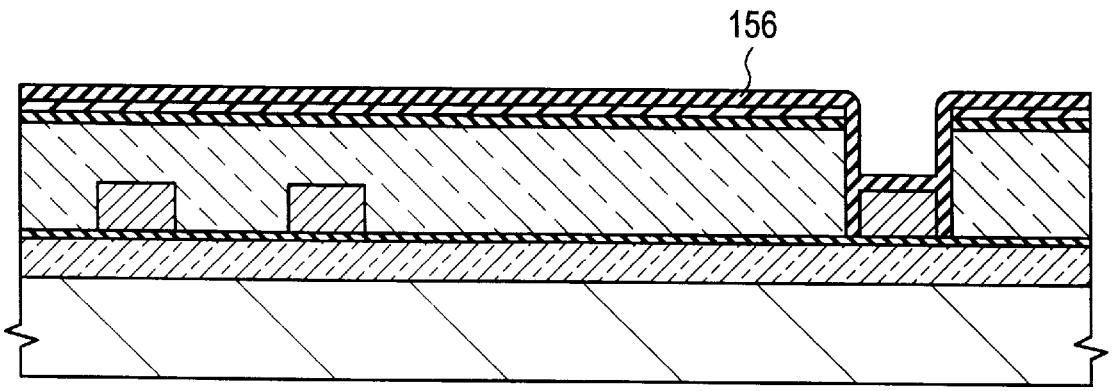
Figure 7A:
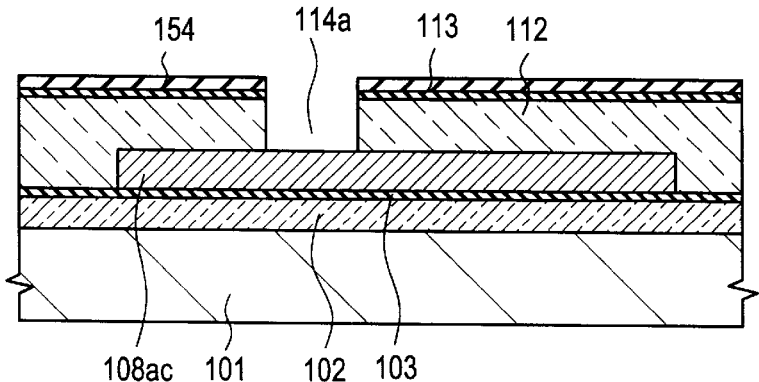
FIGS. 7a to 7d are schematic section views showing manufacturing steps of the first application example of the first embodiment of the present invention, namely.
Figure 7B:
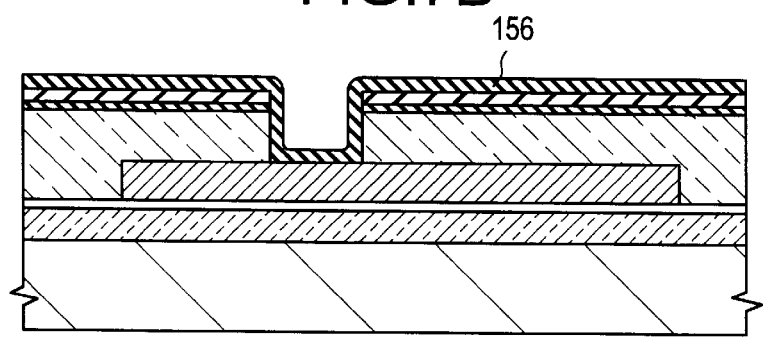
Figure 10A:
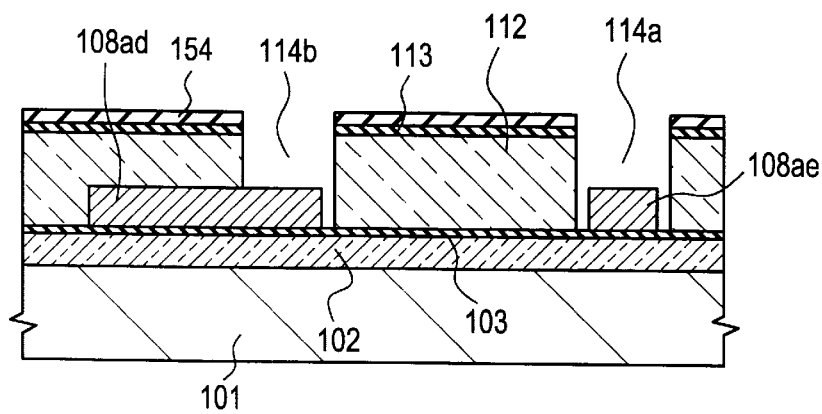
FIGS. 10a to 10d are schematic section views showing manufacturing steps of the first application example of the first embodiment of the present invention, namely.
Figure 10B:
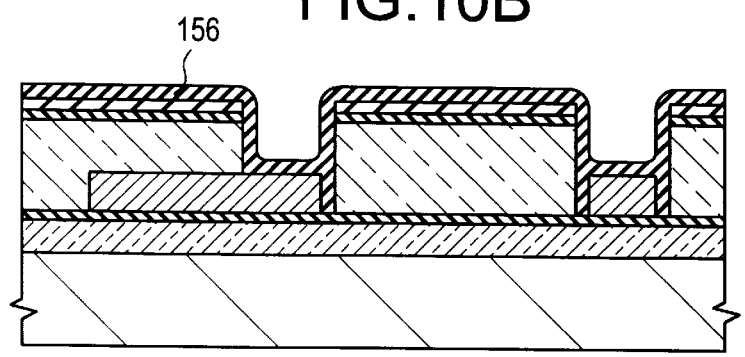

Next, a second silicon nitride film 156 of about 100 nm is formed on the entire surface of the resultant structure by the LPCVD method (this method is also a high temperature vapor phase growth method) using dichlorosilane ($SiH_2Cl_2$) and ammonium ($NH_3$) as a material gas (FIGS. 4a, 7b, and 10b). The reason why the silicon nitride film 156 is formed by the LPCVD method is that a step coverage property of the film 156 formed by the LPCVD method is excellent. The film thickness of several nm may well do as the minimum film thickness which is required of the silicon nitride film 156, the minimum film thickness being a film thickness with which the silicon nitride film 156 is able to function as a barrier film for the BPSG film in the lower layer contact holes 114a and 114b. However, considering a uniformity of the film thickness and a workable property in subsequent steps, the film thickness of the silicon nitride film 156 should be about 30 nm. The film thickness of the silicon oxide film 154 is set to be equal to that of the silicon nitride film 156 or more. When the film thickness of the silicon nitride film 156 is set thinner, according to this, the film thickness of the silicon oxide film 154 can be made thinner so that the diameters of the lower layer contact holes 114a and 114b can be set smaller.

Figure 4C:
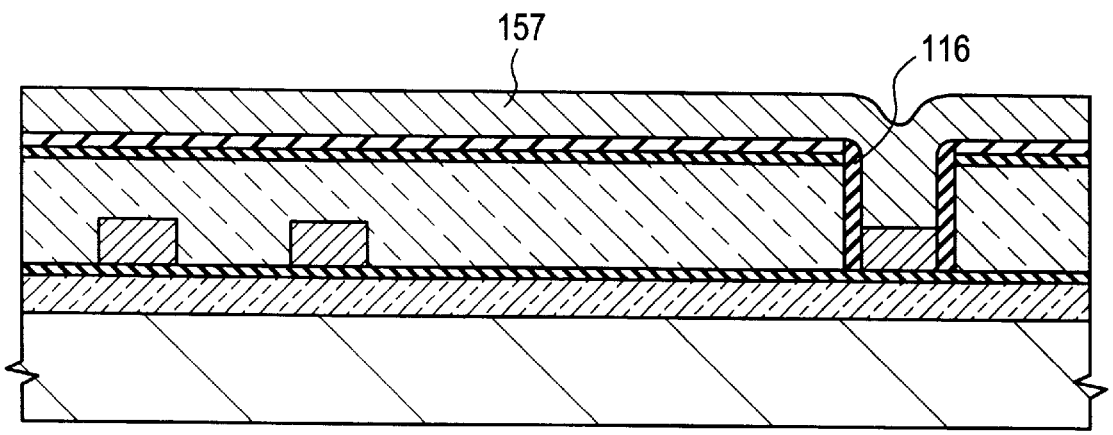
Figure 7C:
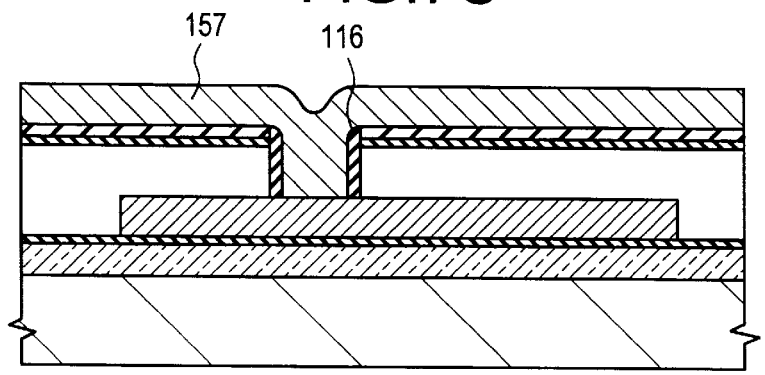
Figure 10C:
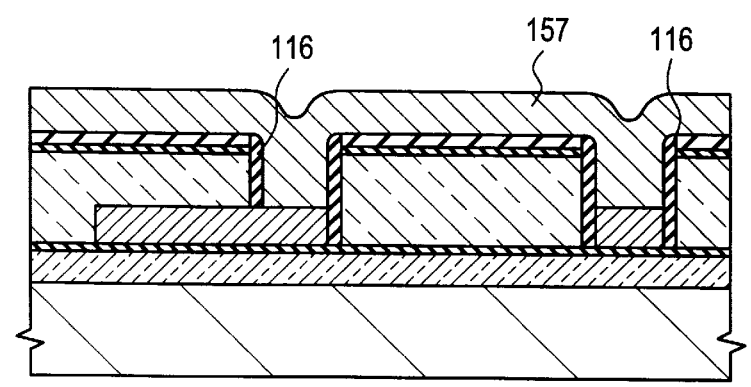

Subsequently, the silicon nitride film 156 is etched-back by the anisotropic etching using mixture gas composed of tetrafluoromethane ($CF_4$) and $CHF_3$ until the upper surface of the silicon oxide film 154 is exposed, thereby a silicon nitride film spacer 116 having an ordinary section shape is formed on the side surfaces of the lower layer contact holes 114a and 114b. If this mixture gas is used, the silicon nitride film can be almost selectively etched against silicon oxide film. At the time of this etching-back, the silicon oxide film 154 functions as a stopper. Next, a first conductive film is formed in the following manner. A titanium film (not shown) and a titanium nitride film (not shown) are formed by sputtering, and a tungsten film 157 having enough film thickness to fill the lower layer contact holes 114a and 114b is formed. Thus, the first conductive film is completed. The titanium film and the titanium nitride film are provided to secure adhesiveness to the insulating film (especially the silicon nitride film spacer 116). The film thicknesses of the titanium film and the titanium nitride film on the surface of the silicon oxide film 154 are about 50 nm and 100 nm. However, these film thicknesses of the films located on the surface of the silicon nitride film spacer 116 are extremely thin (FIGS. 4c, 7c, and 10c).

Figure 4D:
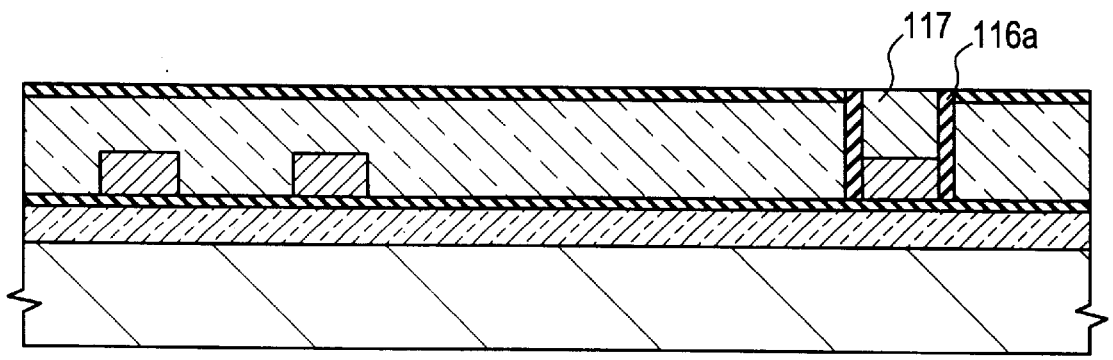
Figure 7D:
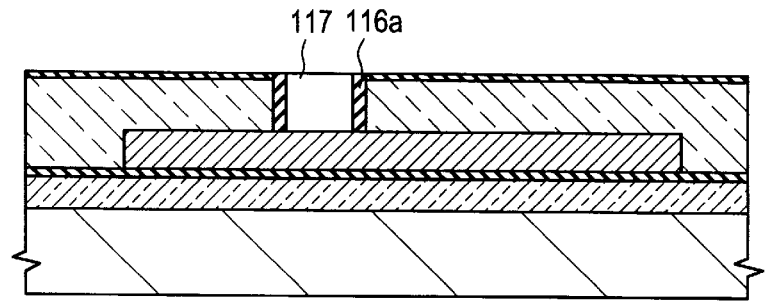
Figure 10D:
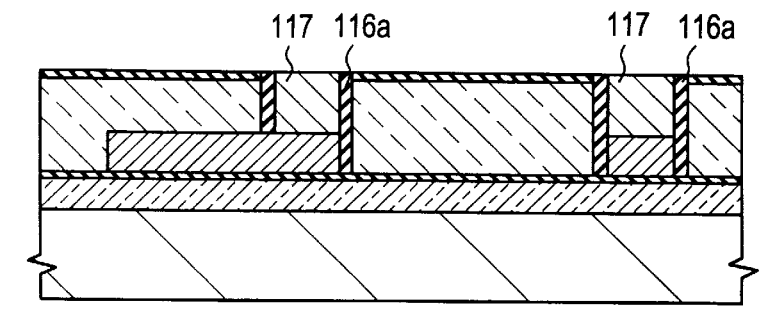

Next, until the upper surface of the silicon nitride film 113 is exposed, the tungsten film 157, the silicon oxide film 154, and the silicon nitride film spacer 116 are subjected to CMP. The silicon nitride film spacer 116 is worked to a silicon nitride film spacer 116a having the same height level as the surface of the silicon nitride film 113 and flatness. The lower layer contact hole 114a and 114b is filled with the lower layer contact plug 117 through the silicon nitride film spacer 116a. Since the silicon nitride film possesses high hardness, the silicon nitride film 113 serves to detect the final point of the CMP (FIGS. 4d, 7d, and 10d). The horizontally covering ration of the silicon nitride film spacer 116 is small so that the spacer 116 much contributes to the detection of the final point of the CMP.

At the formation of the silicon nitride film spacer 116a and the lower layer contact plug 117, it is not necessary to perform only the CMP. Specifically, the tungsten film 157 may be removed to a some degree by the etching-back by means of the anisotropic etching using sulfur hexafluoride as etching gas and, thereafter, the CMP may be performed. In addition, the major composition materials of the lower contact plug are not limited to the tungsten film, for example, a titanium nitride film or a film formed by stacking a silicon titanium film on a titanium film will do. Furthermore, the diameter of the lower layer contact hole 114a and 114b and the width of the silicon nitride film spacer 116a are not limited to about 0.6 μm and 100 nm, but these values may be set freely as long as the width of the silicon nitride film spacer 116a can be set more than 30 nm and at the same time the section area of the lower layer contact plug 117 can be set to about $F^2$.

Furthermore, the section shapes of the silicon nitride film spacers formed on the side surface of the first and second lower layer contact holes are not limited to the foregoing section shape of the foregoing silicon nitride film spacer 116a, but it may be an ordinary section shape as the silicon nitride film spacer 116. In this case, the formation of the foregoing silicon oxide film 154 is not necessary. In addition, when the first interlayer insulating film is formed by stacking a silicon nitride film on a silicon oxide film having a flat upper surface, the formation of the silicon nitride film spacer on the side surfaces of the first and second lower contact holes having the diameter more than F is not necessary. If the silicon nitride film spacer is formed, the section shape of it may be the section shape of the foregoing silicon nitride film spacer 116a, and, moreover, it may be an ordinary section shape.

Next, on the first interlayer insulating film, a film of about 200 nm thick is formed by stacking a titanium film on a titanium nitride film. This stacked film is subjected to patterning so that second wiring layers 118a, 118aa to 118af are formed. The minimum widths and the wiring pitch of them are about 0.4 µm (=F) and 1.0 µm, respectively. In the stage where the second wiring layer are formed, the second wiring layers 118ab, 118ac, and 118ae are connected to the first contact hole 114a, respectively. For example, the line width of the second wiring layer 118ac at the portion connected directly to the lower layer contact hole 114a is set to be about 0.6 µm (=F+2A) which is equal to the diameter of the lower layer contact hole 114a, and the line width of the second wiring layer 118ad at the portion connected directly to the lower contact hole 114b is set to be about 0.6 µm (=F+2A) which is equal to the diameter of the lower layer contact hole 114b. However, these line widths are not limited to these values, and they may be about 0.4 µm (=F). The selections of the composition materials of the second wiring layers are limited by the composition materials of the lower layer contact plug 117. However, when the lower layer contact plug 117 is composed of either a tungsten film or a film mainly composed of the tungsten film, the second wiring layer is not limited to the foregoing stacked film, for example, it may be an N⁺ polycrystalline silicon film. Since the upper surface of the first interlayer insulating film is composed of the silicon nitride film 113, it can be avoided that the second wiring layers 118a, 118aa to 118af contacts directly to the BPSG film 112.

Figure 5A:
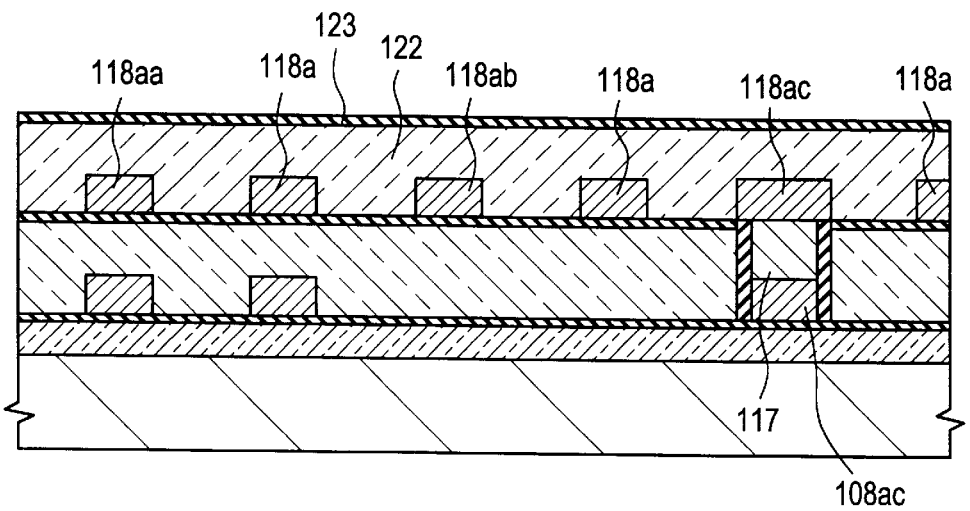
FIGS. 5a, 5b and 5c are schematic section views showing manufacturing steps of the first application example of the first embodiment of the present invention, namely.
Figure 8A:
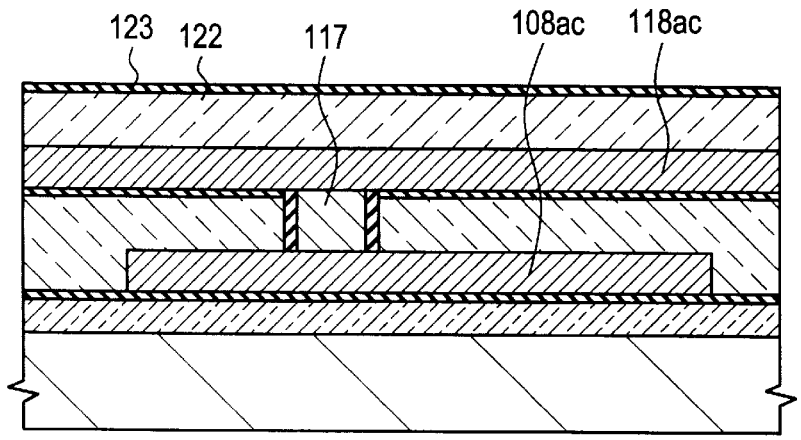
FIGS. 8a, 8b and 8c are schematic section views showing manufacturing steps of the first application example of the first embodiment of the present invention, namely.
Figure 11A:
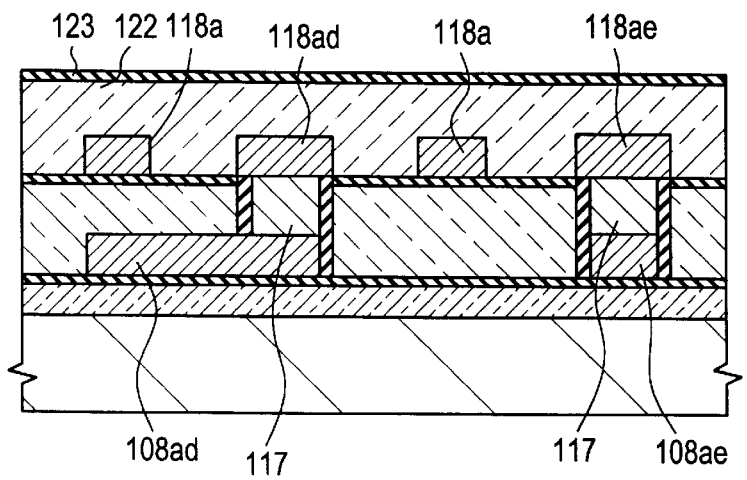
FIGS. 11a, 11b and 11c are schematic section views showing manufacturing steps of the first application example of the first embodiment of the present invention, namely.

Next, in the similar manner to the foregoing first interlayer insulating film, a second interlayer insulating film is formed, which is composed of an HTO film (not shown), a second BPSG film 122 having a film thickness of about 250 nm just on the second wiring layers, and a third silicon nitride film 123 of about 50 nm thick (FIGS. 5a, 8a, and 11a).

As in the case of the first interlayer insulating film, the second interlayer insulating film may be a film formed by stacking a silicon nitride film on a silicon oxide film having a flat upper surface.

Next, an anisotropic etching is performed concerning the second interlayer insulating film and the second wiring layer 118ab, 118ac, and 118ae using a photoresist film (not shown) as a mask, so that a first upper layer contact hole 124 having a second diameter of about 1.0 µm (=2F+2A=2.5F) is formed. This contact hole 124 reaches the first lower layer contact hole 114a. An aspect ratio of the upper layer contact hole 124 is about 0.55.

The final stage of the anisotropic etching for the second interlayer insulating film is performed by adding CO to CHF₃. At the time of the final stage of this anisotropic etching, this etching does not reach the BPSG film 112 and the silicon nitride film spacer 116a is not etched, because the upper surface of the first interlayer insulating film is composed of the silicon nitride film 113 and the side surface of the lower layer contact hole 114a is covered with the silicon nitride film spacer 116a.

When the lower layer contact plug 117 is composed of either a tungsten film or a film mainly composed of the tungsten film, and the second wiring layer is composed of a stacked film of a titanium film and a titanium nitride film, and an N⁺ type polycrystalline silicon film, chloride (Cl₂) and hydrogen bromide (HBr) are used in the anisotropic etching for the second wiring layer. At the time of this etching, since the film thicknesses of the silicon nitride film 113 and the silicon nitride film spacer 116a as well as the film thicknesses of the stacked film which is composed of the titanium film and the titanium nitride film constituting the lower layer contact plug 117 are extremely thin, this stacked film is not almost etched due to a loading effect. On the other hand, if the lower layer contact plug is formed of a stacked film composed of a titanium film and a titanium nitride film, the second wiring layer can be formed of, for example, a tungsten film and an N⁺ type polycrystalline silicon film and the like. In the anisotropic etching for the second wiring layer at the formation of the first upper layer contact hole, either SF₆ or HBr is used. The combination of the composition materials used in the lower layer contact plug and the composition materials used in the second wiring layer must be done considering the existence of gas capable of etching selectively the second wiring layer.

Figure 5B:
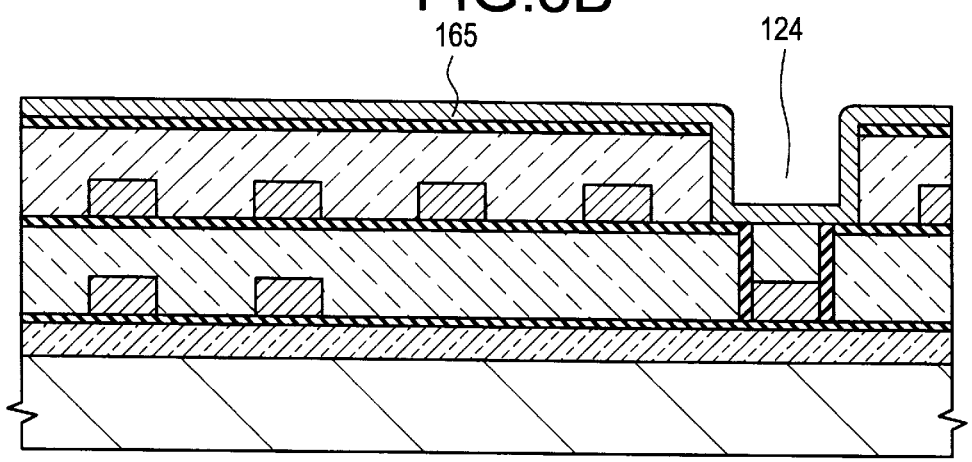
Figure 5C:
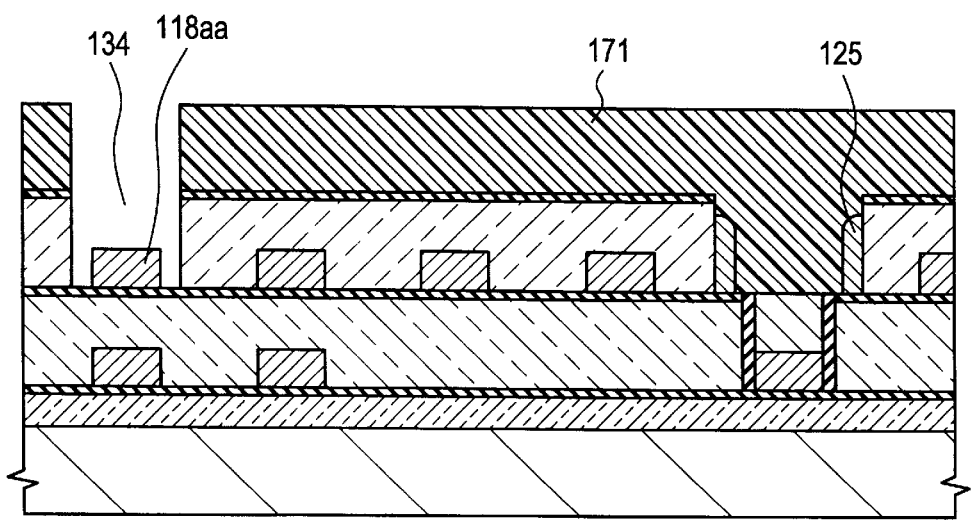
Figure 8B:
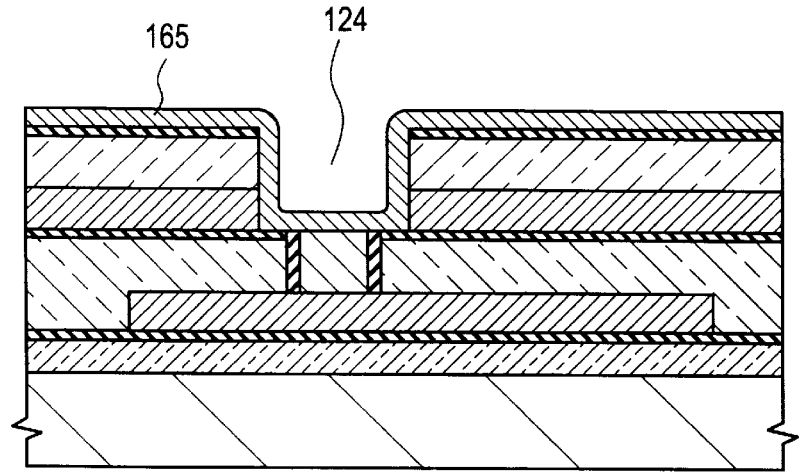
Figure 8C:
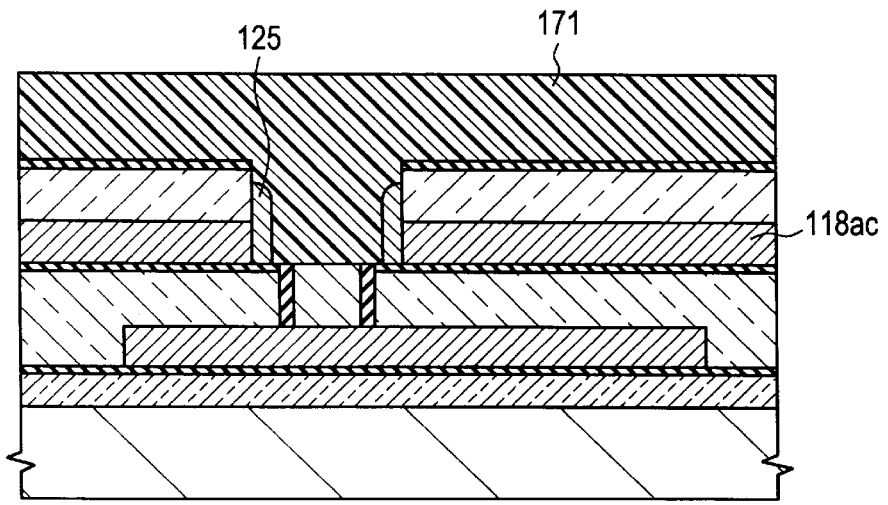
Figure 11B:
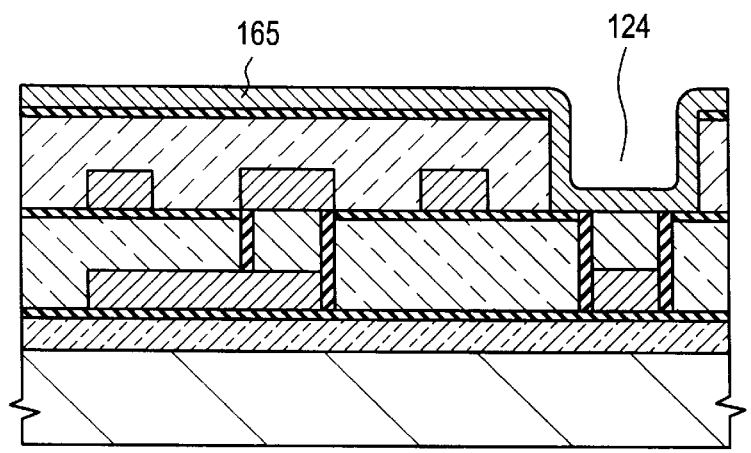
Figure 11C:
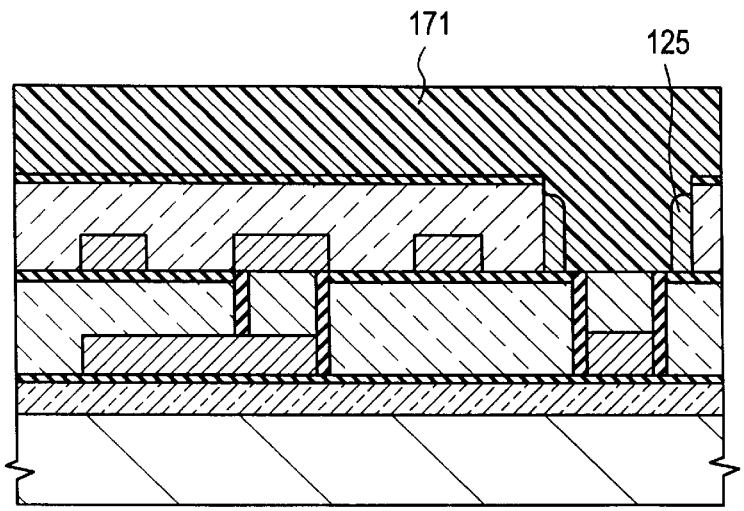

Next, a second conductive film 165 of about 150 nm is formed on the entire surface of the resultant structure. This conductive film 165 is composed of a titanium nitride film. In in-situ, the film 165 is composed of an N⁺ type polycrystalline film or an amorphous silicon film. Finally, the film 165 is composed of an N⁺ type polycrystalline silicon film. Since a step coverage property is required for the conductive film 165, the film 165 must be formed by the LPCVD method. When the conductive film 165 is composed of the titanium nitride film, the conductive film 165 is formed by an ECR-CVD method using titanium tetrachloride TiCl₄ and ammonium NH₃ as material. Furthermore, selectivity of the anisotropic etching for the lower layer contact plug is required for the composition materials of the conductive film 165, similarly to the case of the second wiring layer (FIGS. 5b, 8b, and 11b).

Subsequently, the conductive film 165 is etched-back fully, and a ring-shaped conductive film 125 is formed on the side surface of the upper layer contact hole 124. When the conductive film 165 is formed of either a titanium film or an N⁺ type silicon film, this etching-back is performed by the anisotropic etching using Cl₂ or HBr. The height of the ring-shaped conductive spacer 125 is about 400 nm. By these formation of the ring-shaped conductive film spacer 125, the cutting portions of the second wiring layers 118ab, 118ac, and 118ae by the upper layer contact hole 124 are connected again. At the time of the patterning of the second wiring layers, there is a method that the second wiring layers 118ab, 118ac, and 118ae near the lower layer contact hole 114a are previously removed. However, though the ring-shaped conductive film spacer 125 is formed after the second wiring layers are removed, the ring-shaped conductive film spacer 125 is not self-aligned with the second wiring layers 118ab, 118ac, and 118ae. In addition, in this case, the distance between the ring-shaped conductive film spacer 125 and the lower layer contact plug 117 cannot be defined directly.

At the selection of the composition materials of the foregoing conductive film 165 when the BPSG film 122 is included in the second interlayer insulating film, it must be considered that the BPSG film 122 is exposed in the side surface of the first upper layer contact hole 124. Specifically, if the ring-shaped conductive film spacer 125 formed by processing the conductive film 165 contacts directly with the BPSG film 122, the composition materials must be selected as well as the comparison to the composition materials of the lower layer contact plug, in order that problems of reliability are not produced. Therefore, in this case, it is not preferable that tungsten is included in the conductive film 165. In other words, when the second interlayer insulating film is formed of a stacked film in which a silicon nitride film is stacked on a silicon oxide film having a flat upper surface, it is possible to adopt a conductive film, as the foregoing second conductive film, including tungsten, if the comparison to the composition materials of the lower layer contact plug 117 is satisfied.

Next, a second upper layer contact hole 134 reaching the second wiring layer 118aa is formed by an anisotropic etching for the second interlayer insulating film using a photoresist film 171 as a mask (FIGS. 1, 2, 5c, 8c, and 11c). The photoresist film 171 covers the foregoing upper layer contact hole 124. The third diameter of the upper layer contact hole 134 is about 0.7 $\mu$m (=F+2A=1.75F), and it is set to be equal to an opening diameter (=about 1.0 $\mu$m–about 2 0.15 $\mu$m) at the bottom region of the upper layer contact hole 124, which is not covered with the ring-shaped conductive film spacer 125. An aspect ratio of the upper layer contact hole is about 0.8. In this application example, an upper layer contact hole 134 reaching the second lower layer contact hole 114b is not formed, however, in this embodiment, the second upper layer contact hole can be formed without any obstacle.

Figure 6A:
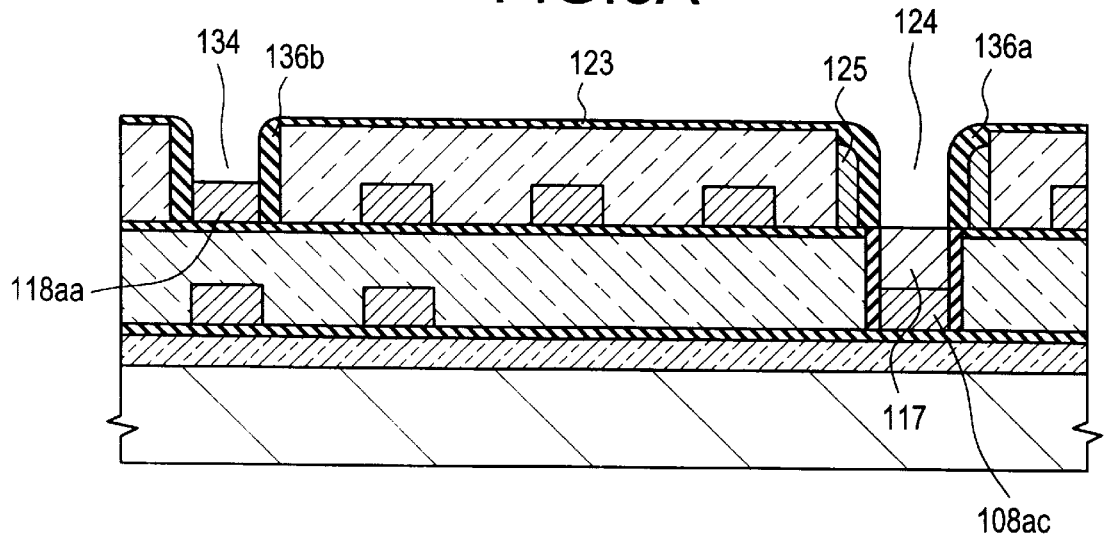
FIGS. 6a and 6b are schematic section views showing manufacturing steps of the first application example of the first embodiment of the present invention, namely.
Figure 9A:
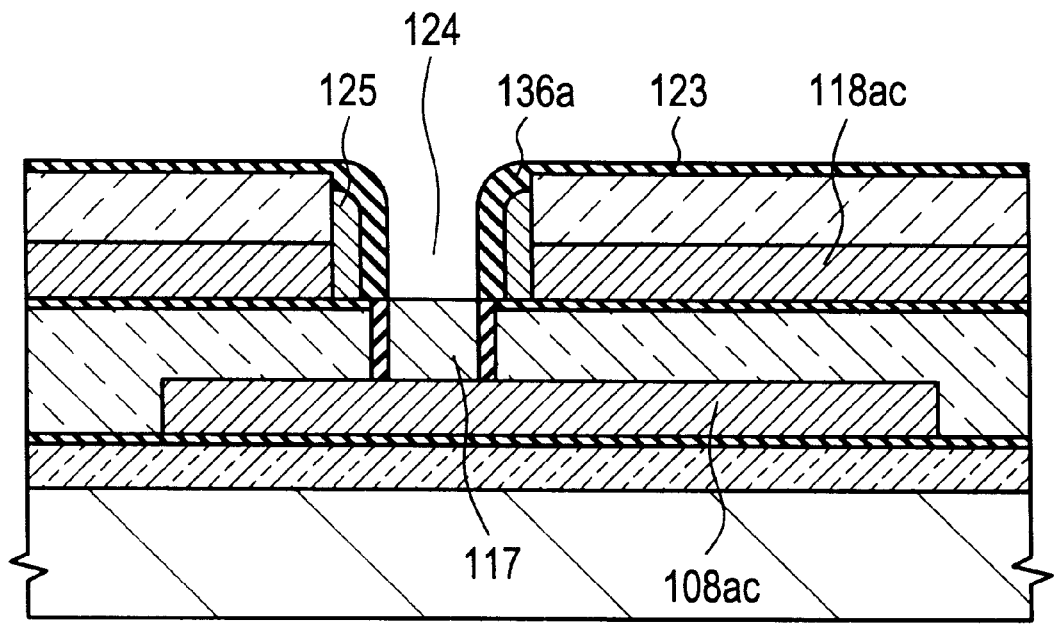
FIGS. 9a and 9b are schematic section views showing manufacturing steps of the first application example of the first embodiment of the present invention, namely.
Figure 9B:
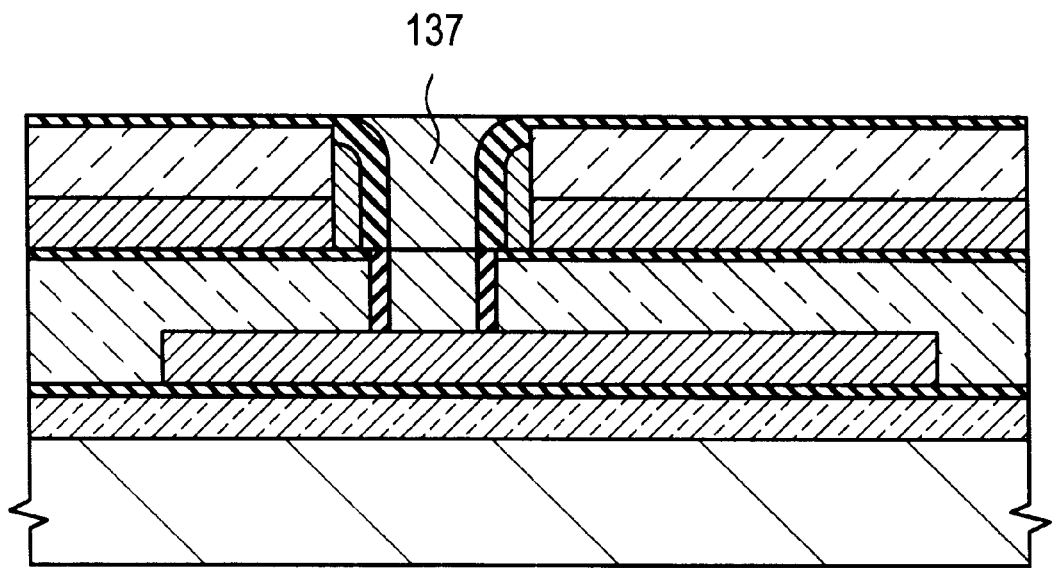
Figure 12A:
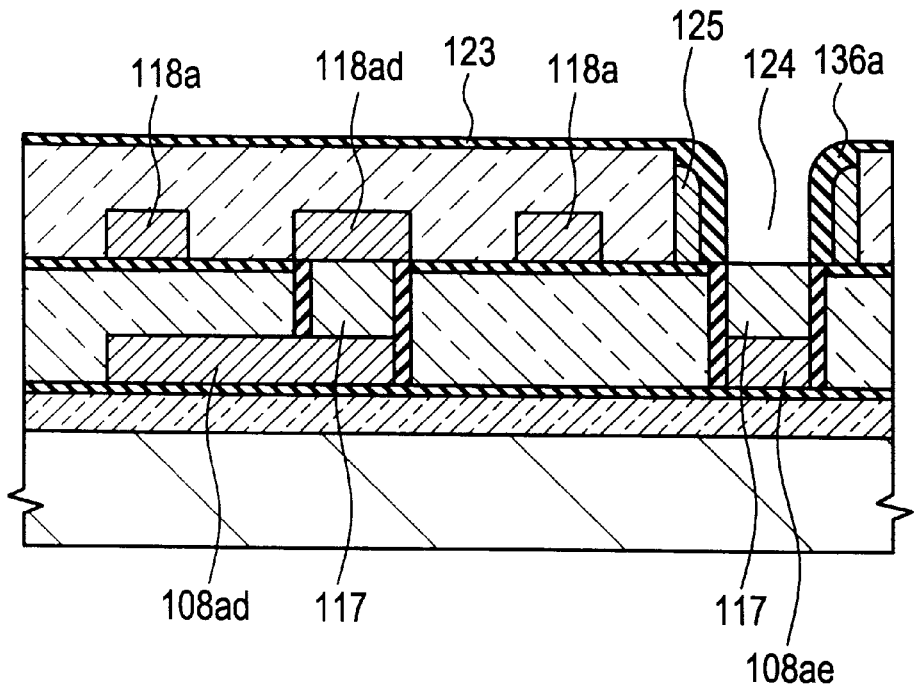
FIGS. 12a and 12b are schematic section views showing manufacturing steps of the first application example of the first embodiment of the present invention, namely.

After the foregoing photoresist film 171 is removed, a fourth silicon oxide film (not shown) of about 150 nm thick is formed on the entire surface of the resultant structure. This silicon oxide film should be an HTO film, too. Until the upper surface of the silicon nitride film 123 is exposed, this silicon oxide film is etched-back so that first and second silicon oxide film spacer 136a and 136b are formed on the side surfaces of the upper layer contact holes 124 and 134, respectively. At the time of the etching-back, the silicon nitride film 123 serves to function as a stopper against the etching (FIGS. 6a, 9a, and 12a).

When the second interlayer insulating film is formed by stacking a silicon nitride film on a silicon oxide film having a flat upper surface, there is no positive reason why a second silicon oxide film spacer is formed on the side surface of a second upper layer contact hole. In this case, a ring-shaped conductive film spacer is formed on the side surface of a first upper layer contact hole, a silicon oxide film is formed on the entire surface of the resultant structure, and a first silicon oxide film spacer is formed only on the first upper layer contact hole. Thereafter, a second upper layer contact hole may be formed by a photolithography step.

A third diameter of the second upper layer contact hole at this time may be at least about F.

Figure 6B:
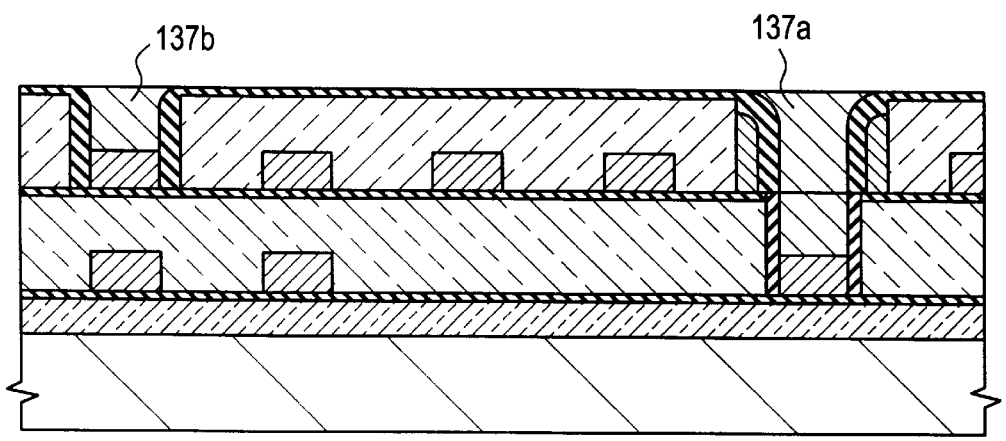
Figure 12B:
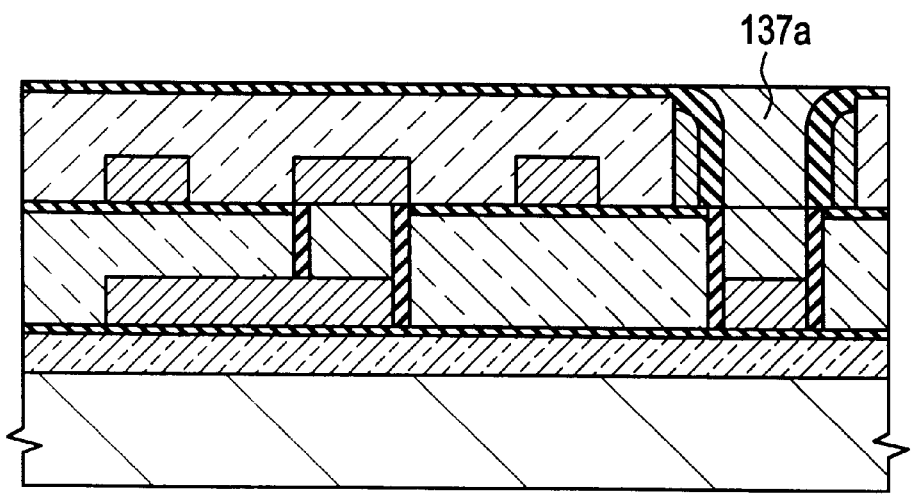

Next, a third conductive film of a predetermined thickness (not shown) is formed on the entire surface of the resultant structure. Until the upper surface of the silicon nitride film 123 is exposed, a CMP for the third conductive film is performed. The upper layer contact holes 124 and 134 are filled with first and second contact plugs 137a and 137b formed of the third conductive film, respectively. The silicon nitride film 123 functions to detect the final point of this CMP. Because of the existences of the silicon oxide film spacers 136a and 136b of about 150 nm wide, contacts of the respective upper layer contact plugs 137a and 137b with the BPSG film 122 can be avoided, and diffusions of the impurities from the BPSG film 122 to the upper layer contact plugs 137a and 137b can be suppressed. Also in this case, the etching-back as well as the CMP may be employed for the third conductive film (FIGS. 6b, 6b, and 12b).

Next, third wiring layers 138a and 138ab having the minimum line width of about 0.4 $\mu$m (=F) are formed on the surface of the second interlayer insulating film (FIGS. 1 and 2). The line widths of the third wiring layers 138aa and 138ab at the portions connected to the upper layer contact hole 124 are set to be about 1.2 $\mu$m (=diameter of the upper layer contact hole 124+2A). The line width of the third wiring layer 138aa at the portion connected to the upper layer contact hole 134 is set to be about 0.9 $\mu$m (=diameter of the upper layer contact hole 134+2A). However, these line widths are not limited to these values. When the determinations of these line width are not limited by combinations of the composition materials of the third wiring layer and the composition materials of the upper layer contact plug, the line widths at the upper layer contact holes 124 and 134 should be set as above. In this case, since the minimum interval of the third wiring layers is about F, the limitations that the upper layer contact hole 134 against the upper contact hole 124 can not be located at the position of the 1st.n.n., as well as at the position of second-nearest-neighbor; 2nd.n.n. are produced. Thus, the degree of freedom for the layout of the third wiring layer is decreased. In contrast with this, if the combination of the composition materials of the third wiring layer and the composition materials of the upper layer contact plug is limited similarly as in the case of the second wiring layer and the lower layer contact hole, it is possible to arrange the second upper layer contact hole against the first upper layer contact hole at the position of the 1st.n.n. The selection of any one of the above two combinations depends on wiring density required for the third wiring layer.

It is noted that in the first application example of this embodiment, the various kinds of composition materials and values are not limited to the foregoing ones.

According to the first application example of the foregoing first embodiment, the wiring layer provided on the surface of the first interlayer insulating film is avoided, the direct connection of the third wiring layer on the second interlayer insulating film to the first wiring layer covered with the first interlayer insulating film is performed by the lower layer contact plug and the first upper layer contact hole. The lower layer contact hole, which is formed in the first interlayer insulating film, fills the first lower layer contact hole reaching the first wiring layer. The first upper layer contact plug fills, through the silicon oxide film space, the first upper layer contact hole reaching the first lower layer contact hole formed in the second interlayer insulating film, and the upper surface of which is connected directly to the third wiring layer and the bottom surface of which is connected directly to the upper surface of the lower layer contact plug.

Furthermore, the first upper contact hole has a second diameter larger than a first diameter of the first lower contact hole, and is formed so as to separate the second wiring layer just above the first lower contact hole. The second wiring layer is connected to the first upper layer contact hole through the ring-shaped conductive film spacer.

The upper end of the ring-shaped conductive film spacer is disposed lower than the upper surface of the second interlayer insulating film, and the bottom surface thereof is connected only to the upper surface of the first interlayer insulating film. The ring-shaped conductive film spacer is covered with the silicon oxide film spacer. In a multilayer wiring structure of this embodiment, the contact hole in the second interlayer insulating film, which connects the first and third wiring layers, is not provided at the position where the second wiring layer does not exist, i.e., between the adjacent two second wiring layers, but it is provided, as the first upper layer contact hole having the foregoing structure, at the position where it crosses the second wiring layer. The first upper layer contact hole can be realized, without making the line width of the second wiring layer locally thin, reducing the effective section area of the contact plug, and broadening the wiring interval of the second wiring layers.

As a result, by adopting the multilayer wiring structure of this embodiment, the second wiring layer is avoided, and when the first and third wiring layers are connected, it is possible to suppress an increase in the contact resistivity without sacrificing micronization and reducing migration resisting property.

In a manufacturing method of the multilayer wiring structure of the semiconductor device according to the first application example of the first embodiment, upper and lower layer contact holes having an aspect ratio which is not so high are formed in first and second interlayer insulating films thereby connecting third and wiring layers directly. Therefore, in the manufacturing method according to the first application example of this embodiment, though the number of manufacturing steps is increased actually, an effectiveness for the formation of the contact holes is increased as well as an advancement of micronization.

Figure 13A:
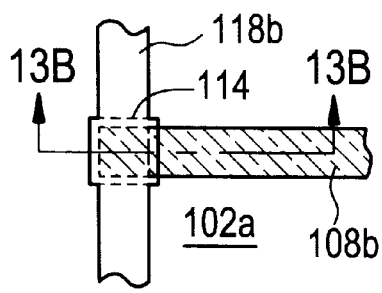
FIGS. 13a and 13b are a schematic plan view and a schematic section view for explaining a second application example of the first embodiment of the present invention.
Figure 13B:
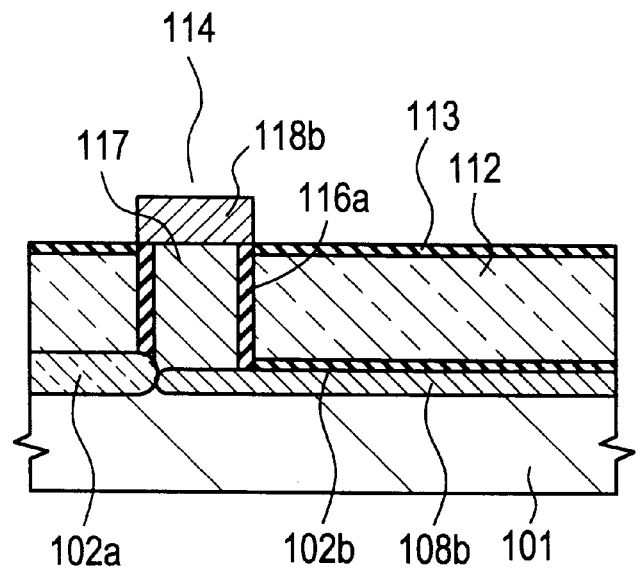

Referring to FIG. 13a which is a schematic plan view showing a main portion of the multilayer wiring structure used in semiconductor devices, and FIG. 13b which is a schematic section view taken along the line X—X of FIG. 13a, when a diffusion layer formed on the surface of a semiconductor substrate as a first wiring layer is included, the multilayer structure to which the foregoing first embodiment is applied (hereinafter referred to as a second application example of the first embodiment) is as follows.

A field oxide film 102a is formed in an element isolation region on the surface of the silicon substrate 101. A gate oxide film 103b is formed in an element formation region on the surface of the silicon substrate 101. A first wiring layer is composed of a diffusion layer 108b formed in the element formation region on the surface of the silicon substrate 101. The diffusion layer is an opposite conductive type to that of the substrate 101. The surfaces, including the diffusion layer 108b, of the field oxide film 102a and the gate oxide film 102b are covered with a first interlayer insulating film. The first interlayer insulating film is composed of a BPSG film 112 having a flat upper surface and a silicon nitride film 113 covering the BPSG film 112. In the first interlayer insulating film, a lower layer contact hole 114 is formed, which reaches the diffusion layer 108b. A silicon nitride film spacer 116a having a width of about A is formed on the side surface of the lower layer contact hole 114. The lower layer contact hole 114 is filled with a lower layer contact plug 117. The width of the lower layer contact plug 117 is about F. A second wiring layer 118b having the minimum line width of about F is formed on the surface of the first interlayer insulating film. The second wiring layer 118b is connected to the diffusion layer 108b thorough the lower layer contact plug 117 which fills the lower layer contact hole 114. The minimum width of the diffusion layer 108b is about F which is minimum processing dimension. The diameter of the lower contact hole 114 is about (F+2A).

When the first wiring layer is composed of only the diffusion layer 108b, a lower insulating film can not be defined. Since the diameter of the lower contact hole 114 is larger than the minimum width of the diffusion layer 108b, when the lower layer contact hole 114 is formed, the field oxide film 102a near the diffusion layer 108b is etched to some degree, severe obstacles are not produced.

Figure 14A:
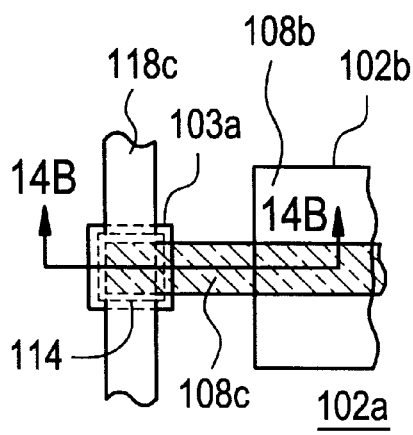
FIGS. 14a and 14b are a schematic plan view and a schematic section view for explaining a third application example of the first embodiment of the present invention.
Figure 14B:
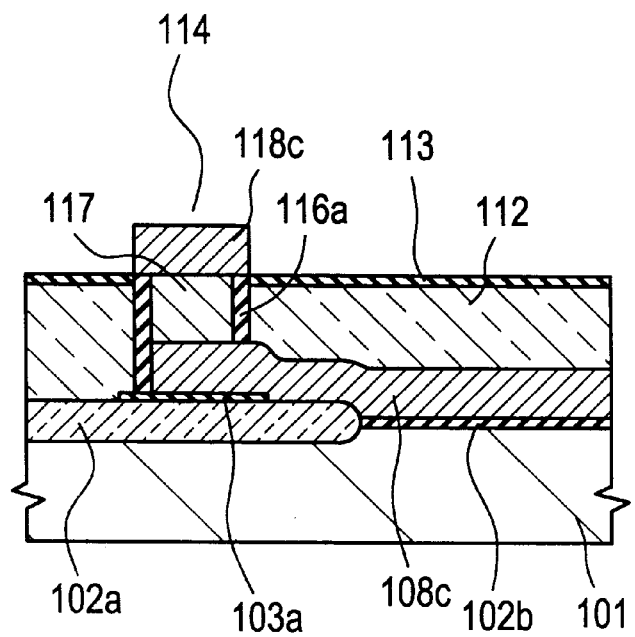

Referring to FIG. 14a which is a schematic view showing a main portion of the multilayer wiring layer used in semiconductor devices, and FIG. 14b which is a schematic section view taken along the line X—X of FIG. 14a, if a gate electrode is included in a first wiring layer, a manufacturing method until a second wiring layer is formed is described as follows, when the manufacturing method of the foregoing first embodiment is applied to the multilayer structure of the present invention (referred to as a third application example of the first embodiment).

First of all, a pad oxide film (not shown) is formed on the surface of a silicon substrate 101 of a predetermined conductivity type by a thermal oxidation, and a silicon nitride film (not shown) covering the silicon nitride film is formed. The silicon nitride film is patterned, and the silicon nitride film is left on an element formation region in the surface of the silicon substrate 101. A field oxide film 102a is formed in the element isolation region on the surface of the silicon substrate 101 by a selective oxidation using the residual silicon nitride film as a mask. After the residual silicon nitride film is removed, a silicon nitride film of 50 nm thick (not shown) is formed on the entire surface of the resultant structure. The silicon nitride film is patterned, and the silicon nitride film 103a is left only on the field oxide film 102a which is a region where the lower layer contact hole will reach. One side of the silicon nitride film 103a is about 0.8 μm (F+2A=2F). After the exposed pad oxide film is removed, a gate oxide film 102b is formed in the element formation region on the surface of the silicon substrate 101 by thermal oxidation.

Subsequently, a gate electrode 108c having a minimum line width (gate length) of about F is formed as a first wiring layer. The gate electrode 108c traverses the surface of the gate oxide film 102b, and it extends on the surface of the field oxide film 102a. The gate electrode 108c reaches the surface of the silicon nitride film 103a. In this application example, the field oxide film 102a, the gate oxide film 102b, and the silicon nitride film 103a can be regarded as a foundation insulating film. A diffusion layer 108b is formed in an element formation region on the surface of the silicon substrate 101 by an ion injection of an opposite type impurities to that of the substrate 101 using the gate electrode 108c as a mask.

Next, in the similar manner to the first application example of the first embodiment, a first interlayer insulating film composed of an HTO film (not shown), a BPSG film 112, a silicon nitride film 113 is formed. According to the similar manufacturing method to the first application example, a lower layer contact hole 114 is formed in the first interlayer insulating film. A lower layer contact hole 114 reaches the gate electrode 108c on the surface of the silicon nitride film 103a. A lower layer contact hole 114 has a silicon nitride film spacer 116a on its side surface, and is filled with a lower layer contact plug 117. The diameter of the lower layer contact hole 114 is about 0.6 μm (F+2A), and the bottom portion of the lower layer contact hole 114 never protrudes from the outside of the silicon nitride film 103a one side of which is about (F+4A). Therefore, it can be avoided that the field oxide film 102a near the gate electrode 102c is etched. In this application example, it is impossible to cover the entire surface of the field oxide film 102a with the silicon nitride film self-aligning with the gate electrode 102b. Furthermore, the lower layer contact hole 114 reaching the gate electrode 108c should be in general formed at a portion other than a channel region. Thereafter, a second wiring layer 118c having the minimum line width of about F is formed on the surface of the first interlayer insulating film.

Figure 15A:
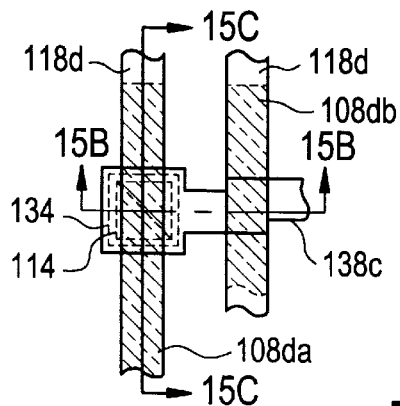
FIGS. 15a, 15b and 15c are a schematic plan view and schematic section views for explaining a fourth application example of the first embodiment of the present invention.
Figure 15B:
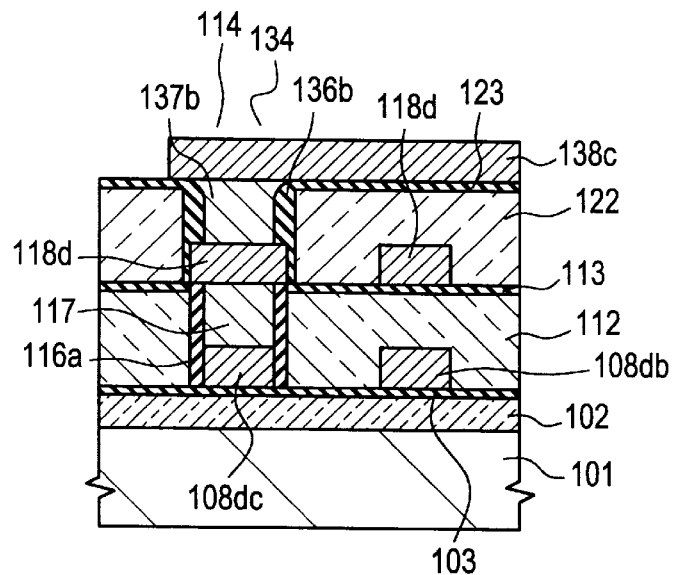
Figure 15C:
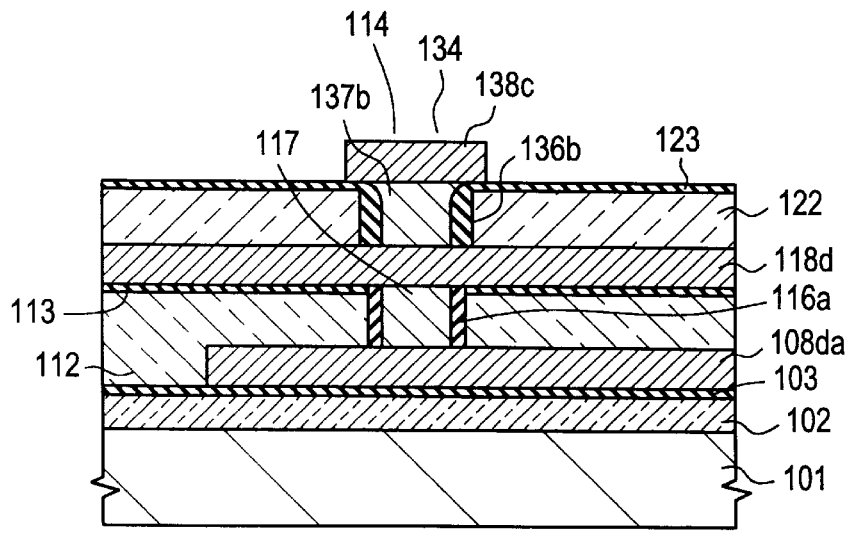

Referring to FIG. 15a which is a schematic plan view showing a major portion of a multilayer wiring structure used in semiconductor devices, FIG. 15b which is a schematic section view taken along the line X—X of FIG. 15a, and FIG. 15c which is a schematic section view taken along the line Y—Y of FIG. 15a, in the first embodiment, it is possible to provide an upper layer contact hole at a portion just above the lower layer contact hole. This is referred to as a fourth application example of the first embodiment.

The surface of a silicon substrate 101 is covered with a foundation insulation film composed of a silicon oxide film 102 and a silicon nitride film 103, and on the surface of the foundation insulating film, first wiring layers 108da and 108db and the like are formed which have a minimum line width of about 1.0 μm (=F). The wiring pitch of the first wiring layers is about 1.0 μm (=2F+2A). Similarly to the first application example of this embodiment, the first wiring layer is covered with a first interlayer insulating film composed of a BPSG film 112 and a silicon nitride film 113. In the first interlayer insulating film, a lower layer contact hole 114, which reaches, for example, the first wiring layer 108da, is formed. On the surface of the lower layer contact hole 114, a silicon nitride film spacer 116a having a width of about 100 nm (=A) is formed. The lower layer contact hole 114 is filled with a lower layer contact plug 117, and the diameter of the lower layer contact hole 114 is about 0.6 μm (=F+2A=1.5F).

On the surface of the first interlayer insulating film, a second wiring layers 118da and 118db and the like are formed, the minimum line width of which is 0.4 μm (=F). A wiring pitch of the second wiring layers 118da and 118db and the like is about 1.0 μm (=F+2A). For example, the second wiring layer 118ad is connected to the first wiring layer 108da through the lower contact hole 114. The combination of the composition materials of the second wiring layers and the composition materials of the lower layer contact plug are limited similarly as in the case of the first application example of this embodiment. The line width of the second wiring layer 118da at the portion directly connected to the lower layer contact hole 114 is set to be about 0.6 μm. However, the line width of the second wiring layer 119da is not limited to the above value similarly as in the case of the first application example of this embodiment.

Similar to the first application example of this embodiment, the second wiring layers are covered with a second interlayer insulating film composed of an HTO film (not shown), a BPSG film 122, and a silicon nitride film 123. In the second interlayer insulating film, a second upper layer contact hole 134 which reaches, for example, the second wiring layer 118da, is formed at the position just above the lower layer contact hole 114. A second silicon oxide film spacer 136b similar to the first application example is formed on the side surface of the upper layer contact hole 134. The upper layer contact hole 134 is filled with a second upper contact plug 137b through the silicon oxide film spacer 136b. Similar to the first application example, the diameter of the upper contact hole is about 0.7 μm, and the width of the silicon oxide film spacer 136b is about 150 nm. On the surface of the second interlayer insulating film, a third wiring layer 138c and the like are formed having the minimum line width of 0.4 μm (=F). When there is no limitation in the combination of the composition materials of the second wiring layer and the composition materials of the lower layer contact plug as in the case of the first application example, the line width of the third wiring layer at the position, where it is connected directly to the upper layer contact hole 134, is about 0.9 μm. There is such limitation, the width of the third wiring layer may be about 0.4 μm (=F).

The application examples of the foregoing first embodiment concerns the multilayer wiring structure of the semiconductor devices including the CMOS transistor as a semiconductor element and the manufacturing method of the same. The application examples of this embodiment is not limited to this, for example, the application examples of this embodiment will be applicable to a multilayer wiring structure of semiconductor devices including other semiconductor elements as, for example, a BiCMOS transistor and a manufacturing method of the same without any obstacles.

Figure 16:
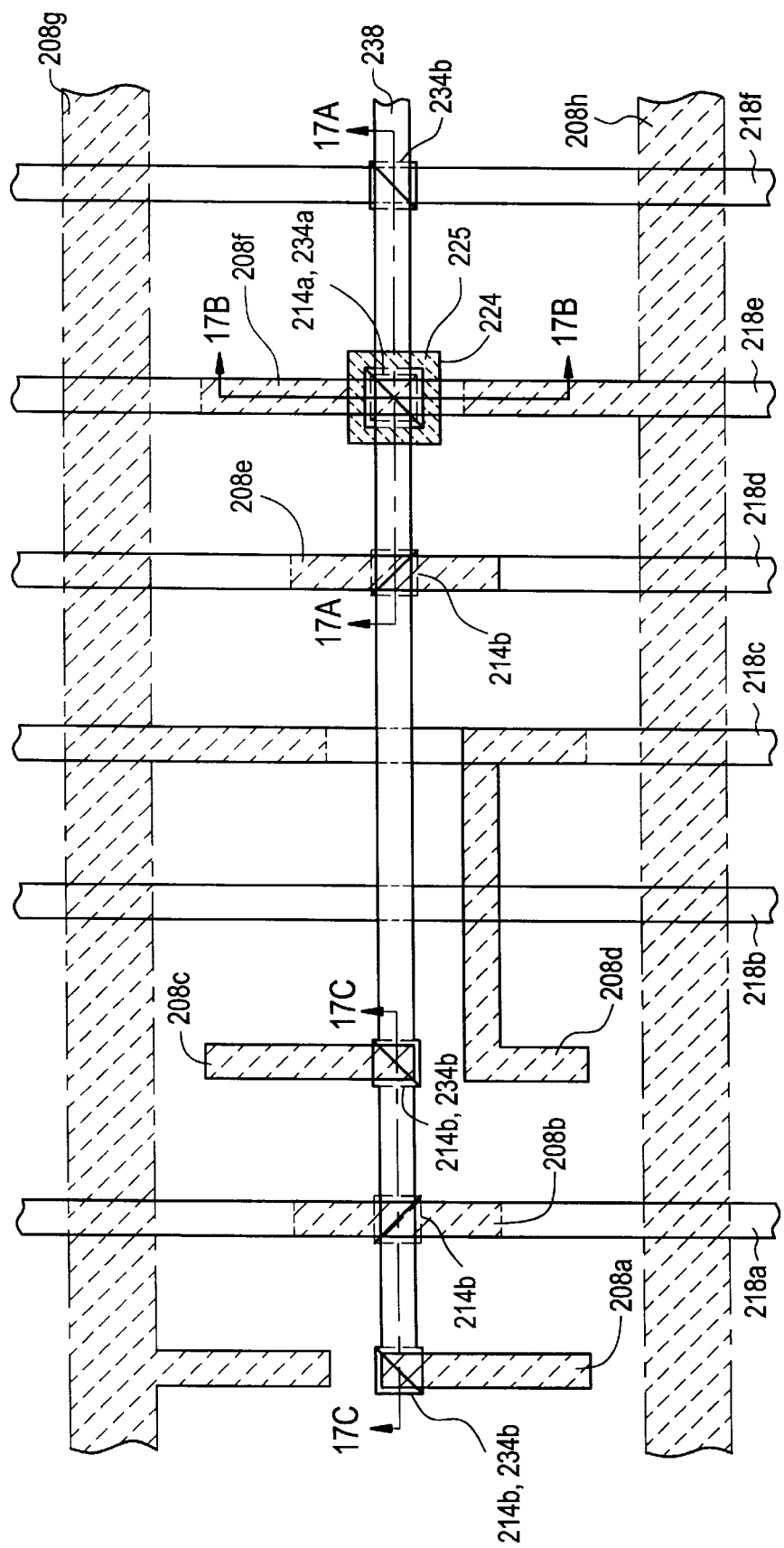
FIG. 16 is a schematic plan view of an application example of a second embodiment of the present invention.
Figure 17A:
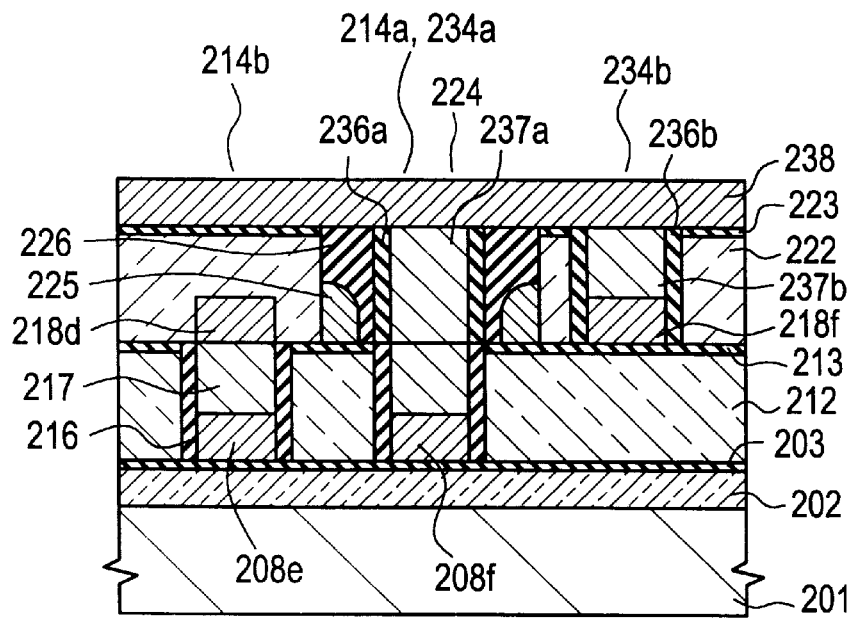
FIGS. 17a, 17b and 17c are schematic section views of an application example of the second embodiment, namely.
Figure 17B:
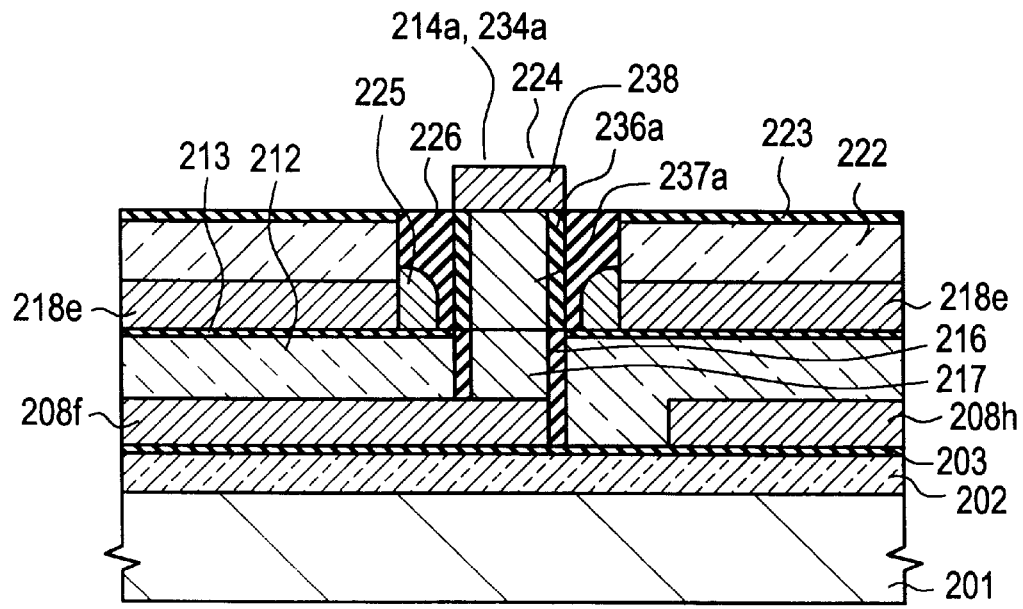
Figure 17C:
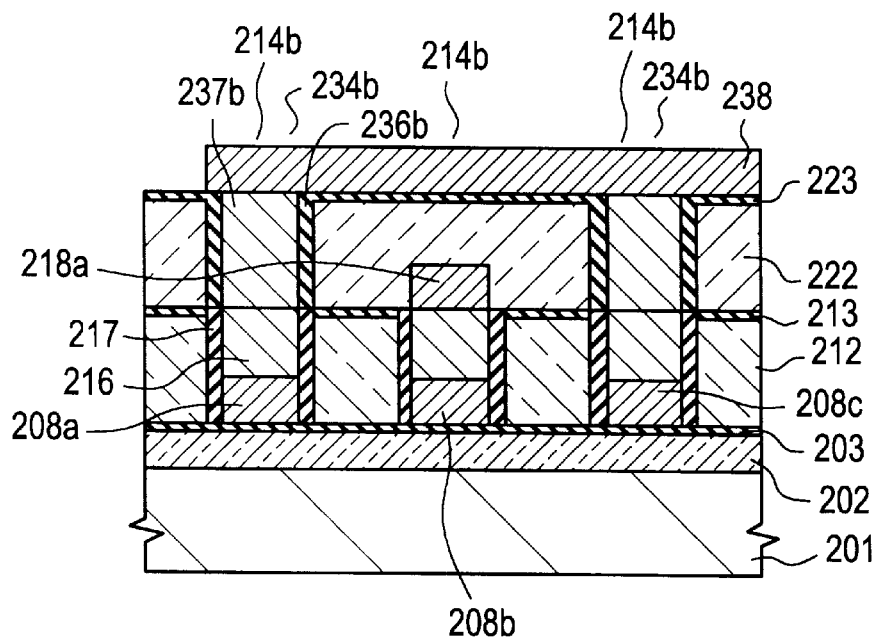
Figure 18:
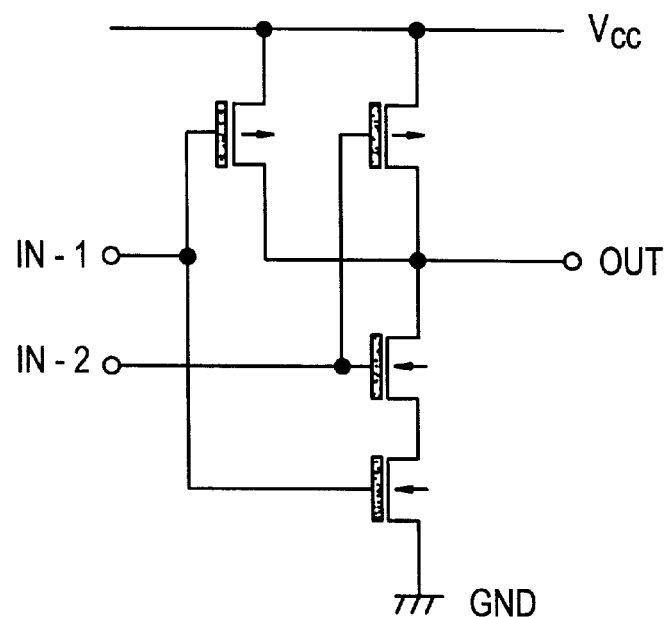
FIG. 18 is a circuit diagram for explaining an application example of the second embodiment of the present invention.

Referring to FIG. 16 which is a schematic plan view of a multilayer wiring structure used in semiconductor devices, FIGS. 17a, 17b, and 17c which are schematic section views taken along the lines A—A, B—B, and C—C of FIG. 16, respectively, and FIG. 18 which is a circuit diagram, when a second embodiment of the present invention is applied to a two-input NAND circuit composed of CMOS transistors (referred to as an application example of a second embodiment), a multilayer wiring structure is different from the constitution of the first embodiment, concerning the structure and the manufacturing method of the foregoing first and second upper layer contacts. For the convenience of understanding, in FIG. 16, a first wiring layer and a ring-shaped conductive film spacer are hatched, and in FIGS. 16 and 17, illustrations of a transistor, i.e., source and drain regions and a gate electrode are omitted.

The application example of the second embodiment will be described, assuming that this multilayer wiring structure is also composed of three wiring layers defined by 0.4 μm design rule, the minimum processing dimension F is 0.4 μm, and the alignment margin A is 0.1 μm (=0.25F). First wiring layers 208a to 208h and the like are formed on the surface of a silicon substrate 201 of a predetermined conductivity type through a foundation insulating film which is formed by stacking a silicon nitride film 203 of 50 nm thick on a silicon oxide film 202. Also in this embodiment, the constitution of the foundation insulating film is not limited to the foregoing one. When the multilayer wiring structure includes CMOS transistors, the bottom surface of the foundation insulating film may be formed of at least a silicon oxide film. The first wiring layers 208a to 208h and the like are formed of a film in which a titanium nitride film is stacked, for example, on either a titanium silicide film or a titanium film. The minimum line width of the first wiring layers 208a to 208h and the like is about 0.4 μm (=F), and their thickness is about, for example, about 200 nm (=0.5F). The minimum interval of the first wiring layers 208a to 208h and the like is, for example, 0.6 μm (=F+2A=1.5F). The wiring pitch of the first wiring layers is about 1.0 μm (=F+2A=2.5F). Also in the case where the constitution of this embodiment includes either a diffusion layer or a gate electrode in the first wiring layer, the similar fact to the first embodiment will be applied to this embodiment. The composition materials of the first wiring layers in this embodiment are not limited to the foregoing titanium silicide film and the like.

The first wiring layers 208g and 208h corresponds to a power source Vcc and a ground wiring GND, and are connected to a P$^+$ type source diffusion layers of two P channel MOS transistors, and an N$^+$ type source diffusion layer of an N channel MOS transistor connected to an input signal line IN-2. The wiring layer 208a is connected to an N+ type drain diffusion layer of an N channel MOS transistor which is connected to an input signal line IN-1. The wiring layer 208b is connected to gate electrodes of N and P channel MOS transistors which are connected to the input signal line IN-1. The first wiring layer 208c is connected to a P+ type drain diffusion layer of the P channel MOS transistor which is connected to the input signal line IN-1. The first wiring layer 208d is connected to an N+ type source diffusion layer of the N channel MOS transistor connected to the input signal line IN-1 and an N+ type drain diffusion layer of the N channel MOS transistor connected to the input signal line IN-2. The first wiring layer 208e is connected to the gate electrodes of the N and P channel MOS transistors connected to the input signal line IN-2. The first wiring layer 208f is connected to a P+ type drain diffusion layer of the P channel MOS transistor connected to the input signal line IN-2.

The first wiring layers 208a to 208h and the like are covered with a first interlayer insulating film. The first interlayer insulating film is composed of a firs silicon oxide film (not shown) which is formed of an HTO film of about 50 nm thick covering directly the first wiring layers 208a to 208h and the like, a first BPSG film 212 covering the first silicon oxide film, and a first silicon nitride film 213 of about 50 nm thick covering the BPSG film. The upper surface of the BPSG film 212 is flattened, and the thickness of the BPSG film 212 at the portion just above the first wiring layers 208a to 208h and the like is about 250 nm thick.

In the first interlayer insulating film, first and lower layer contact holes 214a and 214b are formed, which reach the first wiring layer 208f, and the first wiring layers 208a, 208b, 208cm, and 208e, and the like, respectively. The diameters of the first and second lower layer contact holes 214a and 214b are smaller than the minimum line widths of the respective first wiring layers, for example, about 0.6 μm (=F+2A). Therefore, in this case, the minimum interval of the lower layer contact holes is about F. The side surfaces of the first and second lower layer contact holes are covered with first silicon nitride film spacers 216. The respective width of the silicon nitride film spacers 216 is about, for example, 100 nm (=A), and the upper ends of the silicon nitride film spacers 216 are flat surfaces which accord with the upper surface of the foregoing silicon nitride film 213. The first and second lower layer contact holes 214a and 214b are filled with lower layer contact plugs 217 composed of the same material as the first embodiment, respectively. One side of the plugs 217 is about F. The upper surfaces of the contact plugs 217 agree almost with the upper surface of the silicon nitride film 213, and are approximately flat. The contact area of the lower contact plug 217 and the first wiring layer is at least about $F^2$.

Similar to the foregoing first embodiment, the constitution of the first interlayer insulating film is not limited to the foregoing one, but the constitution that a silicon nitride film is stacked on a silicon oxide film may be adopted. The diameters of the first and second lower layer contact holes more than about F will do well.

On the surface of the first interlayer insulating film, second wiring layers 218a to 218f and the like are formed. The minimum line width and the wiring pitch of the second wiring layers 218a to 218f and the like are about 0.4 μm (=) and about 1.0 μm (=2F+2A=2.5F). The film thickness of the second wiring layers 218a to 218f and the like is about 200 nm. The composition materials of the second wiring layers are the similar to those of the first embodiment. The second wiring layers 218a to 218f and the like are covered with a second interlayer insulating film. The second interlayer insulating film is formed of a stacked film which is composed of a second silicon oxide film (not shown), a second BPSG film 222, and a second silicon nitride film 223 of about 50 nm. The second silicon oxide film is formed of an HTO film of about 50 nm thick. The upper surface of the BPSG film 222 is flattened. The film thickness of the BPSG film 222 just above the second wiring layers 218a to 218f and the like is, for example, about 250 nm. In the second interlayer insulating film, first and second upper layer contact holes 224 and 234 are formed. The first upper layer contact hole 224 reaches the first contact hole 214a, and the second upper layer contact hole 234 reaches either the lower contact hole 214 or the second wiring layer 218e. The second lower contact hole 214 reaches the first wiring layer 208a, for example. The second diameter of the first upper layer contact hole 224 is, for example, 1.2 μm (=2F+4A= 3.0F), and the diameter of the second upper layer contact hole 234 is about 0.6 μm which is equal to the first diameter of the lower layer contact holes 214a and 214b. In this embodiment, the line width of the second wiring layers 218d and 218f at the portion adjacent to the first upper layer contact hole 224 and at the portion connected to the lower contact hole 214b should be about 0.4 μm (=F). With such constitution, the interval between the upper layer contact hole 224 and the respective second wiring layers 218d and 218f is about 0.2 μm (=2A).

The second wiring layer 218a corresponds to the input signal line IN-1 of the foregoing two-input NAND, and is connected to the first wiring layer 208b through the lower layer contact hole 214b. The second wiring layer 218d corresponds to the input signal line IN-2 of the two-input NAND, and is connected to the first wiring layer 208e through the lower contact hole 214b. The second wiring layer 218f corresponds to an output line OUT of the two-input NAND.

The second wiring layers 218b, 218c, and 218e are not connected to the two-input NAND, but is connected to other circuits (not shown). The second wiring layer 218e has a shape which is separated by the first upper layer contact hole 224 at the position just above the first lower contact hole 214a, and the portion separated by the contact hole 224 is connected by a ring-shaped conductive film spacer 225 formed on the side surface of the first upper layer contact hole 224. The ring-shaped conductive film spacer 225 is constituted of the similar materials to those of the first embodiment, the width of which is, for example, 200 nm. The height of the spacer 225 is, for example, is 300 nm. As to the first upper layer contact hole 224 which reaches the first lower layer contact hole 214a connected to the first wiring layer 208f, since the interval between the first upper layer contact hole 224 and the second wiring layers 218d and 218f adjacent to the contact hole 224 is about 0.2 μm as described above, which is much larger compared to A, the ring-shaped conductive film spacer 225, which is formed on the side surface of the upper layer contact hole 224, can be separated insulatively from the second wiring layers 218d and 218f, sufficiently.

Also in this embodiment, similar to the first embodiment, a silicon nitride film spacer having an ordinary section shape different from that of the first silicon nitride film spacer 216 may be adopted, on behalf of the spacer 216. In this case, considering an alignment discrepancy, in the worst case, it is necessary to provide an interval between the ring-shaped conductive film spacer 225 and the second wiring layers 218d and 218f of 50 nm (an average value of 150 nm (=1.5A)). For example, if the diameter of the first upper layer contact hole 224 is broadened to about 1.3 μm, the diameter of the lower contact hole 214a is reduced to about 0.5 μm, and the width of the lower portion of the silicon nitride film spacer in behalf of the spacer 216 is set to be about 50 nm, this will be possible.

In the upper layer contact hole 224, a silicon oxide film spacer 226 formed of a third silicon oxide film is formed, and an opening 234a is formed in this silicon oxide film. The silicon oxide film spacer 226 covers the ring-shaped conductive film spacer 225, and the upper surface of the spacer 226 is a flat plane which is in accordance with the upper surface of the silicon nitride film 223. The opening 234a reaches first lower layer contact hole 214a, and its diameter is about 0.6 μm which is equal to those of the lower layer contact holes 214a and 214. The widths of the silicon oxide film spacer 226 at the bottom portion of the upper layer contact hole 224 and at the upper end of the contact hole 224 are about 100 nm (=A) and about 300 nm (=3A), respectively. The side surfaces of the opening 234a and the second upper layer contact hole 234b are covered with second silicon nitride film spacers 236a and 236 which have the widths of about 100 nm (=A). Section shapes of the spacers 236a and 236b are the same as that of the first silicon nitride film spacer 216, and the upper surfaces of the spacers 236a and 236b are flat planes which are in accordance with the upper surface of the silicon nitride film 223. The opening 234a and the second upper layer contact holes 234b are covered with first and second upper layer contact plugs 237a and 237b interposing the second silicon nitride film spacers 236a and 236b. The upper surfaces of the upper layer contact plugs 237a and 237b are almost in accordance with the upper surface of the silicon nitride film 223, and they are almost flat.

Also in this embodiment, similar to the first embodiment, a second interlayer insulating film may be formed by a film which is constituted by stacking a silicon nitride film on a silicon oxide film having a flat upper surface. In this case, the silicon nitride film spacer on the side surfaces of the opening and the second upper layer contact hole is not always necessary, and the diameters of the opening and the second upper layer contact hole may be more than F.

On the surface of the second interlayer insulating film, a third wiring layer 238 is formed of about 200 nm thick having a minimum line width of about 0.4 μm (=F). The third wiring layer 238 is connected to the first wiring layer 208a, which is connected to the N+ type diffusion layer of the N channel MOS transistor connected to the input signal line IN-1, through a pair of the upper and lower contact holes 234b and 214b. The third wiring layer 238 is connected to the first wiring layer 208f, which is connected to the P+type drain diffusion layer of the P channel MOS transistor connected to the input signal line IN-2, through a pair of the opening 234a and the lower layer contact hole 214a. The third wiring layer 238 is connected to the second wiring layer 218f, which corresponds to the output signal line OUT, through the upper layer contact hole 234b. The line width of the third wiring layer 238, at the portion where the layer 238 is connected to the opening 234a and the upper layer contact hole 234b, is equal to the diameters of the opening 234a and the upper layer contact hole 234b. If the combination of the composition materials of the third wiring layer 238 and the composition materials of the upper layer contact plug 237a is restricted as in that of the composition materials of the second wiring layer and the composition materials of the lower layer contact plug, the line width of the third wiring layer 238, at the portion where the layer 238 is connected to the opening 234a and the upper layer contact hole 234b, can be set to be about 0.4 μm (=F).

For example, a second wiring layer, which is not connected to the two-input NAND shown in FIG. 18, may be further arranged between the second wiring layer 218a and the second wiring layer 218b. However, the reason why such second wiring layer is not arranged is to show the possibility of the connection of the first and third wiring layers by connecting directly the second upper layer contact hole and the second lower layer contact hole without interposing a dummy second wiring layer even at the position where it is not necessary to avoid the second wiring layer.

Figure 19A:
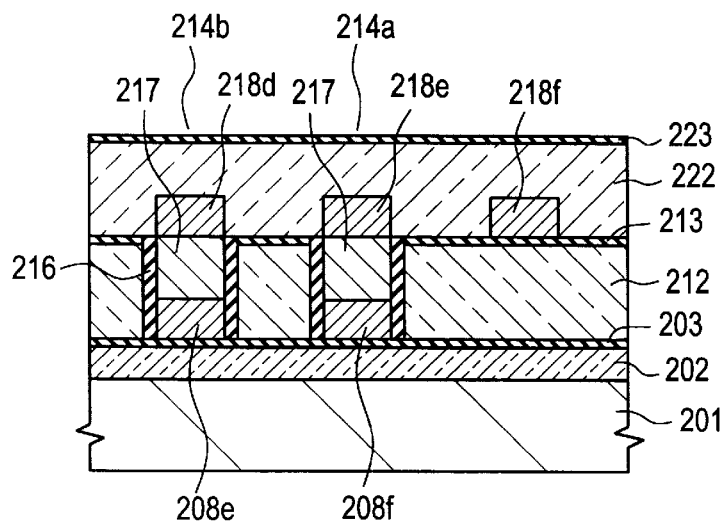
FIGS. 19a, 19b and 19c are schematic section views showing manufacturing steps of an application example of the second embodiment of the present invention, namely.
Figure 19B:
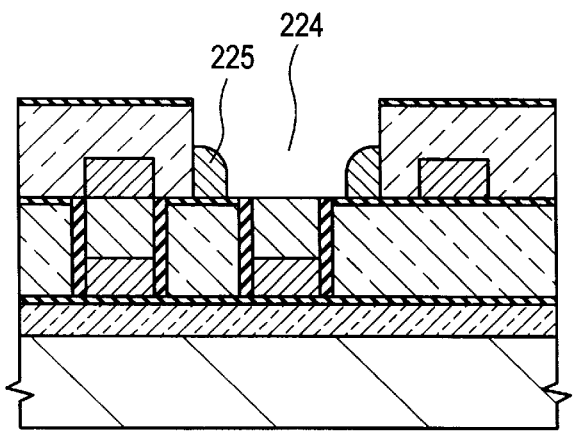
Figure 19C:
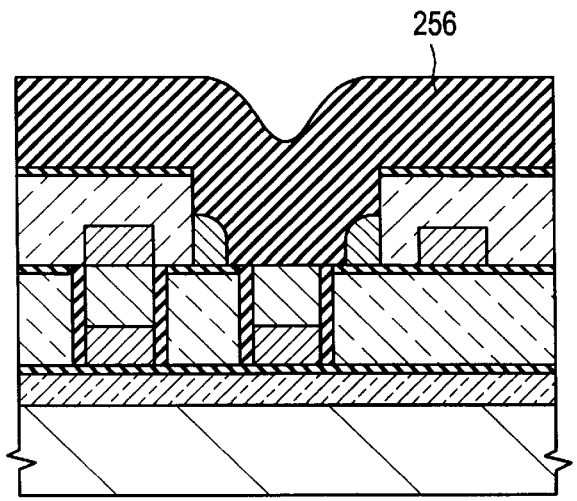
Figure 20A:
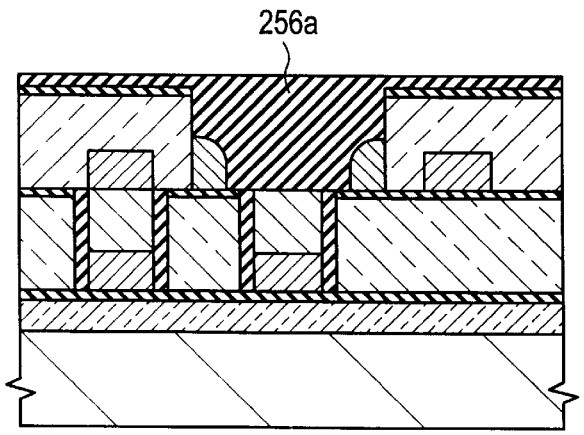
FIGS. 20a, 20b and 20c are schematic section views showing manufacturing steps of an application example of the second embodiment of the present invention, namely.

Referring to FIGS. 16 and 17; FIGS. 19 and 20 which are schematic section views taken along the line A—A of FIG. 16, showing main manufacturing steps; FIGS. 21 and 22 which are schematic section views taken along the line B—B of FIG. 16, showing the main manufacturing steps; and FIGS. 23 and 24 which are schematic section views, showing the main manufacturing steps, the multilayer wiring structure of the application example of the second embodiment is manufactured as follows.

First of all, from the formation of the foundation insulating film composed of the silicon oxide film 202 and a silicon nitride film 203; the formation of the first wiring layers 208a to 208h and the like; the formation of the first interlayer insulating film composed of the first silicon oxide film (not shown) formed of an HTO film of about 50 nm thick covering the first wiring layers 208a to 208h and the like, the first BPSG film 215, and the first silicon nitride film 213 of about 50 nm thick; the formation of the second silicon oxide film (not shown); the formation of the first and second lower layer contact holes; and the formation of the first silicon nitride-film spacer 216 and the lower layer contact plug 217 by the film growth and processing of the second silicon nitride film (not shown) and the first conductive film (not shown) are performed similarly to the manufacturing method of the first application example, including the composition materials, of the first embodiment.

Subsequently, the second wiring layers 218a to 218f and the like are formed on the first interlayer insulating film. The composition materials of the second wiring layers 218a to 218f are the same as those of the second wiring layers of the first application example of the first embodiment. In this stage, the second wiring layer 218e is connected to the first lower layer contact hole 214a. The line widths of the second wiring layers, for example, the second wiring layers 218d and 218f, at the portion adjacent to the region where the first upper layer contact hole is to be formed, are set to be about the minimum processing dimension F.

Figure 21A:
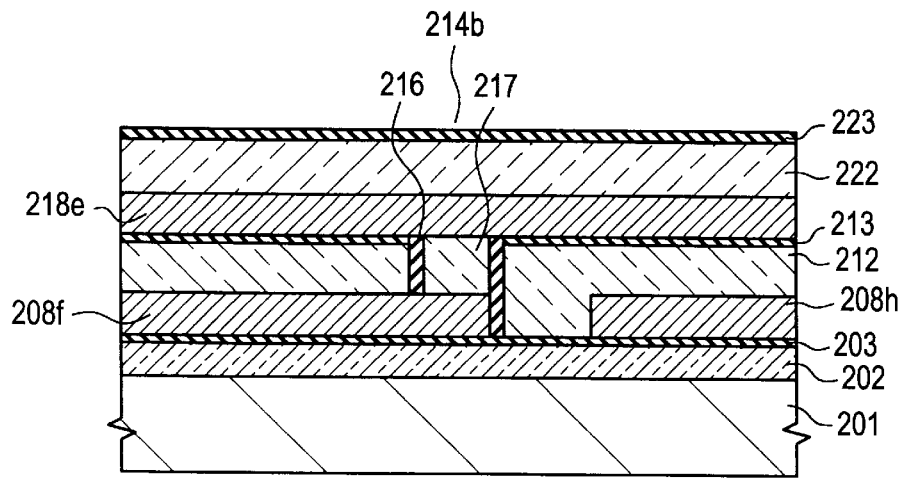
FIGS. 21a, 21b and 21c are schematic section views showing manufacturing steps of an application example of the second embodiment of the present invention, namely.
Figure 22A:
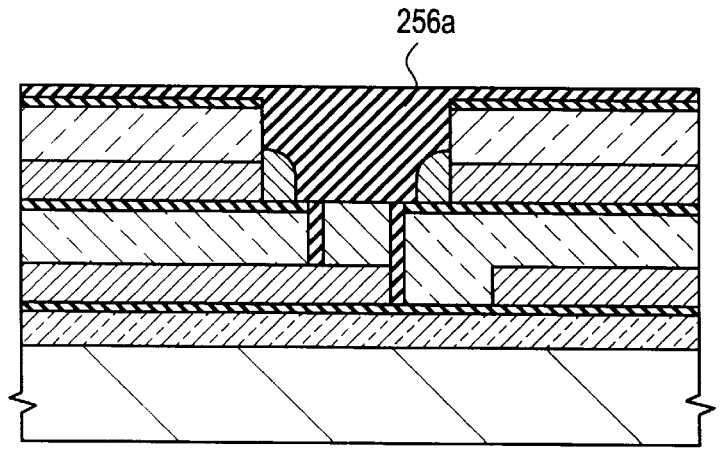
FIGS. 22a, 22b and 22c are schematic section views showing manufacturing steps of an application example of the second embodiment of the present invention, namely.
Figure 23A:
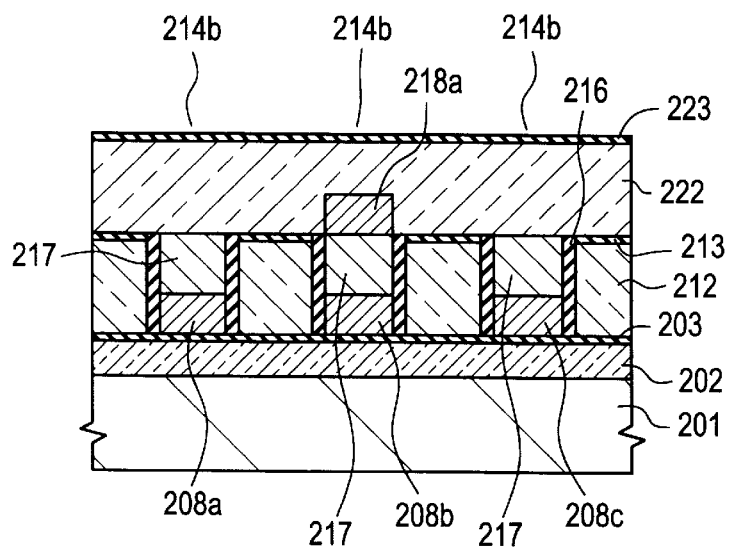
FIGS. 23a, 23b and 23c are schematic section views showing manufacturing steps of an application example of the second embodiment of the present invention, namely.
Figure 24A:
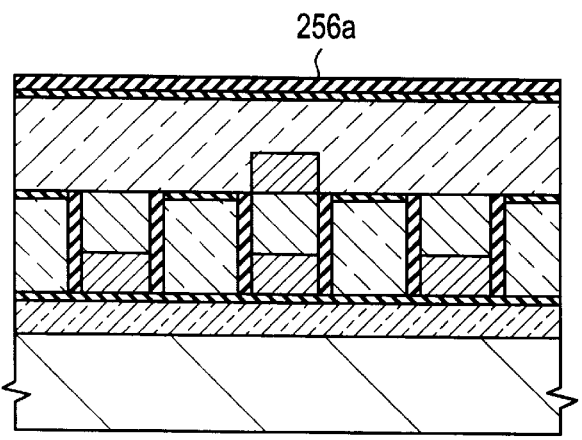
FIGS. 24a, 24b and 24c are schematic section views showing manufacturing steps of an application example of the second embodiment of the present invention, namely.

Next, similarly to the foregoing first embodiment, the second interlayer insulating film is formed, which is composed of the third silicon oxide film (not shown) formed of the HTO film of about 50 thick covering directly the second wiring layers 218a to 218f and the like, the second BPSG film 222, and the third silicon nitride film 223 of about 50 nm. The film thickness of the BPSG film just above the second wiring layer is, for example, about 250 nm, and the upper surface of the BPSG film is flattened (FIGS. 19a, 21a, and 23a).

Next, the second interlayer insulating film and the second wiring layer 218e are subjected to an anisotropic etching, so that the first upper layer contact hole 224 reaching the lower layer contact hole 214a is formed in the second interlayer insulating film. The diameter of the upper layer contact hole 224 is about 1.2 pm (=3.0F), and its aspect ratio is about 0.46. The second conductive film of about 200 nm (not shown) is formed on the entire surface of the resultant structure, which is formed of the same composition materials as those of the second conductive film of the first application example of the first embodiment. The second conductive film is etched-back by an anisotropic etching so that the conductive film spacer 225 is formed on the side surface of the upper layer contact hole 224 (FIGS. 16, 17, 19b, 21b, and 23b). The height of the conductive film spacer 225 is, for example, about 300 nm. The intervals between the upper layer contact hole 224 and the second wiring layers 218d and 218f adjacent to the contact hole 224 are about 2A. Even if the alignment discrepancy is considered, the minimum values of these intervals are at most about A, so that the shorts between the second wiring layers 218d and 218f and the ring-shaped conductive film spacer 225 can be avoided, and the insulation between the layers 218d and 218f and the spacers 225 are secured. In addition, the interval between the ring-shaped conductive film spacer 225 and the first lower layer contact hole 214a is about A. Due to the existence of the first silicon nitride film spacer 216, the interval between the ring-shaped conductive film spacer 225 and the lower layer contact plug 217 is about 2A, so that if the alignment discrepancy exists, the problem concerning the insulativity also between the ring-shaped conductive film spacer 225 and the lower layer contact plug 217 occurs.

Figure 21B:
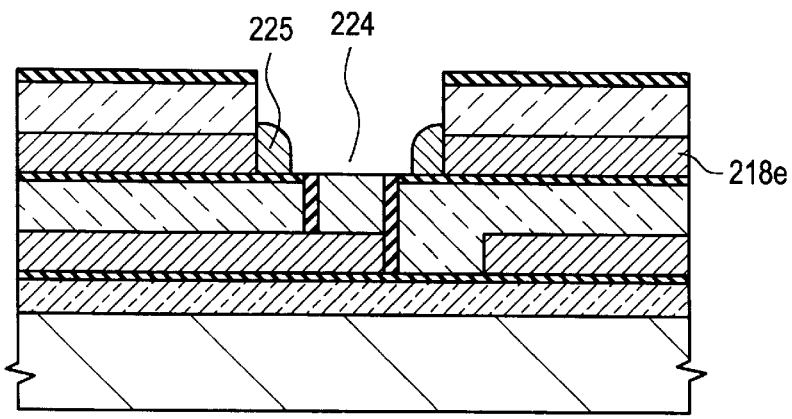
Figure 21C:
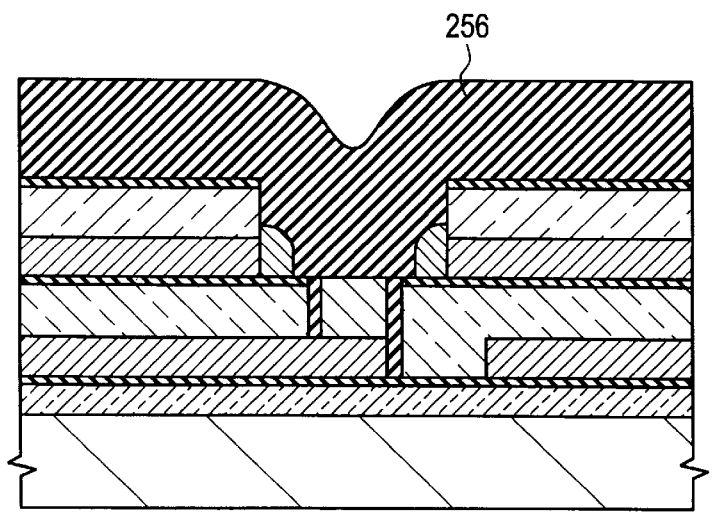
Figure 23B:
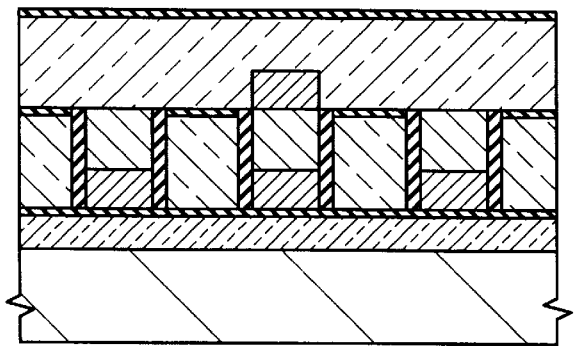
Figure 23C:
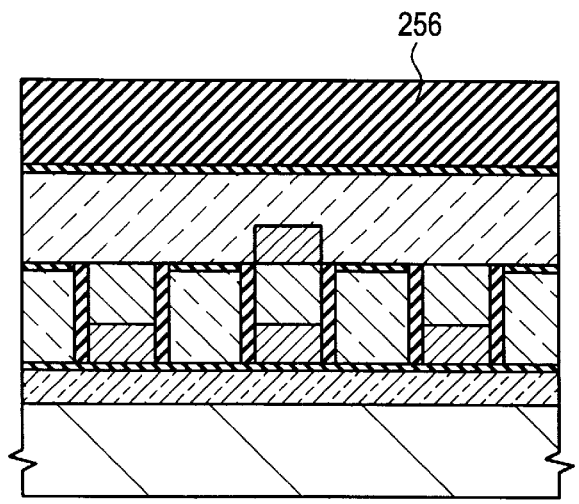

Next, the fourth silicon oxide film 256 of a film thickness enough to bury the upper layer contact hole 224 is formed on the entire surface of the resultant structure. The initial stage for the formation of the silicon oxide film 256 should be performed by the LPCVD method (FIGS. 1c, 21c, and 23c).

The CMP is performed on the silicon oxide film 256. The CMP is performed at least at the final stage of the CMP. Thus, the silicon oxide film 256 is processed to the silicon oxide film 256a having the flat upper surface. The film thickness of the silicon oxide film 256a on the surface of the silicon nitride film 223 is at least about 100 nm C FIGS. 20a, 22a, and 24a). As a result, the formation method of the silicon oxide film having the shape of the silicon oxide film 256a is not limited to the one described above. For example, the CMP is performed until the upper surface of the silicon nitride film 223 is exposed, thereafter, a new silicon oxide film of at least about 100 nm may be formed.

Figure 20B:
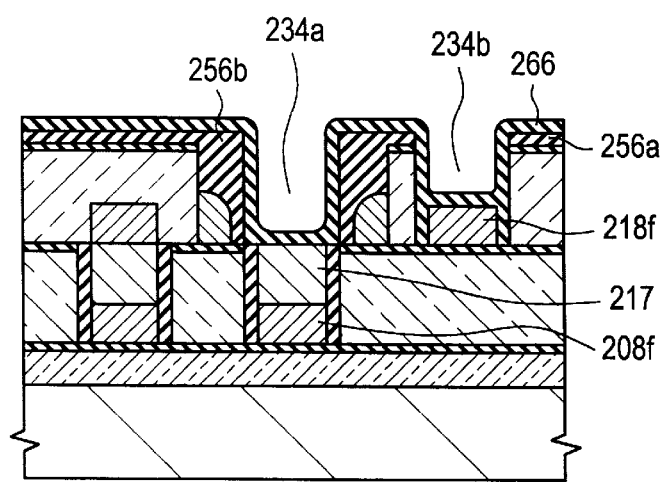
Figure 20C:
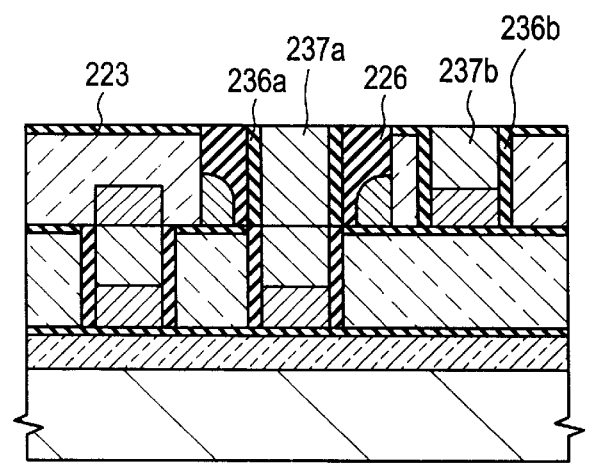
Figure 22B:
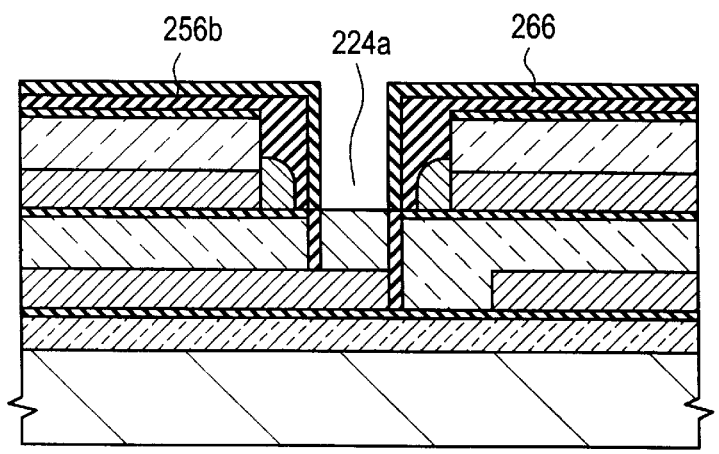
Figure 22C:
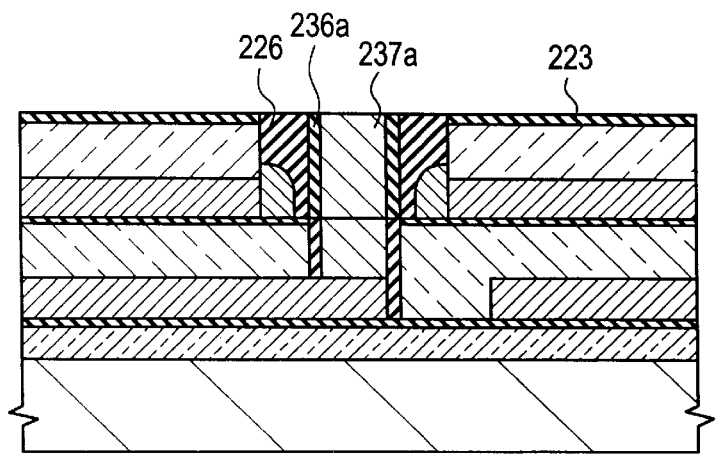
Figure 24B:
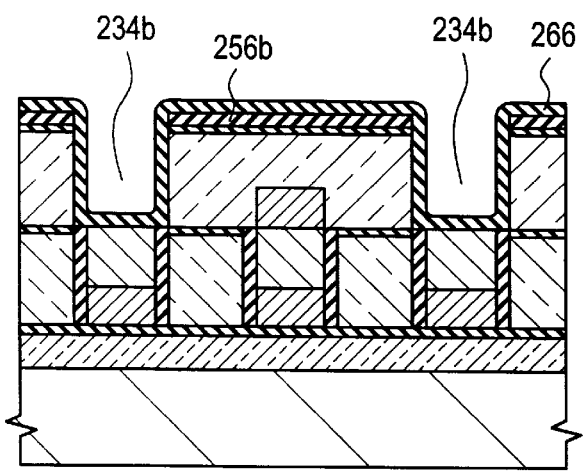
Figure 24C:
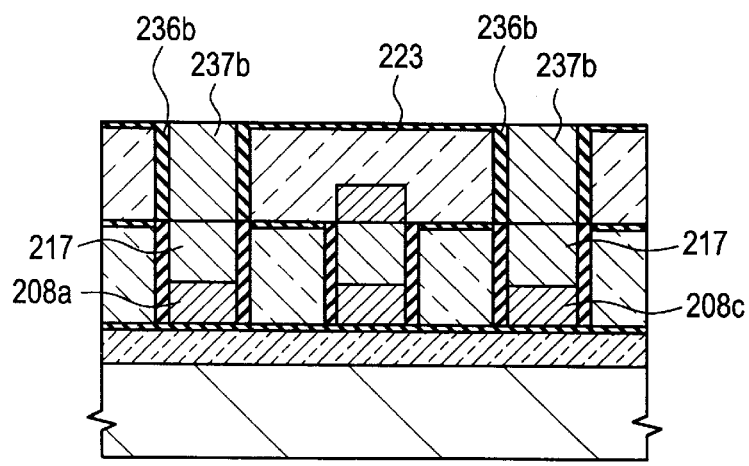

Next, an anisotropic etching which is similar to the one to form the foregoing lower layer contact holes 214a and 214b is performed. The opening 234a is formed, which reaches the first lower contact hole 214a through the silicon oxide film 256a. At the same time, the second upper layer contact hole 234b is formed, which reaches to the second lower layer contact hole 214b or the second wiring layer 218f through the silicon oxide film 256a and the second interlayer insulating film. The silicon oxide film 256b is left. The final stage of the foregoing anisotropic etching should be performed using etching gas composed by adding CO to $CHF_3$. The diameters of the opening 234a and the upper layer contact hole 234b are equal to those of the lower layer contact holes 214a and 214b which are about 0.6 μm (=F+2A=1.5F). An aspect ratio of these are about 0.5. The minimum interval between the opening 234a and the upper layer contact hole 234b is about F. In this embodiment, the second upper layer contact hole can be formed at the 1st. n.n. position of the first upper layer contact hole 224. At this time, the interval between the upper layer contact hole 224 and the upper layer contact hole 234b is about A, so that the situation of "on line" is brought about in the worst case when the alignment discrepancy must be considered. Even in this worst case, only the vertical side surface of the ring-shaped conductive film spacer 225 which contacts with the upper layer contact hole 224 is exposed to the upper layer contact hole 234b. The ring-shaped conductive film spacer 225 does not protrude into the upper layer contact hole 234b. Therefore, the diameter of the upper layer contact hole 234b is not narrowed actually. Next, by the LPCVD method using SiH2 and NH3 as a raw material gas, the fourth silicon nitride film 266 is formed on the entire surface of the resultant structure (FIGS. 20b, 22b, and 24b).

Next, the silicon nitride film 266 is etched-back, so that the second silicon nitride film spacer (not shown) having an ordinary section shape is formed. The third conductive film (not shown) having an enough film thickness to bury the opening 234a and the upper layer contact hole 234b is formed. Subsequently, until the upper surface of the silicon nitride film 223 is exposed, the CMP is performed for the third conductive film, the silicon oxide film 256b, and the second silicon nitride film spacer. Thus, the silicon nitride film spacer 226 is left on the side surface of the first upper contact hole 224. At the same time, the second silicon nitride film spacer 236a covering the opening 234a and the first upper layer contact plug 237a filling the opening 234a through the spacer 236a are left in the opening 234a. Furthermore, in the second upper layer contact hole 234b, the second silicon nitride film spacer 236b covering the side surface of the contact hole 234b, and the second upper layer contact plug 237b filling the contact hole 234b through the spacer 236b are left. The upper surfaces of the silicon oxide film spacer 226 and the silicon nitride film spacers 236a and 236b are flat planes which accord with the upper surface of the silicon nitride film 223 (FIGS. 16, 17, 20c, 22c, and 24c). The interval between the first upper layer contact plug 237a and the ring-shaped conductive film spacer 225 is narrowest in the bottom surface of the first upper layer contact hole 224. However, it is as large as about 2A. For this reason, this embodiment is superior to the first embodiment concerning the insulativity between the first upper layer contact plug and the ring-shaped conductive film spacer.

Next, on the surface of the second interlayer insulating film, the third wiring layer 238 and the like are formed (FIGS. 16 and 17). In this embodiment, as described above, since it is possible to set the minimum interval between the opening 234a and the second upper layer contact hole 234b to be about F, it will be possible to arrange the second upper contact hole at the position of the 1st.n.n. of the first upper layer contact hole, regardless whether the restriction to the combination of the composition materials of the third wiring layer 238 and the composition materials of the upper layer contact plugs 237a and 237b. Specifically, this embodiment is able to cope with the requirement of the high wiring density for the third wiring layer regardless of the restriction to the combination of the composition materials of the third wiring layer and the composition materials of the first and second upper layer contact plugs. In this point, this embodiment differs from the first embodiment.

Also in the application example of this embodiment, the composition materials and various kinds of values are not limited to the above. This embodiment is applicable to the second, third, and fourth application examples of the first embodiment. Furthermore, this application example of this embodiment is applied to the multilayer wiring structure of the semiconductor devices including the CMOS transistors as the semiconductor elements and the manufacturing the same. However, this embodiment is not limited to this, for example, this embodiment is applicable to the multilayer wiring structure including other semiconductor elements such as, for example, BiCMOS transistors and the manufacturing method of the same without any obstacles.

The foregoing second embodiment has an advantage that the first embodiment possesses. According to this second embodiment, it is possible to arrange the second upper layer contact hole at the 1st n.n position of the second upper layer contact hole regardless of the restriction to the combination of the composition materials of the third wiring layer and the composition materials of the first and second contact plugs. Furthermore, in this embodiment, since the silicon oxide film spacer and the second silicon nitride film spacer are formed in the first upper layer contact hole, particularly, the insulativity between the conductive film spacer and the first upper contact plug can be increased compared to the first embodiment.

Referring to FIG. 25, and FIGS. 26a, 26b, and 26c which are schematic views of the multilayer wiring structure used in semiconductor devices, taken along the lines A—A, B—B, and C—C, respectively, the multilayer wiring structure, when the third embodiment of the present invention is applied to the logic circuit shown in FIG. 3 which is the same as of the first application example of the first embodiment (referred to as an application example of a third embodiment), differs from the second embodiment in the structure and the manufacturing method, relating to the second interlayer insulating film and the first and second upper layer contact holes. Similar to the first and second embodiments, to understand the this embodiment easier, the first wiring layer and the ring-shaped conductive film spacer are illustrated with hatching in FIG. 25 and the illustrations of the transistor (the source and drain regions and the gate electrode) are omitted in FIGS. 25 and 26.

Also this multilayer wiring structure is described as one which is composed of three wiring layers formed according to a 0.4 μm design rule, and has a minimum processing dimension F of 0.4 μm and an alignment margin A of 0.1 μm (0.25 F). First wiring layers 308aa to 308ah are formed on a silicon substrate 301 of a predetermined conductivity type through a foundation insulating film which is formed by stacking a silicon nitride film 303 of about 50 nm thick on a silicon oxide film 302. The composition of the foundation insulating film is not limited to the foregoing one. Also in this embodiment, the constitution of the foundation insulating film is not limited to the foregoing one. When the CMOS transistor is included as in this case, the bottom surface of the foundation insulating film may be formed at least of a silicon oxide film, when this embodiment is applied to the foregoing logic circuit including the CMOS transistor as in this case. The wiring layers 308a to 108h and the like should are composed of a stacked film formed by stacking a titanium nitride film on either a titanium silicide (TiSi$_2$) film or a titanium film. The minimum line width of the first wiring layers 308a to 308h and the like is about 0.4 μm (=F), and the thickness of these films is, for example, about 200 nm (=0.5F). The minimum interval between the first wiring layers 308a to 308h is, for example, about 0.6 μm (=F+2A= 1.5F). The wiring pitch of the first wiring layers is about 1.0 μm (=2F+2A=2.5F). In this embodiment, the case where either a diffusion layer or a gate electrode is included in the first wiring layers will be advantageous as in the first embodiment. Furthermore, the composition materials of the first wiring layer of this embodiment are not limited to the titanium silicide film and the like.

The first wiring layers 308g and 308h correspond to a power wiring Vcc and a ground wiring GND, and are connected to a P$^+$ type source diffusion layers and an N$^+$ type source diffusion layers of a plurality of P and N channel MOS transistors, respectively. The first wiring layer 308a is connected to the gate electrode of a first stage CMOS inverter, composed of N and P channel MOS transistors, in a two stage CMOS inverter, and the first wiring layer 308b is connected to the N$^+$ and P$^+$ type drain diffusion layers of the N and P channel MOS transistors of the first stage CMOS inverter. The first wiring layer 308c is connected to the gate electrode of a one stage CMOS inverter composed of N and P channel MOS transistors. The first wiring layer 308d is connected to the N$^+$ and P$^+$ type drain diffusion layers of N and P channel MOS transistors of the one stage CMOS inverter. The first wiring layer 308e is connected to the gate electrode of the final stage CMOS inverter, composed of N and P channel MOS transistors, in the two stage CMOS inverter. The first wiring layer 308f is connected to the N$^+$ and P$^+$ type drain diffusion layers of the N and P channel MOS transistors of the final stage CMOS inverter.

The first wiring layers 308a to 308h are covered with a first interlayer insulating film. The first interlayer insulating film is composed of a silicon oxide film (not shown) formed of an HTO film of about 50 nm thick directly covering the first wiring layers 308a to 308h, a first BPSG film 312 covering the first silicon oxide film, and a first silicon nitride film 313 of about 50 nm thick covering the BPSG film 312. The upper surface of the BPSG film 312 is flattened. The thickness of the BPSG film 312 just above the first wiring layers 308a to 308ah is, for example, about 250 nm.

A first lower contact hole 314a, reaching the first wiring layers 308a, 308c, and 308e and the like, is formed in the first interlayer insulating film. In the first interlayer insulating film, a second lower layer contact hole 314b is also formed reaching the first wiring layers 308a, 308d, and 308f and the like. The diameters of these first and second lower layer contact holes 314a and 314b are larger than the minimum line width of the first wiring layers, for example, about 0.6 μm (=F+2A). Therefore, in this case, the minimum interval between the lower layer contact holes is about F. The side surfaces of the first and second lower layer contact holes 314a and. 314b are covered with silicon nitride film spacers 316 respectively. The width of the silicon nitride film spacers 316 is, for example, about 100 nm (=A), and the upper end of the silicon nitride film spacer 316 comprises flat surfaces having the same level as the upper surface of the foregoing silicon nitride film 313. These first and second lower contact holes 314a and 314b are filled with a lower layer contact plugs 317, respectively. The lower layer contact plugs are formed of the same materials, which have one sides of about F. The upper surfaces of the lower contact plugs 317 almost agree with the foregoing upper surface of the silicon nitride film 313, and are almost flat. Each of the contact areas of the lower layer contact plugs 317 to the first wiring layers is at least about F$^2$.

In this embodiment, similar to the first and second embodiments, the first interlayer insulating film is not limited to the above structure, for example, it may be a film formed by stacking a silicon nitride film on a silicon oxide film, and diameters of the first and second lower contact holes may be more than about F.

On the surface of the first interlayer insulating film, second wiring layers 318, and 318a to 318f and the like are formed. The minimum line width and the wiring pitch of the second wiring layers 318, and 318a to 318f and the like are about 0.4 μm (=F) and about 1.0 μm. The film thicknesses of the second wiring layers are about 200 nm. The composition materials of the second wiring layers are the similar to those of the first and second embodiments. The second wiring layers 318, 318a to 318f and the like are covered with a second interlayer insulating film. The second interlayer insulating film is formed of a stacked film which is composed of a second silicon oxide film (not shown) formed of an HTO film of 50 nm thick and a second BPSG film 322.

The upper surface of the BPSG film 322 is flattened. The film thickness of the BPSG film 322 just above the second wiring layers 318, and 318a to 318f and the like is, for example, about 250 nm. In the second interlayer insulating film, a first upper layer contact holes 324 reaching the first lower contact hole 314a is formed. The diameter of the first upper layer 20 contact hole 324 is, for example, about 1.2 μm (=2F+4A=3F). In this embodiment, the line width of the second wiring layers 318 and 318a at the portion adjacent to the first upper layer contact hole 324 and at the portion connected to the lower contact hole 314b should be about 0.4 μm (=F). With such constitution, the interval between the upper layer contact hole 324 and the respective second wiring layers 318 and 318a is about 0.2 μm (=2A).

The second wiring layer 318a corresponds to the input signal line IN of the logic circuit shown in FIG. 3, and is connected to the first wiring layer 308a through the lower layer contact hole 314b. The connection of the second wiring layer 308a to the first wiring layer 308c is described later. The second wiring layer 318d corresponds to an output line OUT-1 of the foregoing logic circuit, is connected to the first wiring layer 308f through the lower layer contact hole 314b.

The second wiring layers 318, 318b, 318c, and 318e have no relation to the foregoing logic circuit. For example, the second wiring layers 318b, 318c, and 318e are arranged at the position including the portion just above the respective first wiring layers 308b, 308c, and 308e through the first wiring layers. The second wiring layers 318b, 318c, and 318e are separated at the portion just above the first lower layer contact hole 314a by the first upper layer contact hole 324. These separated portions are connected by a ring-shaped conductive film spacer 325 formed on the side surface of the first upper layer contact hole 324. The ring-shaped conductive film spacer 325 is formed of the same materials as the first embodiment, which has the width of about 200 nm and the height of about 300 nm.

Also in this embodiment, similar to the first embodiment, a silicon nitride film spacer having an ordinary section shape different from that of the first silicon nitride film spacer 316 may be adopted, on behalf of the spacer 316. In this case, considering an alignment discrepancy, it is necessary to consider so that an interval between the ring-shaped conductive film spacer 325 and the second wiring layers 318 and 318d is set to be 50 nm (an average value of 150 nm (=1.5A)) in worst case. For example, if the diameter of the first upper layer contact hole 324 is broadened to about 1.3 μm, the diameter of the lower contact hole 314a is reduced to about 0.5 μm, and the width of the lower portion of the silicon nitride film spacer in behalf of the spacer 316 is set to be about 50 nm, this will be possible.

The side surfaces of the first upper layer contact hole 324 including the ring-shaped conductive film spacer 325 is covered with the silicon oxide film spacer 326. The spacer 326 is formed by a process by etching a buried silicon oxide film and like formed in the first upper layer contact hole 324 (this is described later). The upper surface of the silicon oxide film spacer 326 is a flat plane which is the same level as the upper surface of the second interlayer insulating film (the upper surface of the BPSG film). The interval between the side surface of the contact hole 324 and the portion of the side surface of the spacer 326 is about 300 nm, the portion of the side surface of the spacer 326 being not connected to the contact hole 324 and the spacer 325. The width of the upper end of the spacer 326 is about 300 nm, and the width of the lower end thereof is about 100 nm.

The upper surfaces of the silicon oxide film spacer 326 and the second interlayer insulating film (BPSG film 322) are covered with a second silicon nitride film 333 of about 50 nm thick. A space formed by the silicon oxide film spacer 325 which covers the side surface of the first upper layer contact hole 324 is one to be used as the opening 334a which reaches the first lower layer contact layer 314a through the silicon nitride film 333 and a buried silicon oxide film formed in the upper layer contact hole. Furthermore, in the second interlayer insulating film, the second upper layer contact hole 334b is formed, which penetrates the silicon nitride film 333 and the second interlayer insulating film to reach the second wiring layer 318a. In this application example of this embodiment, the first upper layer contact hole which reaches the second wiring layer is only shown. However, this embodiment is not limited to the above, it is possible to arrange a second upper layer contact hole which reaches a second lower contact hole. The diameters of the opening 334a and the upper layer contact hole 334b are equal to that of the lower contact hole, about 0.6 μm (=F+2A=1.5F).

The side surface of the opening 334a and the second upper layer contact hole 334b are covered with the second silicon nitride film spacers 336a and 336b having the widths of about 100 nm (=A). The section shapes of the spacers 336a and 336b are the same as that of the first silicon nitride film spacer 316. The upper surface of the spacers 336a and 336b are not the same level as that of the BPSG film which is the second interlayer insulating film, but is the same level as that of the silicon nitride film 333. The opening 334a and the second upper layer contact hole 334b are filled with the first and second upper layer contact plugs 337a and 337b through the spacers 336a and 336b.

Also in this embodiment, the second interlayer insulating film may be formed by a silicon oxide film having a flat plane, which is similar to the first and second embodiments. In this case, on the side surfaces of the opening and the second upper layer contact hole, the second silicon nitride film spacer is not always necessary, and the diameters of the opening and the second upper layer contact hole may be more than F.

On the surface of the silicon nitride film 333, third wiring layers 338a and 338b having a minimum line width of about 0.4 μm (=F) and a film thickness of about 200 nm. The third wiring layer 338a is connected to the second wiring layer 318a through the second upper layer contact hole 334b, and is connected to the first wiring layer 308c through the first contact plug 337a of the opening 334a and the first lower contact hole 314a. The end portion of the third wiring layer 338b is connected to the first wiring layer 308b through the first contact plug 337a of the opening 334a and the first lower layer contact hole 314a. The other end portion of the third wiring layer 308b is connected to the first wiring layer 308e through the first contact plug 337a of the opening 334a and the first lower layer contact hole 314a. The line widths of the third wiring layers 338a and 338b connected to the opening 334a are the same as those of, for example, the opening 334a and the upper layer contact hole 334b. The line width of the third wiring layer 338a at the portion connected to the second upper layer contact hole 334b is also the same as those of the opening 334a and the contact hole 334b. Similar to the second embodiment, if the restriction is provided to the combination of the composition materials of the third wiring layers 338a and 338b and the composition materials of the upper layer contact plug 337a, which is the same as that to the combination of the composition materials of the second wiring layer and the composition materials of the lower layer contact plug, the line width of the third wiring layer 338a and the like at the portion connected to the opening 334a and the upper layer contact hole 334b can be set to be about 0.4 μm (=F).

Referring to FIGS. 25 and 26, FIG. 27 which is a schematic section view showing main manufacturing steps, taken along the line A—A of FIG. 25, FIG. 28 which is a schematic view showing main manufacturing steps, taken along the line B—B of FIG. 25, and FIG. 29 which is a schematic view showing main manufacturing steps, taken along the line C—C of FIG. 25, the manufacturing method of the multilayer wiring structure of the application example of the third embodiment differs from the manufacturing method of the second embodiment in the steps after the formation of the first upper layer contact hole.

First of all, from the formation of the foundation insulating film composed of the silicon oxide film 302 and a silicon nitride film 303; the formation of the first wiring layers 308a to 308h and the like; the formation of the first interlayer insulating film composed of the first silicon oxide film (not shown) formed of an HTO film of about 50 nm thick covering the first wiring layers 308a to 308h and the like, the first BPSG film 312, and the first silicon nitride film 313 of about 50 nm thick; the formation of the second silicon oxide film (not shown); the formation of the first and second lower layer contact holes 314a and 314b; and the formation of the first silicon nitride film spacer 316 and the lower layer contact plug 317 by the film growth and processing of the second silicon nitride film (not shown) and the first conductive film (not shown); the formation of the second wiring layer 318 and the second wiring layers 318a to 318f; and the formation of the second interlayer insulating film composed of the third silicon oxide film (not shown) formed of the HTO film of about 50 nm thick, which covers directly the second wiring layers 318 and 318a to 318f, and the second BPSG film 312, are performed similarly to the second embodiment. In this stage, the second wiring layers 318b, 318c, and 318e are connected to the first wiring contact hole 314a. Furthermore, the line width of the second wiring layer, for example, the second wiring layers 318 and 318a, at the portion adjacent to the region where the first upper layer contact hole is to be formed, is set to be the minimum processing dimension of about F. Furthermore, in this stage, the upper surface of the BPSG film 322 is flattened. The film thickness of the BPSG film 322 at the portion just above the second wiring layers 318, and 318a to 318f is about 250 nm.

Next, the second interlayer insulating film and the second wiring layers 318b, 318c and 318e are subjected to an isotropic etching so that the first upper layer hole 324 reaching the lower layer contact hole 314a is formed in the second insulating film. The diameter of the upper layer contact hole 324 is about 1.2 μm (=3F), and the aspect ratio thereof is about 0.42. The second conductive film (not shown) of about 200 nm thick is formed on the entire structure of the resultant structure, which is composed of the same composition materials as those of the second conductive film of the first application of the first embodiment. The second conductive film is etched-back by an anisotropic etching so that the conductive spacer 325 is formed on the side surface of the upper layer contact hole 324. The height of the conductive film spacer 325 is, for example, about 300 nm (FIGS. 25, 27a, 28a, and 29a).

Next, the fourth silicon oxide film (not shown) having the film thickness enough to bury the upper layer contact hole 324 is formed on the entire surface of the resultant structure. A CMP is performed as to the foregoing silicon oxide film at least in the final stage of the steps, thereby forming the silicon oxide film 356 to fill the upper layer contact hole 324. Subsequently, the third silicon nitride film 333 of about 50 nm, and the fifth silicon oxide film 364 of, at least, about 100 nm thick are sequentially formed on the entire surface of the resultant structure (FIGS. 27b, 28b, and 29b).

The steps from the formation of the second BPSG film to the formation of the silicon oxide film 356 which constitute the second interlayer insulating film are not limited to the foregoing method. For example, there is the following manufacturing method. The second BPSG film having a predetermined film thickness is formed. The reflow processing is performed. The film thicknesses of the second BPSG film at the portion just above the second wiring layers 318, 318a to 318f are made thicker than 250 nm at this stage. After the first upper layer contact hole 324 and the ring-shaped conductive film spacer 325 are formed, the fourth silicon oxide film is formed. The fourth silicon oxide film and the second BPSG film are subjected to the CMP so that the BPSG film 322 and the silicon oxide film 356 have the foregoing shapes and the film thicknesses.

Next, the anisotropic etching similar to that to form the foregoing lower layer contact holes 314a and 314b is performed. Thus, the opening 334a is formed, which penetrates the silicon oxide film 364, the silicon nitride film 333, and the silicon oxide film 356 to reach the first lower layer contact hole 314a. At the same time, the second upper layer contact hole 334b is formed, which penetrates the silicon oxide 364, the silicon nitride film 333, and the second interlayer insulating film to reach either the second wiring layer 318a or the second lower contact hole 314b. The silicon oxide film spacer 326 is formed. The diameters of the opening 334a and the upper layer contact hole 334b are equal to those of the lower layer contact holes 314a and 314b, which are about 0.6 μm (=F+2A=1.5F). Aspect ratios of these are about 1.1. Next, the fourth silicon nitride film (not shown) of about 100 nm thick is formed on the entire surface of the resultant structure by the LPCVD method using $SiH_2Cl_2$ and $NH_3$ as raw material gas. The fourth silicon nitride film is etched-back so that the second silicon nitride film spacer 336 having an ordinary section shape is formed on the side surface of the opening 334 and the upper layer contact hole 334b (FIGS. 27c, 28c, and 29c).

Next, the third conductive film (not shown) having a film thickness enough to fill the opening 334a and the upper layer contact hole 334b is formed. Until the upper surface of the silicon nitride film 333 is exposed, the CMP is performed for the third conductive film, the silicon oxide film, and the second silicon nitride film spacer 336. Thus, the spacer 336 covering the side surface of the opening 334a and the first upper layer contact plug 337a filling the opening 334a are left in the opening 334a. In the second upper layer contact hole 334b, the second silicon nitride film spacer 336b covering the side surface of the contact hole 334b and the second upper layer contact plug 337b filling the contact hole 334b are left. The upper surface of the spacers 336a and 336b have flat planes which are the same level as that of the silicon nitride film 333.

Also in the application example of this embodiment, the composition materials and various kinds of values are not limited to the above. Furthermore, this embodiment can be applied to the second, third, and fourth application examples of the first embodiment. Still furthermore, this application of the embodiment is applied to the multilayer wiring structure including the CMOS ransistors mainly as the semiconductor device and the manufacturing method of the same. However, this embodiment is not limited to this, for example, this embodiment can be applied to a multilayer wiring structure other semiconductor devices such as a BiCMOS transistor and a manufacturing method of the same without any obstacles.

The foregoing third embodiment has the advantages which the foregoing second embodiment has. Furthermore, in the third embodiment, since the upper surface of the silicon oxide film spacer 326 is covered with the silicon nitride film 333, the third embodiment differs from the second embodiment in the following. If the restriction to the combination of the composition materials of the third wiring layer and the combination materials of the first and second upper layer contact plugs is provided to the same restriction to that of the combination materials of the second wiring layer and the combination materials of the lower layer contact plug, it is easy to arrange further the fourth wiring layer which is a wiring layer as an upper layer.

As described above, according to the present invention, the second wiring layer formed on the surface of the fist interlayer insulating film is avoided. The third wiring layer formed on the second interlayer insulating film and the first wiring layer covered with the first interlayer insulating film are connected by the lower contact hole and the first upper layer contact hole. The lower layer contact hole fills the first lower layer contact hole reaching the first wiring layer formed in the first interlayer insulating film, the bottom surface of which is directly connected to the first wiring layer. The first upper layer contact plug fills, interposing the insulating film spacer, the first upper layer contact hole reaching the first lower layer contact hole formed in the second interlayer insulating film. The upper surface of the first upper layer contact plug is directly connected to the third wiring layer and its bottom surface is connected to the upper surface of the lower layer contact plug. Furthermore, the first upper layer contact hole has a diameter larger than that of the first lower layer contact hole. The first upper layer contact hole separates the second wiring layer at the position just above the first lower layer contact hole. At this position, the second wiring layer is connected by the ring-shaped conductive film spacer formed on the side surface of the first upper layer contact hole. The upper end of the ring-shaped conductive film spacer is positioned lower than the upper surface of the second interlayer insulating film. The bottom surface of the ring-shaped conductive film is connected only to the upper surface of the first interlayer insulating film. The ring-shaped conductive film is covered with the silicon oxide spacer.

According to the present invention, the contact hole formed in the second interlayer insulating film, which connects the third wiring layer and the first wiring layer, is not formed at the position where the second wiring layer does not exist, that is, at the position between the adjacent second wiring layers, but the contact hole is formed, as the first upper layer contact hole having the foregoing structure, at the position where it crosses the second wiring layer. The first upper layer contact hole can be realized without narrowing partially the line width of the second wiring layer, without reducing the effective section area of the contact plug, and without widening the interval between the second wiring layers.

As a result, by adopting the foregoing structure of the present invention, it is possible to avoid the second wiring layer and to suppress an increase in contact resistivity without damaging a migration resisting property and without sacrificing micronization when the third wiring layer and the first wiring layer are connected.

Although the preferred embodiment of the present invention has been described in detail, it should be understood that various changes, substitutions and alternations can be made therein without departing from spirit and scope of the invention as defined by the appended claims.

What is claimed is:

1. A manufacturing method of a semiconductor device, comprising the steps of:
    forming selectively a first opening in a first insulating layer covering a semiconductor substrate;
    burying said first opening with a first conductive layer;
    forming a first wiring layer on said first insulating layer, which stretches contacting the said first conductive layer;
    covering surfaces of said first wiring layer and said first insulating layer with a second insulating layer;
    selectively removing said second insulating layer and said first wiring layer thereby exposing a surface of said first conductive layer and forming a second-openings which divides said first wiring layer into first and second portions;
    forming a conductive layer on an entire surface of the resultant structure, and then etching-back said conductive layer to form a second conductive layer along the said second insulating layer exposed by said second opening, said second conductive layer contacting said first and second portions of said first wiring layer exposed by said second opening;
    forming a third insulating layer covering a surface of said second conductive layer; and
    forming a second wiring layer on said second insulating layer, said second wiring layer contacting said first conductive layer and being insulated from said second conductive layer by said third insulating layer.

2. A manufacturing method of a semiconductor device according to claim 1, said manufacturing method further comprises:
    burying a third wiring layer in said first insulating layer,
    wherein said first opening exposes a portion of said third wiring layer, and said first conductive layer contacts the portion of said third wiring layer.

3. A manufacturing method of a semiconductor device according to claim 1, wherein an impurity region is lectively formed in said semiconductor substrate, a portion of said impurity region is exposed by said first opening, and said first conductive layer is connected to the portion of said impurity region.

4. A manufacturing method of a semiconductor device, comprising the steps of:
    forming a first wiring layer having a predetermined minimum width as a minimum value of a line width on a surface of the semiconductor substrate or on the surface of the semiconductor substrate interposing a foundation insulating film, said first wiring layer constituting a portion of a semiconductor element formed in a surface of a semiconductor substrate, or being connected to said semiconductor element;
    forming a first silicon oxide film covering said first wiring layer, flattening an upper surface of said first silicon oxide film, and forming a first silicon nitride film covering an upper surface of said first silicon oxide film, thereby forming a first interlayer insulating film composed of said first silicon oxide film and said first silicon nitride film;
    forming a second silicon oxide film having a predetermined film thickness, so as to cover an upper surface of said second interlayer insulating film;
    forming first and second lower layer contact holes having a first diameter at least not smaller than said predetermined minimum width, which penetrate through said second silicon oxide film and said first interlayer insulating film to reach said first wiring layer;

forming a second silicon nitride film on the entire surface of the resultant structure using a low pressure chemical vapor phase deposition (LPCVD) method, and etching-back said silicon nitride film to form silicon nitride spacers on side surface of said first and second lower layer contact holes;

forming a first conductive film filling said first and second lower layer contact holes on the entire surface of the resultant structure, and polishing said first conductive film, said silicon nitride film spacers, and said first silicon oxide film using a chemical machinery polishing (CMP) method until an upper surface of said first interlayer insulating film is exposed, thereby making upper surfaces of said silicon nitride film spacers flat, which is positioned at the same level as that of said first interlayer insulating film, and thereby forming lower layer contact plugs formed of said first conductive film which bury said first and second lower contact holes interposing said silicon nitride film spacers;

forming second wiring layers having the predetermined minimum width as a minimum value of a line width on the upper surface of said first interlayer insulating film, at least one of said second wiring layers being connected to said first wiring layer through said second lower layer contact. hole, and at least one of said second wiring layers being connected to said first wiring layer through said first lower layer contact hole;

forming a third silicon oxide film covering said second wiring layer, and flattening an upper surface of said third silicon oxide film, thereby forming a second interlayer insulating film composed of at least said third silicon oxide film;

forming a first upper layer contact hole having a second diameter larger than said first diameter in said second interlayer insulating film, said first upper layer contact hole dividing said second wiring layers at a position just above said first lower layer contact hole, and reaching said first lower layer contact hole;

forming a second conductive film having a predetermined film thickness on the entire surface of the resultant structure, and etching-back said second conductive film, thereby forming a ring-shaped conductive film spacer on a side surface of said first upper layer contact hole, said ring-shaped conductive film spacer having an upper end of a lower level than an upper surface of said second interlayer insulating film and having a bottom surface connected to an upper surface of said first interlayer insulating film, and said ring-shaped conductive film spacer connecting said second wiring layers divided by said first upper layer contact hole;

etching said second interlayer insulating film using a photoresist as a mask which covers the said first upper layer contract hole, thereby forming a second upper layer contact hole having a third diameter smaller than said second diameter, said second upper layer contact hole reaching either said second lower layer contact hole or said second wiring layer;

forming a second silicon oxide film on the entire surface of the resultant structure by the low pressure chemical vapor phase deposition (LPCVD) method, and etching-back said second silicon oxide film until an upper surface of said second interlayer insulating film is exposed, thereby forming a silicon oxide film spacer at least on a side surface of said first upper layer contact hole;

forming a third conductive film on the entire surface of the resultant structure, and performing a chemical machinery polishing (CMP) of said third conductive film until the upper surface of said second interlayer insulating film is exposed, thereby forming first and second upper layer contact plugs burying said first and second upper layer contact holes; and forming at least one of third wiring layers connected to said first wiring layer through said first upper layer contact hole and said first lower layer contact hole, and forming at least one of third wiring layers connected to either said second lower layer contact hole or said second wiring layer through said second upper layer contact hole.

5. A manufacturing method of a semiconductor device, comprising the steps of:

forming a first wiring layer having a predetermined minimum width as a minimum value of a line width on a surface of the semiconductor substrate or on the surface of the semiconductor substrate interposing a foundation insulating film, said first wiring layer constituting a portion of a semiconductor element formed in a surface of a semiconductor substrate, or being connected to said semiconductor element;

forming a first silicon oxide film covering said first wiring layer, forming a first BPSG film covering said first silicon oxide film, flattening an upper surface of said first BPSG film, and forming a first silicon nitride film covering the upper surface of said first BPSG film, thereby forming a first interlayer insulating film composed of said first silicon oxide film, said first BPSG film, and said first silicon nitride film;

forming a second silicon oxide film having a predetermined film thickness, which covers an upper surface of said second interlayer insulating film;

forming first and second lower layer contact holes having a first diameter larger than said predetermined minimum width, which penetrate through said second silicon oxide film and said first interlayer insulating film to reach said first wiring layer;

forming a second silicon nitride film on the entire surface of the resultant structure using a low pressure chemical vapor phase deposition (LPCVD) method, and etching-back said silicon nitride film to form silicon nitride spacers on side surface of said first and second lower layer contact holes;

forming a first conductive film filling said first and second lower layer contact holes on the entire surface of the resultant structure, and polishing said first conductive film, said silicon nitride film spacers, and said second silicon oxide film using a chemical machinery polishing (CMP) method until an upper surface of said first interlayer insulating film is exposed, thereby making upper surfaces of said silicon nitride film spacers flat, which is positioned at the same level as that of said first interlayer insulating film, and thereby forming lower layer contact plugs formed of said first conductive film which bury said first and second lower contact holes interposing said silicon nitride film spacers;

forming second wiring layers having the predetermined minimum width as a minimum value of a line width on the upper surface of said first interlayer insulating film, at least one of said second wiring layers being connected to said first wiring layer through said second lower layer contact hole, and at least one of said second wiring layers being connected to said first wiring layer through said first lower layer contact hole;

forming a third silicon oxide fill covering said second wiring layers, forming a second BPSG film, flattening an upper surface of said second BPSG film, and forming a third silicon nitride film covering the upper surface of said second BPSG film, thereby forming a second interlayer insulating film composed of said third silicon oxide film, said second BPSG film, and said third silicon nitride film;

forming a first upper layer contact hole having a second diameter larger than said first diameter in said second interlayer insulating film, said first upper layer contact hole dividing said second wiring layers at a position just above said first lower layer contact hole, and reaching said first lower layer contact hole;

forming a second conductive film having a predetermined film thickness on the entire surface of the resultant structure, and etching-back said second conductive film, thereby forming a ring-shaped conductive film spacer on a side surface of said first upper layer contact hole, said ring-shaped conductive film spacer having an upper end of a lower level than an upper surface of said second interlayer insulating film and having a bottom surface connected to an upper surface of said first interlayer insulating film, and said ring-shaped conductive film spacer connecting said second wiring layers divided by said first upper layer contact hole;

etching said second interlayer insulating film using a photoresist as a mask which covers the said first upper layer contact hole, thereby forming a second upper layer contact hole having a third diameter smaller than said second diameter and larger than said first diameter, said second upper layer contact hole reaching either said second lower layer contact hole or said second wiring layer;

forming a fourth silicon oxide film on the entire surface of the resultant structure by the low pressure chemical vapor phase deposition (LPCVD) method, and etching-back said fourth silicon oxide film until an upper surface of said second interlayer insulating film is exposed, thereby forming first and second silicon oxide film spacers on side surfaces of said first and second upper layer contact holes;

forming a third conductive film on the entire surface of the resultant structure, and performing a chemical machinery polishing (CMP) of said third conductive film until the upper surface of said second interlayer insulating film is exposed, thereby forming first and second upper layer contact plugs burying said first and second upper layer contact holes interposing said first and second silicon oxide film spacers; and forming at least one of third wiring layers on a surface of said second interlayer insulating film, connected to said first wiring layer through said first upper layer contact hole and said first lower layer contact hole, and forming at least one of third wiring layers on the surface of said second interlayer insulating film, connected to either said second lower layer contact hole or said second wiring layer through said second upper layer contact hole.

6. A manufacturing method of a semiconductor device, comprising the steps of:

forming a first wiring layer having a predetermined minimum width as a minimum value of a line width on a surface of the semiconductor substrate or on the surface of the semiconductor substrate interposing a foundation insulating film, said first wiring layer constituting a portion of a semiconductor element formed in a surface of a semiconductor substrate, or being connected to said semiconductor element;

forming a first silicon oxide film covering said first wiring layer, forming a first BPSG film covering said first silicon oxide film, flattening an upper surface of said first BPSG film, and forming a first silicon nitride film covering the upper surface of said first BPSG film, thereby forming a first interlayer insulating film composed of said first silicon oxide film, said first BPSG film, and said first silicon nitride film;

forming a second silicon oxide film having a predetermined film thickness, which covers an upper surface of said second interlayer insulating film;

forming first and second lower layer contact holes having a first diameter larger than said predetermined minimum width, which penetrate through said second silicon oxide film and said first interlayer insulating film to reach said first wiring layer;

forming a second silicon nitride film on the entire surface of the resultant structure using a low pressure chemical vapor phase deposition (LPCVD) method, and etching-back said silicon nitride film to form first silicon nitride spacers on said surface of said first and second lower layer contact holes;

forming a first conductive film filling said first and second lower layer contact holes on the entire surface of the resultant structure, and polishing said first conductive film, said first silicon nitride film spacers, and said first silicon oxide film using a chemical machinery polishing (CMP) method until an upper surface of said first interlayer insulating film is exposed, thereby making upper surfaces of said first silicon nitride film spacers flat, which is positioned at the same level as that of said first interlayer insulating film, and thereby forming lower layer contact plugs formed of said first conductive film which bury said first and second lower contact holes interposing first said silicon nitride film spacers;

forming second wiring layers having the predetermined minimum width as a minimum value of a line width on the upper surface of said first interlayer insulating film, at least one of said second wiring layers being connected to said first wiring layer through said second lower layer contact hole, and at least one of said second wiring layers being connected to said first wiring layer through said first lower layer contact hole;

forming a third silicon oxide film covering said second wiring layers, forming a second BPSG film, flattening an upper surface of said second BPSG film, and forming a third silicon nitride film covering the upper surface of said second BPSG film, thereby forming a second interlayer insulating film composed of said third silicon oxide film, said second BPSG film, and said third silicon nitride film;

forming a first upper layer contact hole having a second diameter larger than said first diameter in said second interlayer insulating film, said first upper layer contact hole dividing said second wiring layers at a position just above said first lower layer contact hole, and reaching said first lower layer contact hole;

forming a second conductive film having a predetermined film thickness on the entire surface of the resultant structure, and etching-back said second conductive film, thereby forming a ring-shaped conductive film spacer on a side surface of said first upper layer contact hole, said ring-shaped conductive film spacer having an upper end of a lower level than an upper surface of said second interlayer insulating film and having a bottom surface connected to an upper surface of said first interlayer insulating film, and said ring-shaped conductive film spacer connecting said second wiring layers divided by said first upper layer contact hole;

forming a fourth silicon oxide film on the entire surface of the resultant structure, and performing a chemical machinery polishing of said fourth silicon oxide film until a film thickness of said fourth silicon oxide film on the upper surface of said interlayer insulating film becomes a second predetermined value, thereby burying said first upper layer contact hole with said fourth silicon oxide film;

forming, in said fourth silicon oxide film, an opening having the first diameter reaching said first lower layer contact hole by etching using a photoresist film as a mask, and, at the same time, forming, in said fourth silicon oxide film, a second upper layer contact hole having the first diameter which penetrates through said fourth silicon oxide film and said second interlayer insulating film to reach either said second lower layer contact hole or said second wiring layers;

forming a fourth silicon nitride film on the entire surface of the resultant structure by a low pressure vapor phase deposition (LPCVD) method, and etching-back said fourth silicon nitride film, thereby forming second silicon nitride film spacers on side surfaces of said opening and said second upper layer contact hole;

forming a third conductive film on the entire surface of the resultant structure, and performing the chemical machinery polishing (CMP) for said third conductive film, said second silicon nitride spacers, and said fourth silicon oxide film until the upper surface of said second interlayer insulating film is exposed, thereby forming, in said first upper layer contact hole, a silicon oxide film spacer formed of said fourth silicon oxide film, a second silicon nitride film spacer, and a first upper layer contact plug, said silicon oxide film spacer having an upper surface of the same level as that of said second interlayer insulating film, said second silicon nitride film spacer having an upper surface of the same level as that of said second interlayer insulating film, and said first upper layer contact plug filling said opening interposing said second silicon nitride film spacer, and thereby forming, in said second upper layer contact hole, the second silicon nitride film spacer and a second upper layer contact plug filling said second upper layer contact hole interposing said second silicon nitride film spacer; and forming at least one of third wiring layers on a surface of said second interlayer insulating film, connected to said first wiring layer through said first upper layer contact hole and said first lower layer contact hole, and forming at least one of third wiring layers on the surface of said second interlayer insulating film, connected to either said second lower layer contact hole or said second wiring layer through said second upper layer contact hole.

7. A manufacturing method of a semiconductor device, comprising the steps of:

forming a first wiring layer having a predetermined minimum width as a minimum value of a line width on a surface of the semiconductor substrate or on the surface of the semiconductor substrate interposing a foundation insulating film, said first wiring layer constituting a portion of a semiconductor element formed in a surface of a semiconductor substrate, or being connected to said semiconductor element;

forming a first silicon oxide film covering said first wiring layer, forming a first BPSG film covering said first silicon oxide film, flattening an upper surface of said first BPSG film, and forming a first silicon nitride film covering the upper surface of said first BPSG film, thereby forming a first interlayer insulating film composed of said first silicon oxide film, said first BPSG film, and said first silicon nitride film;

forming a second silicon oxide film having a predetermined film thickness, which covers an upper surface of said second interlayer insulating film;

forming first and second lower layer contact holes having a first diameter larger than said predetermined minimum width, which penetrate through said second silicon oxide film and said first interlayer insulating film to reach said first wiring layer;

forming a second silicon nitride film on the entire surface of the resultant structure using a low pressure chemical vapor phase deposition (LPCVD) method, and etching-back said silicon nitride film to form first silicon nitride spacers on said surface of said first and second lower layer contact holes;

forming a first conductive film filling said first and second lower layer contact holes on the entire surface of the resultant structure, and polishing said first conductive film, said first silicon nitride film spacers, and said first silicon oxide film using a chemical machinery polishing (CMP) method until an upper surface of said first interlayer insulating film is exposed, thereby making upper surfaces of said first silicon nitride film spacers flat, which is positioned at the same level as that of said first interlayer insulating film, and thereby forming lower layer contact plugs formed of said first conductive film which bury said first and second lower contact holes interposing first said silicon nitride film spacers;

forming second wiring layers having the predetermined minimum width as a minimum value of a line width on the upper surface of said first interlayer insulating film, at least one of said second wiring layers being connected to said first wiring layer through said second lower layer contact hole, and at least one of said second wiring layers being connected to said first wiring layer through said first lower layer contact hole;

forming a third silicon oxide film covering said second wiring layers, forming a second BPSG film, and flattening an upper surface of said second BPSG film, thereby forming a second interlayer insulating film composed of said third silicon oxide film and said second BPSG film;

forming a first upper layer contact hole having a second diameter larger than said first diameter in said second interlayer insulating film, said first upper layer contact hole dividing said second wiring layers at a position just above said first lower layer contact hole, and reaching said first lower layer contact hole;

forming a second conductive film having a predetermined film thickness on the entire surface of the resultant structure, and etching-back said second conductive film, thereby forming a ring-shaped conductive film spacer on a-side surface of said first upper layer contact hole, said ring-shaped conductive film spacer having an upper end of a lower level than an upper surface of said second interlayer insulating film and having a bottom surface connected to an upper surface of said first-interlayer insulating film, and said ring-shaped conductive film spacer connecting said second wiring layers divided by said first upper layer contact hole;

forming a fourth silicon oxide film on the entire surface of the resultant structure, and performing a chemical machinery polishing of said fourth silicon oxide film until an upper surface of said fourth silicon oxide film becomes at least flat, thereby burying said first upper layer contact hole with said fourth silicon oxide film;

forming a third silicon nitride film on the entire surface of the resultant structure, and further forming a fifth silicon oxide film having a predetermined film thickness;

forming, in said fourth silicon oxide film which buries said fifth silicon oxide film, said third silicon nitride film, and said first upper layer contact hole, an opening having the first diameter reaching said first lower layer contact hole by etching using a photoresist film as a mask, and, at the same time, forming a silicon oxide film spacer formed of said fourth silicon oxide film, and forming a second upper layer contact hole having the first diameter which penetrates through said fifth silicon oxide film, said silicon nitride film, and said second interlayer insulating film to reach either said second lower layer contact hole or said second wiring layers;

forming a fourth silicon nitride film on the entire surface of the resultant structure by a low pressure vapor phase deposition (LPCVD) method, and etching-back said fourth silicon nitride film, thereby forming second silicon nitride film spacers on side surfaces of said opening and said second upper layer contact hole;

forming a third conductive film on the entire surface of the resultant structure, and performing the chemical machinery polishing (CMP) for said third conductive film, said second silicon nitride spacers, and said fifth silicon oxide film until the upper surface of said third silicon nitride film is exposed, thereby forming, in said first upper layer contact hole, a second silicon nitride film spacer and a first upper layer contact plug, said second silicon nitride film spacer covering a side surface of said silicon oxide film spacer and having an upper surface of the same level as that of said third silicon nitride film, and said first upper layer contact plug filling said opening interposing said second silicon nitride film spacer, thereby forming, in said second upper layer contact hole, a second silicon nitride film spacer having an upper surface of the same level as that of said third silicon nitride film, and a second upper layer contact plug filling said upper layer contact hole interposing said second silicon nitride film spacer; and forming at least one of third wiring layers on a surface of said second interlayer insulating film, connected to said first wiring layer through said first upper layer contact hole and said first lower layer contact hole, and forming at least one of third wiring layers on the surface of said second interlayer insulating film, connected to either said second lower layer contact hole or said second wiring layer through said second upper layer contact hole.

* * * * *

UNITED STATES PATENT AND TRADEMARK OFFICE
CERTIFICATE OF CORRECTION

PATENT NO. : 6,197,682 B1
DATED : March 6, 2001
INVENTOR(S) : John Mark Drynan, Kuniaki Koyama Page 1 of 1

It is certified that error appears in the above-identified patent and that said Letters Patent is hereby corrected as shown below:

Column 17,
Line 33, delete "B-" insert -- B-B --

Column 28,
Line 5, delete "6B" insert -- 9(B) --

Column 37,
Line 35, delete "C" insert -- ( --

Column 39,
Line 2, after "first" insert -- . --

Signed and Sealed this

Eleventh Day of December, 2001

Attest:

NICHOLAS P. GODICI
Attesting Officer
Acting Director of the United States Patent and Trademark Office